United States Patent
Chang et al.

(10) Patent No.: US 10,915,773 B2
(45) Date of Patent: Feb. 9, 2021

(54) STATISTICS OPERATIONS ON TWO DIMENSIONAL IMAGE PROCESSOR

(71) Applicant: Google LLC, Mountain View, CA (US)

(72) Inventors: Edward Chang, Saratoga, CA (US); Daniel Frederic Finchelstein, Redwood City, CA (US); Szepo Robert Hung, Santa Clara, CA (US); Albert Meixner, Mountain View, CA (US); Ofer Shacham, Palo Alto, CA (US)

(73) Assignee: Google LLC, Mountain View, CA (US)

(*) Notice: Subject to any disclaimer, the term of this patent is extended or adjusted under 35 U.S.C. 154(b) by 0 days.

(21) Appl. No.: 15/596,286

(22) Filed: May 16, 2017

(65) Prior Publication Data

US 2018/0005061 A1 Jan. 4, 2018

Related U.S. Application Data

(63) Continuation of application No. 15/201,134, filed on Jul. 1, 2016, now abandoned.

(51) Int. Cl.
G06K 9/00 (2006.01)
G06T 1/20 (2006.01)
G11C 19/00 (2006.01)

(52) U.S. Cl.
CPC ............ *G06K 9/00986* (2013.01); *G06T 1/20* (2013.01); *G11C 19/00* (2013.01)

(58) Field of Classification Search
CPC ...... G06T 1/20; G06K 9/00986; G11C 19/00; G11C 19/28
See application file for complete search history.

(56) References Cited

U.S. PATENT DOCUMENTS

| 4,445,177 A | 4/1984 | Bratt et al. |
| 4,718,091 A | 1/1988 | Kobayashi |

(Continued)

FOREIGN PATENT DOCUMENTS

| EP | 0293701 | 12/1988 |
| JP | S6379180 A | 4/1988 |

(Continued)

OTHER PUBLICATIONS

Hillis et al. ("Data Parallel Algorithms," Communication of the ACM, vol. 29, No. 12, Dec. 1986)Gentile et al. ("Image processing chain for digital still cameras based on the SIMPil architecture," IEEE Proceedings of the 2005 International Conference on Parallel Processing Workshops) and in view of Morad et al. (US 2016/0224465).*

(Continued)

*Primary Examiner* — Yubin Hung
(74) *Attorney, Agent, or Firm* — Fish & Richardson P.C.

(57) ABSTRACT

A method is described that includes loading an array of content into a two-dimensional shift register. The two-dimensional shift register is coupled to an execution lane array. The method includes repeatedly performing a first sequence including: shifting with the shift register first content residing along a particular row or column into another parallel row or column where second content resides and performing operations with a particular corresponding row or column of the execution lane array on the first and second content. The method also includes repeatedly performing a second sequence including: shifting with the shift register content from a set of first locations along a resultant row or column that is parallel with the rows or columns of the first sequence into a corresponding set of second locations along the resultant row or column. The resultant row or (Continued)

column has values determined from the operations of the first sequence.

12 Claims, 41 Drawing Sheets

(56) References Cited

U.S. PATENT DOCUMENTS

| | | | |
|---|---|---|---|
| 4,935,894 A | 6/1990 | Ternes et al. | |
| 4,939,642 A | 7/1990 | Blank | |
| 4,972,495 A | 11/1990 | Blike | |
| 5,173,947 A * | 12/1992 | Chande | G06T 19/00 |
| | | | 345/422 |
| 5,253,308 A | 10/1993 | Johnson | |
| 5,287,532 A | 2/1994 | Hunt | |
| 5,428,804 A | 6/1995 | Davies | |
| 5,581,773 A * | 12/1996 | Glover | G06F 15/8015 |
| | | | 712/14 |
| 5,612,693 A | 3/1997 | Craft et al. | |
| 5,644,517 A | 7/1997 | Ho | |
| 5,751,864 A | 5/1998 | Moriwake et al. | |
| 5,892,962 A | 4/1999 | Cloutier | |
| 6,049,859 A | 4/2000 | Gliese et al. | |
| 6,148,111 A * | 11/2000 | Creusere | H04N 19/647 |
| | | | 348/408.1 |
| 6,366,289 B1 | 4/2002 | Johns | |
| 6,587,158 B1 | 7/2003 | Dale et al. | |
| 6,681,058 B1 | 1/2004 | Hanna | |
| 6,728,862 B1 | 4/2004 | Wilson | |
| 6,745,319 B1 | 6/2004 | Balmer et al. | |
| 6,970,196 B1 | 11/2005 | Masatoshi et al. | |
| 7,010,177 B1 | 3/2006 | Mattison | |
| 7,167,890 B2 | 1/2007 | Lin et al. | |
| 7,200,287 B2 | 4/2007 | Fukuda et al. | |
| 7,286,717 B2 | 10/2007 | Nomizu | |
| 7,583,851 B2 | 9/2009 | Kudo et al. | |
| 7,750,915 B1 | 7/2010 | Acocella | |
| 7,941,634 B2 | 5/2011 | Georgi et al. | |
| 8,156,284 B2 | 4/2012 | Vorbach et al. | |
| 8,321,849 B2 | 11/2012 | Nickolls et al. | |
| 8,436,857 B2 | 5/2013 | Twilleaqer | |
| 8,508,612 B2 | 8/2013 | Cote et al. | |
| 8,543,843 B1 | 9/2013 | Chenq et al. | |
| 8,650,384 B2 | 2/2014 | Lee et al. | |
| 8,749,667 B2 | 6/2014 | Noraz et al. | |
| 8,786,614 B2 * | 7/2014 | Curry | G06T 1/20 |
| | | | 345/501 |
| 8,797,323 B2 | 8/2014 | Salvi et al. | |
| 8,823,736 B2 | 9/2014 | Barrinqer et al. | |
| 8,970,884 B2 | 3/2015 | Tsuji et al. | |
| 8,976,195 B1 | 3/2015 | Lindholm et al. | |
| 2001/0041012 A1 | 11/2001 | Hsieh | |
| 2002/0154123 A1 * | 10/2002 | Harasimiuk | G06T 3/4023 |
| | | | 345/472 |
| 2002/0174318 A1 * | 11/2002 | Stuttard | G06F 9/3001 |
| | | | 712/13 |
| 2003/0014457 A1 * | 1/2003 | Desai | G06F 7/57 |
| | | | 708/520 |
| 2004/0169874 A1 * | 9/2004 | Tone | G03G 15/011 |
| | | | 358/1.9 |
| 2005/0270412 A1 | 12/2005 | Kaman et al. | |
| 2006/0044576 A1 | 3/2006 | Tabata et al. | |
| 2007/0047828 A1 | 3/2007 | Ishii et al. | |
| 2007/0073999 A1 * | 3/2007 | Verheyen | G06F 17/5022 |
| | | | 712/11 |
| 2007/0080969 A1 | 4/2007 | Yamaura | |
| 2007/0156729 A1 | 7/2007 | Shaylor | |
| 2007/0198901 A1 | 8/2007 | Ramchandran | |
| 2008/0111823 A1 | 5/2008 | Fan et al. | |
| 2008/0133881 A1 * | 6/2008 | Georgi | G06F 15/8023 |
| | | | 712/28 |
| 2008/0239403 A1 | 10/2008 | Hagiwara | |
| 2008/0244222 A1 | 10/2008 | Supalov et al. | |
| 2008/0262984 A1 | 10/2008 | Xu | |
| 2009/0002390 A1 | 1/2009 | Kuna | |
| 2009/0228677 A1 | 9/2009 | Lieqe | |
| 2009/0249026 A1 | 10/2009 | Smelyanskiy | |
| 2009/0276606 A1 | 11/2009 | Mimar | |
| 2009/0300621 A1 | 12/2009 | Mantor et al. | |
| 2009/0317009 A1 | 12/2009 | Ren | |
| 2010/0122105 A1 | 5/2010 | Arsian et al. | |
| 2010/0188538 A1 | 7/2010 | Suqawa et al. | |
| 2011/0055495 A1 | 3/2011 | Wolford et al. | |
| 2011/0055836 A1 * | 3/2011 | Raghavan | G06F 8/4432 |
| | | | 718/101 |
| 2011/0087867 A1 | 4/2011 | Jacobson et al. | |
| 2011/0125768 A1 | 5/2011 | Shibao | |
| 2011/0153925 A1 | 6/2011 | Bains et al. | |
| 2012/0177298 A1 * | 7/2012 | Fujino | H04N 1/41 |
| | | | 382/232 |
| 2012/0221808 A1 | 8/2012 | Coon | |
| 2012/0221834 A1 * | 8/2012 | Knowles | G06F 9/30043 |
| | | | 712/42 |
| 2012/0320070 A1 | 12/2012 | Arva | |
| 2013/0027416 A1 | 1/2013 | Vaithianathan et al. | |
| 2013/0202051 A1 | 8/2013 | Zhou | |
| 2013/0243329 A1 | 9/2013 | Oro Garcia et al. | |
| 2013/0314428 A1 | 11/2013 | Chen et al. | |
| 2013/0318544 A1 | 11/2013 | Kuroda et al. | |
| 2014/0028876 A1 | 1/2014 | Mills | |
| 2014/0136816 A1 | 5/2014 | Krig | |
| 2014/0189290 A1 | 7/2014 | Wolrich | |
| 2014/0226728 A1 * | 8/2014 | Cheng | H04N 19/91 |
| | | | 375/240.25 |
| 2014/0282611 A1 | 9/2014 | Campbell et al. | |
| 2014/0344545 A1 | 11/2014 | Lerner | |
| 2015/0086134 A1 | 3/2015 | Hameed et al. | |
| 2015/0106596 A1 | 4/2015 | Vorbach et al. | |
| 2015/0277928 A1 | 10/2015 | Nomoto | |
| 2015/0379663 A1 * | 12/2015 | Gruber | G06T 1/20 |
| | | | 345/522 |
| 2016/0171331 A1 | 6/2016 | Cséfalvay | |
| 2016/0179469 A1 * | 6/2016 | Burgess | G06F 7/544 |
| | | | 708/201 |
| 2016/0219225 A1 | 7/2016 | Zhu et al. | |
| 2016/0224465 A1 * | 8/2016 | Morad | G06F 9/3877 |
| 2016/0275650 A1 * | 9/2016 | Case | G06T 3/606 |
| 2016/0313980 A1 | 10/2016 | Meixner et al. | |
| 2016/0313984 A1 | 10/2016 | Meixner et al. | |
| 2016/0313999 A1 | 10/2016 | Meixner et al. | |
| 2016/0314555 A1 | 10/2016 | Zhu et al. | |
| 2016/0314610 A1 * | 10/2016 | Lee | G06T 15/06 |
| 2016/0316094 A1 | 10/2016 | Meixner et al. | |
| 2016/0316107 A1 | 10/2016 | Shacham et al. | |
| 2016/0316157 A1 | 10/2016 | Desai et al. | |
| 2016/0350262 A1 * | 12/2016 | Sarangi | G06F 15/8007 |
| 2017/0024632 A1 | 1/2017 | Johnson | |
| 2017/0091575 A1 * | 3/2017 | Lee | G06K 9/42 |

FOREIGN PATENT DOCUMENTS

| | | |
|---|---|---|
| JP | 2013090070 | 5/2013 |
| JP | 2014/106715 | 6/2014 |
| JP | 2010/063173 | 3/2020 |
| TW | 200741633 A | 11/2007 |
| WO | WO 9409595 | 4/1994 |
| WO | WO 2007/071883 | 6/2007 |
| WO | WO 2013/062596 | 5/2013 |
| WO | WO 2016/171882 | 10/2016 |
| WO | WO 2016/171909 | 10/2016 |
| WO | WO 2016/171926 | 10/2016 |

OTHER PUBLICATIONS

Harris ("Optimizing Parallel Reduction in CUDA Contents," Nvidia Developer Technology, Apr. 14, 2016).*

Jung et al. ("Versatile and scalable parallel histogram construction," Proceedings of the 23rd international conference on Parallel architectures and compilation, Aug. 2014).*

(56) References Cited

OTHER PUBLICATIONS

Cypher et al. ("SIMD architectures and algorithms for image processing and computer vision," IEEE Transactions on Acoustics, Speech, and Signal Processing, vol. 37, Issue: 12, Dec. 1989).*
Hillis et al. ("Data Parallel Algorithms," Communication of the ACM, vol. 29, No. 12, Dec. 1986)Gentile et al. ("Image processing chain for digital still cameras based on the SIMPil architecture," IEEE Proceedings of the 2005 International Conference on Parallel Processing Workshops) and in view of Morad et al.*
Gentile et al. ("Image processing chain for digital still cameras based on the SIMPil architecture," IEEE Proceedings of the 2005 International Conference on Parallel Processing Workshops).*
Harris ("Optimizing Parallel Reduction in CUDA Contents," Nvidia Developer Technology, Apr. 14, 2016) (Year: 2016).*
Jung et al. ("Versatile and scalable parallel histogram construction," Proceedings of the 23rd international conference on Parallel architectures and compilation, Aug. 2014) (Year: 2014).*
Cypher et al. ("SIMD architectures and algorithms for image processing and computer vision," IEEE Transactions on Acoustics, Speech, and Signal Processing, vol. 37, Issue: 12, Dec. 1989) (Year: 1989).*
Hillis et al. ("Data Parallel Algorithms," CACM, vol. 29, No. 12, Dec. 1986) (Year: 1986).*
Gentile et al. ("Image processing chain for digital still cameras based on the SIMPil architecture," IEEE Proceedings of the 2005 International Conference on Parallel Processing Workshops) (Year: 2005).*
"ChimeraTM: The Nvidia Computational Photography Architecture" Whitepaper, Nvidia Corporation 2013, 15 pages.
"Multioutput Scaler Reference Design" Altera Corporation, Application Note AN-648-1.0, Aug. 2012, 18 pages.
Adams, et al. "The Frankencamera: An Experimental Platform for Computational Photography", ACM Transactions on Graphics, vol. 29, No. 4, Article 29, Publication Jul. 2010, 12 pages.
Ahn, et al., "Evaluating the Image Stream Architecture." In ACM SIGARCH Computer Architecture News, vol. 32, No. 2, IEEE Computer Society, Jun. 2004, 14 pages.
Arasan "Silicon Hive Announces New Image Signal Processor", Eindhoven, the Netherlands, May 16, 2006, http://www.design-reuse.com/news/13362/silicon-hive-image-signal-processor.html, 3 pages.
Balfour et al., "An Energy-Efficient Processor Architecture for Embedded Systems" IEEE Computer Architecture Letters 7, No. 1 p. 29-32, May 2008.
Barry et al., "Always-On Vision Processing Unit for Mobile Applications"IEEE Micro, Mar./Apr. 2015, pp. 56-66.
Bolotoff, Paul V., "Alpha—The History in Facts and Comments" http://alasir.com/articles/a;pha_history/alpha_21164_21164pc.html, Last modification date Apr. 22, 2007,5 pages.
Brunhaver, John S. "Design and Optimization of a Stencil Engine", Stanford University, Jun. 2015, 133 pages.
Bushey, et al., "Flexible Function-Level Acceleration of Embedded Vision Applications Using the Pipelined Vision Processor." In Signals, Systems and Computers, 2013 Asilomar Conference, pp. 1447-1452, IEEE, 2013.
Cardells-Tormo et al., "Area-efficient 2-D Shift variant Convolvers for FPGA-based Digital Image Processing," IEEE Workshop on Signal Processing Systems Design and Implementation, Nov. 2, 2005, 5 pages.
CEVA-MM3101: An Imaging-Optimized DSP Core Swings for an Embedded Vision Home Run, http://www.bdti.com/insideDSP/2012/01/24/CEVA, Jan. 19, 2012, 3 pages.
Chao et al., "Pyramid Architecture for 3840 x 2160 Quad Full High Definition 30 Frames/s Video Acquisition," IEEE Transactions on Circuits and Systems for Video Technology, Nov. 1, 2010, 10 pages.
Chen et al., "CRISP: Coarse-Grained Reconfigurable Image Stream Processor for Digital Still Cameras and Camcorders," IEEE Transactions on Circuits and Systems for Video Technology, Sep. 2008, 14 pages.

Chen, et al., "DaDianNao: A Machine-Learning Supercomputer." 47m Annual IEEE/ACM International Symposium, pp. 609-622, IEEE, Dec. 2014.
Chenyun, et al., "A Paradigm Shift in Local Interconnect Technology Design in the Era of Nanoscale Multigate and Gate-All-Around Devices," IEEE Election Device Letters, vol. 36, No. 3, pp. 274-276, Mar. 2015.
Clearspeed Whitepaper: CSX Processor Architecture, www clearspeed com, 2007, 16 pages.
Codrescu, et al., "Hexagon DSP: An Architecture Optimized for Mobile Multimedia and Communications." IEEE Micro vol. 34, Issue 2, pp. 34-43, Mar. 2014.
Dally, William J., "Computer architecture is all about interconnect." Proceedings of $8^{th}$ International Symposium High-Perf. Comp. Architecture, Feb. 2002, 11 pages.
De Dinechin, et al., "A Clustered Manycore Processor Architecture for Embedded and Accelerated Applications." In High Performance Extreme Computing Conference (HPEC), IEEE, pp. 1-6, Sep. 2013.
DeVito, et al., "Terra: A Multi-Stage Language for High-Performance Computing", PLDI'13, Jun. 16-22, 2013, Seattle, Washington, 11 pages.
DeVito, et al.,"Fist-class Runtime Generation of High-Performance Types using Exotypes", PLDI'14, Jun. 9-11, ACM, 12 pages.
Dykes et al., "Communication and Computation Patterns of Large Scale Image Convolutions on Parallel Architectures," Parallel Processing Symposium, Jan. 1, 1994, 6 pages.
Eichenberger, et al., "Optimizing Compiler for the Cell Processor" PACT, Tuesday, Sep. 20, 2005, Part 1, pp. 1-16.
Eichenberger, et al., "Optimizing Compiler for the Cell Processor" PACT, Tuesday, Sep. 20, 2005, Part 2, pp. 17-32.
EyeQ2TM, "Vision System on a Chip", Mobileye, Sep. 2007, 4 pages.
Farabet, et al., "Hardware Accelerated Convolutional Neural Networks for Synthetic Vision Systems." Proceedings of 2010 IEEE International Symposium, pp. 257-260, Jun. 2010.
Farabet, et al., "Neuflow: A Runtime Reconfigurable Dataflow Processor for Vision." IEEE Computer Society Conference, pp. 109-116. Jun. 2011.
Galal, et al., "FPU Generator for Design Space Exploration." 21st IEEE Symposium on Computer Arithmetic (ARITH), Apr. 2013, 10 pages.
Gentile, et al., "Image Processing Chain for Digital Still Cameras Based SIMPil Architecture." ICCP International Conference Workshops, pp. 215-222, IEEE, Jun. 2005.
Goldstein, et al., "PipeReuch: A Coprocessor for Streaming Multimedia Acceleration", Carnegie Mellow University, Research Showcase @CMU, Appears in the 26th Annual International Symposium on Computer Architecture, May 1999, Atlanta, eorgia, 14 pages.
Gupta, et al., "A VLSI Architecture for Updating Raster-Scan Displays", Computer Graphics, vol. 15, No. 3, Aug. 1981, pp. 71-78.
Hameed, et al., "Understanding Sources of Inefficiency in General-Purpose Chips." ACM SIGARCH Computer Architecture News, vol. 38, No. 3, pp. 37-47, 2010.
Hanrahan, Pat, "Domain-Specific Languages for Heterogeneous GPU Computing", Nvidia Technology Conference, Oct. 2, 2009, 30 pages.
Hegarty, et al., "Darkroom: Compiling High-Level Image Processing Code into Hardware Pipelines", Proceedings of ACM SIGGRAPH, Jul. 2014, 11 pages.
Henretty, et al., "A Stencil Compiler for Short-Vector SIMD Architectures", ACM, ICS'13, Jun. 10-14, 2013, Eugene, Oregon, pp. 13-24.
Horowitz, Mark, "Computing's Energy Problem: (and what we can do about it)", IEEE, International Solid-State Circuits Conference 2014, 46 pages.
Kapasi, et al. "The Imagine Stream Processor", IEEE, International Conference on Computer Design: VLSI in Computers and Processors (ICCD'02). 2002, 17 pages.
Khailany, et al., "A Programmable 512 GOPS Stream Processor for Signal, Image and Video Processing", IEEE Journal of Solid-State Circuits, vol. 43, No. 1, pp. 202-213, Jan. 2008.

(56) References Cited

OTHER PUBLICATIONS

Khawam, et al., "The Reconfigurable Instruction Cell Array", IEEE Transactions on Very Large Scale Integation (VLSI) Systems vol. 16, No. 1, Jan. 2008, pp. 75-85.
Khronos, SPIR 2.0 "Provisional Specification to Enable Compiler Innovation on Diverse Parallel Architectures", Aug. 11, 2014, 2 pages.
Levinthal, "Parallel Computers for Graphics Applications", ACM, 1987, pp. 193-198.
Levinthal, et al., "Chap-A SIMD Graphics Processor", Computer Graphics, vol. 18, No. 3, Jul. 1984, pp. 77-82.
M.J. Duff, "CLIP 4: A Large Scale Integrated Circuit Array Parallel Processor," Proc. IEEE Int'l Joint Conf. Pattern Recognition, . . . Jan. 2004, pp. 728-733.
Mandal, et al., "An Embedded Vision Engine (EVE) for Automotive Vision Processing." In Circuits and Systems (ISCAS), 2014 IEEE Symposium, pp. 49-52. IEEE, 2014.
Mcintosh-Smith, "A Next-Generation Many-Core Processor With Reliability, Fault Tolerance and Adaptive Power Management Features Optimized for Embedded and High Performance Computing Applications" in Proceedings of the High Performance Embedded Computing Conference (HPEC) 2008, pp. 1-2, 5.
Mody, et al., "High Performance and Flexible Imaging Sub-System." In Advances in Computing, Communications and Informatics (ICACCI), 2014 International Conference, pp. 545-548. IEEE, 2014.
Molnar, et al., "PixelFlow: High-Speed Rendering Using Image Composition" proceedings of Siggraph 92, Computer Graphics, 26, Jul. 2, 1992, 10 pages.
Moloney, David. "1 TOPS/W Software Programmable Media Processor," Hot Chips 23 Symposium (HCS), IEEE, Aug. 2011, 24 pages.
Moloney, et al., "Myriad 2: Eye of the Computational Vision Storm", Hot Chips 26 Symposium (HCS), IEEE, Aug. 2014, 18 pages.
MPPA-Manycore Product Family Overview http://www.kalray.eu/IMG/pdf/FLYER_MPPA_MANYCORE-4.pdfFeb. 2014, 2 pages.
Nightingale, Edmund B., et al., "Helios: Heterogeneous Multiprocessing with Satellite Kernels," SOSP'09 Oct. 11-14, 2009, Big Sky, Montana, U.S.A., (Oct. 11, 2009), 14 paqes.
Nvidia—Nvidia's Next Generation CUDA™ Compute Architecture: Kepler™,GK110/210, 2014, 23 pages, http://international.download.nvidia.com/pdf/kepler/NVIDIA-Kepler-GK110-GK210-Architecture-Whitepaper.pdf.
Nvidia Tegra K1—A New Era in Mobile Computing—Whitepapers—Jan. 2014, 26 pages.
Nvidia Tegra X1—Nvidia's New Mobile Superchip—Whitepapers—Jan. 2015, 41 pages.
Nvidia, "PTX:Parallel Thread Execution ISA Version 1.4", Aug. 23, 2010, 135 pages.
Olofsson, et al., "A 25 GFLOPS/Watt Software Programmable Floating Point Accelerator" High Performance Embedded Computing Conference, 201 0, 2 pages.
Oosterhout, Optimized Pixel Template Image Correlator, Master Thesis, Aug. 19, 1992, 74 pages.
Parker, Richard, "Embedding Computer Vision in Electronic Devices: How New Hardware and Software Choices Have Changed the Designer's Approach", Future Technolog Magazine, pp. 22-23, Feb. 2013.
Pelc, Oscar, "Multimedia Support in the i.MX31 and i.MX31 L Applications Processors", Freescale Semiconductor, Inc., Feb. 2006, http://cache.freescale.com/files/32bit/doc/white_paper/IMX31MULTIWP.pdf, 12 pages.
Pham, et al., "NeuFlow: Dataflow Vision Processing System-On-A-Chip." IEEE 55th International Midwest Symposium, Aug. 2012, 4 pages.
Qadeer, et al., "Convolution Engine: Balancing Efficiency & Flexibility in Specialized Computing", ISCA '13 Tel-Aviv, Israel, ACM 2013, pp. 24-35.
Ragan-Kelley et al., "Halide: A Language and Compiler for Optimizing Parallelism, Locality, and Recomputation in Image Processing Pipelines" Jun. 16, 2013, 12 pages.
S.F. Reddaway,"DAP—A Distributed Processor Array", ISCA '73 Proceedings of the First Ann. Symposium on Computer Architecture, pp. 61-65.
SCP2200: Image Cognition Processors Family [Product Brief]* , https://www.element14.com/community/docs/DOC-50990, Oct. 26, 2012, 2 pages.
SCP2200: Image Cognition Processors*, https://www.element14.com/community/docs/DOC-50984/I/scp2200-image-cognition-processors, Oct. 25, 2012, 2 pages.
Sedaghati, et al., "SIVEC: A Vector Instruction Extension for High Performance Stencil Computation," Parallel Architectures and Compilation Techniques, Oct. 10, 2011, 12 pages.
SemiWiki.com—New CEVA-ZM4 Vision IP Does Point clouds and and More: Published Feb. 27, 2015, ttps://www.semiwiki.com/forum/cntent/4354-new-ceva-xm4-vision-ip-does-point-clouds-more.html.
Shacham, et al. "Smart Memories PoIymolphic Chip Multiprocessor", Proceedings of the 46th Design Automation Conference (OAC), San Francisco, CA, Jul. 2009.
Shacham, et al., "Rethinking Digital Design: Why Design Must Change", IEEE micro Magazine, Nov./Dec. 2010.
Shacham, Ofer, "Chip Multiprocessor Generator: Automatic Generation of Custom and Heterogeneous Complete Platforms" Dissertation—Stanford University, May 2011, 190 pages. Part 1.
Shacham, Ofer, "Chip Multiprocessor Generator: Automatic Generation of Custom and Heterogeneous Complete Platforms" Dissertation—Stanford Univenity, May 2011, 190 pages. Part 2.
Silicon Hive: "Silicon System Design of Media and Communications Applications", Jun. 13, 2007, 22 pages.
Spampinato, et al., "A Basic Linear Algebra Compiler", ACM, CG0'14, Feb. 15-19, 2014, Orlando FL, pp. 23-32.
SPIR, The SPIR Specification, Version 2.0, Revision Date Jun. 5, 2014, 40 pages.
Stein, et al., "A Computer Vision System on a Chip: A Case Study From the Automotive Domain." IEEE Computer Society Conference, p. 130, 2005.
Stojanov, et al., "Abstracting Vector Architectures in Library Generators: Case Study Convolution Filters", Array 14, ACM, Jun. 11, 2014, UK, pp. 14-19.
Stream Processors, Inc. Announces Storm-1 Family of Data-Parallel Digital Signal Processors, ISSCC 2007, Feb. 12, 2007, 3 pages. http://www.businesswire.com/news/home/20070212005230/en/Stream-Processors-Announces-Storm-1-Family-Data-Parallel-Digital.
Stream Processors, Inc., Company History—Foundational Work in Stream Processing initiated in 1995, http://en.wikipedia.org/wiki/Stream_Processors_inc, 5 pages.
Tanabe, et al., "Visconti.: multi-VLIW image Recognition Processor Based on Configurable Processor [obstacle detection applications]", Custom Integrated Circuits Conference, IEEE, 2003, http://ieeexplore.ieee.org/document/1249387/?arnumber=1249387&tag=1.
Van der Wal, et al., "The Acadia Vision Processor", IEEE proceedings of International Workshop on Computer Applications for Machine Perception, Sep. 2000, http://citeseerx.ist.psu.edu/viewdoc/download?doi=10.1.1.32.3830&rep=rep1&type=pdf, 10 pages.
Wahib et al., "Scalable Kernel Fusion for Memory-Bound GPU Applications," SC14: International Conference for High Performance Computing, Networking, Storage and Analysis, Nov. 16, 2014, 12 pages.
Yu et al., "Optimizing Data Intensive Window-based Image Processing on reconfigurable Hardware Boards," Proc. IEEE Workshop on Signal Processing System Design and Implementation, Nov. 2, 2005, 6 pages.
Zhou, Minhua, et al., "Parallel Tools in HEVC for High-Throughput Processing," Applications of Digital Processing, XXXV Proc. of SPI, vol. 8499, (Jan. 1, 2012), pp. 1-13.

(56) References Cited

OTHER PUBLICATIONS

International Search Report and Written Opinion issued in International Application No. PCT/US2017/036439, dated Aug. 7, 2017, 15 pages.

Podlozhnyuk. "Histogram calculation in CUDA," Nvidia Corporation, White Paper, Nov. 2007, 11 pages.

Chen et al. "PASIC a Sensor-Processor Array for Computer Vision," IEEE 10th International Conference on Pattern Recognition, Jun. 16-21, 1990, 15 pages.

Fisher et al. "Computing the Hough Transform on a Scan Line Array Processor," IEEE Transactions on Pattern Recognition and Machine Intelligence, vol. 11, No. 3, Mar. 1989, 4 pages.

Nieto et al. "SIMD Array on FPGA for B/W Image Processing," 11th Internaitonal Workshop on Cellular Neural Networks and their Applications, Jul. 14-16, 2008, 6 pages.

Ranka et al. "Odd Even Shift in SIMD Hupercubes," IEEE Transactions on Parallel and Distributed Systems, vol. 1, No. 1, Jan. 1990, 6 pages.

Wilson et al. "Efficient SIMD Evaluation of Image Processing Programs," Proc. SPIE 3166, Sep. 19, 1997, 13 pages.

Wojtek et al. "Fast Fourier Transform Algorithm for Two-Dimensional Array of Processors," Proc. SPIE 0826, Jan. 21, 1988, 14 pages.

PCT International Preliminary Report on Patentability issued in International Application No. PCT/US2017/036439, dated Jan. 10, 2019, 9 pages.

CN Office Action in Chinse Application No. 201710532140, dated Apr. 2, 2020, 35 pages.

GB Office Action in Great Britain Application No. GB1709787.4, dated Apr. 7, 2020, 2 pages.

Ikeda et al, "A Preliminary OpenACC Optimizer for Accelerating Histogram Generation" IPSJ SIG Technical Reports, 2015, 9 pages (with English translation).

JP Office Action in Japanese Application No. 2018-569354, dated Sep. 1, 2020, 11 pages (with English translation).

KR Office Action in Korean Application No. 10-2019-7003053, dated Sep. 22, 2020, 12 pages (with English translation).

TW Office Action in Taiwan Application No. 108114332, dated Jul. 14, 2020, 12 pages (with English translation).

CN Office Action in Chinese Application No. 201710532140.7, dated Nov. 4, 2020, 34 pages (with English translation).

* cited by examiner

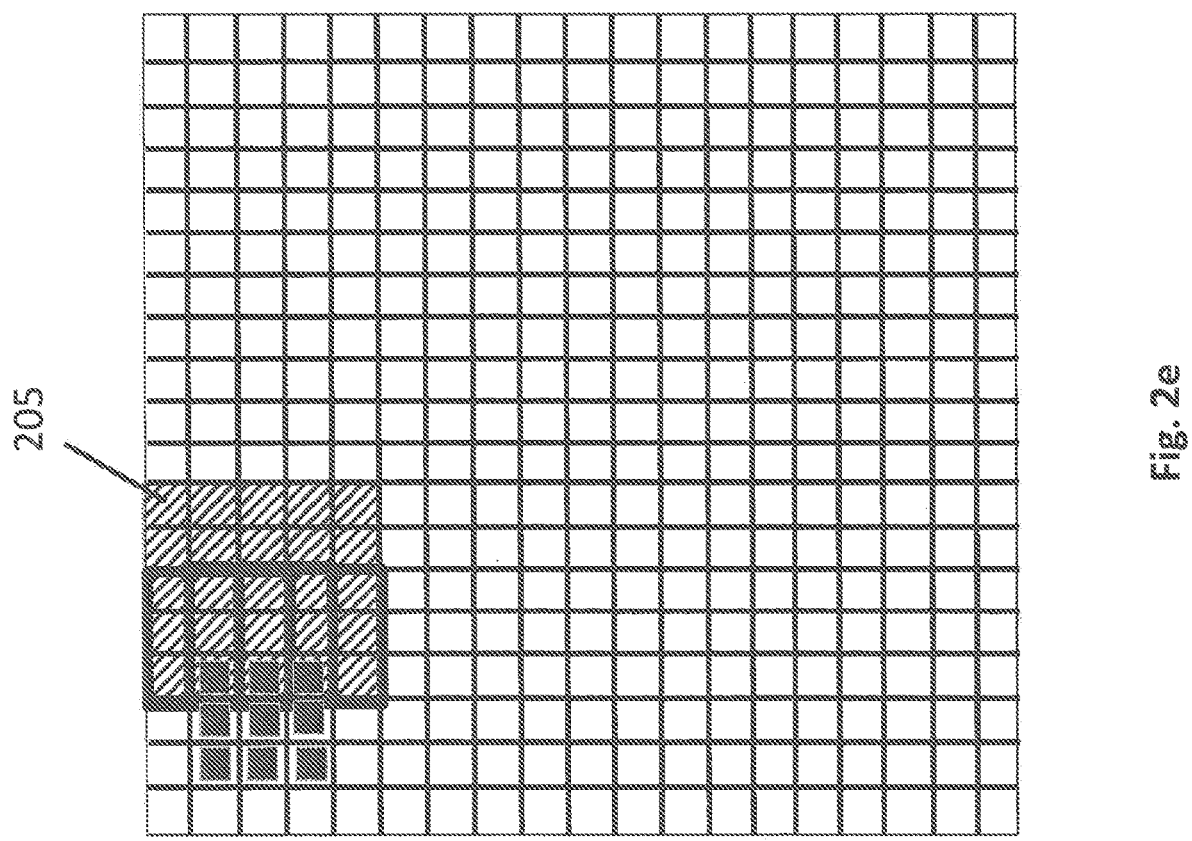

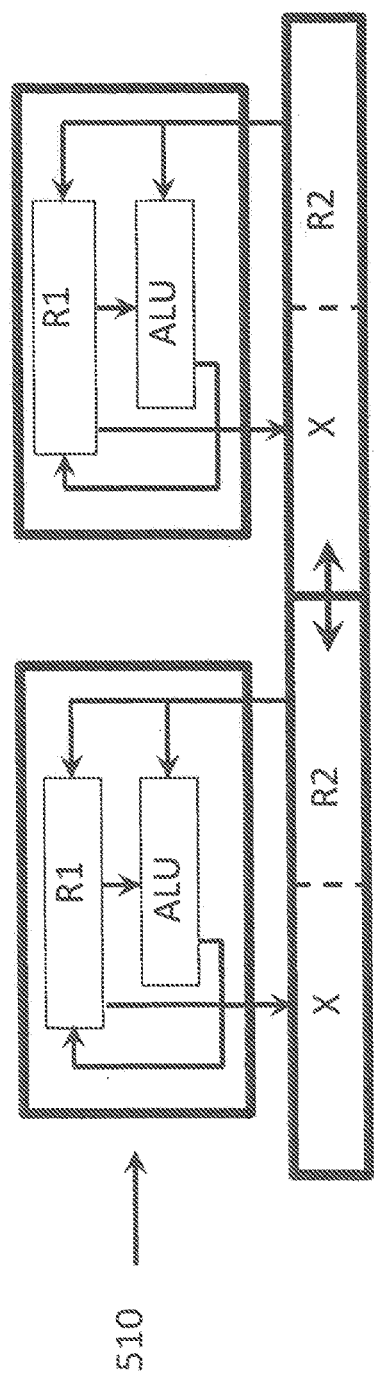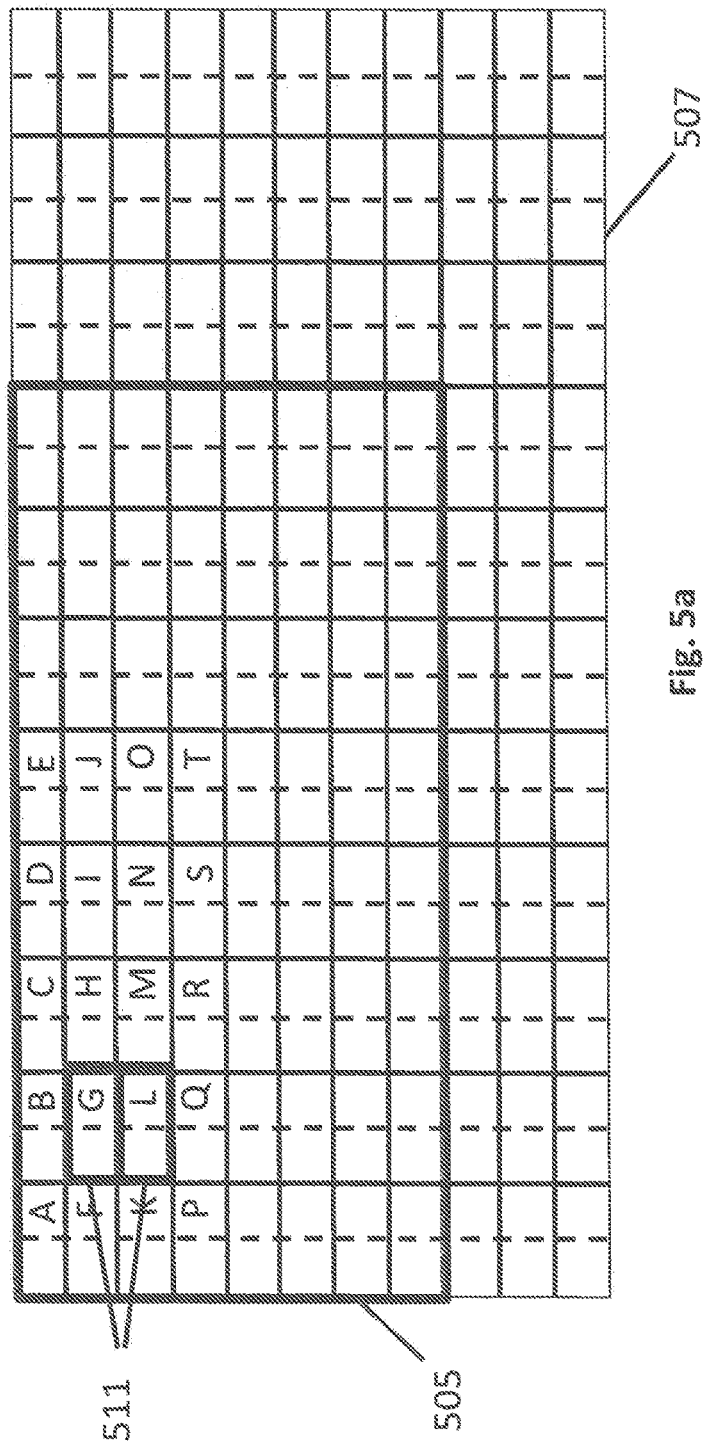
Fig. 5a

```
// thread X1: process stencil 1//
shift down 1
shift right 1
load // put A in R1
shift left 1
R1 <= ADD R1, R2 // add A, B // thread X2: process stencil 2//
shift down 1
shift right 1
load // put F in R1
shift left 1
R1 <= ADD R1, R2 // add F, G
```

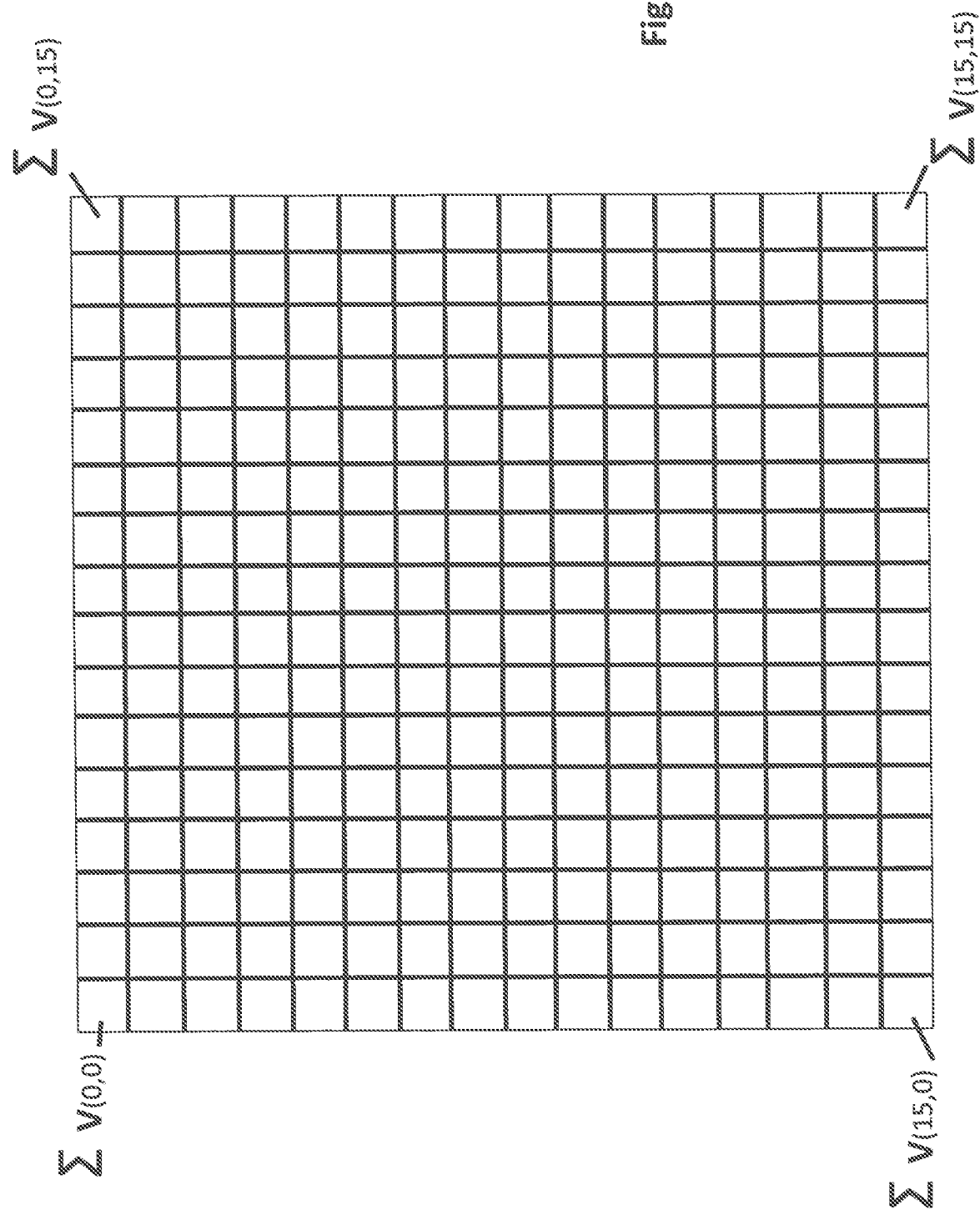

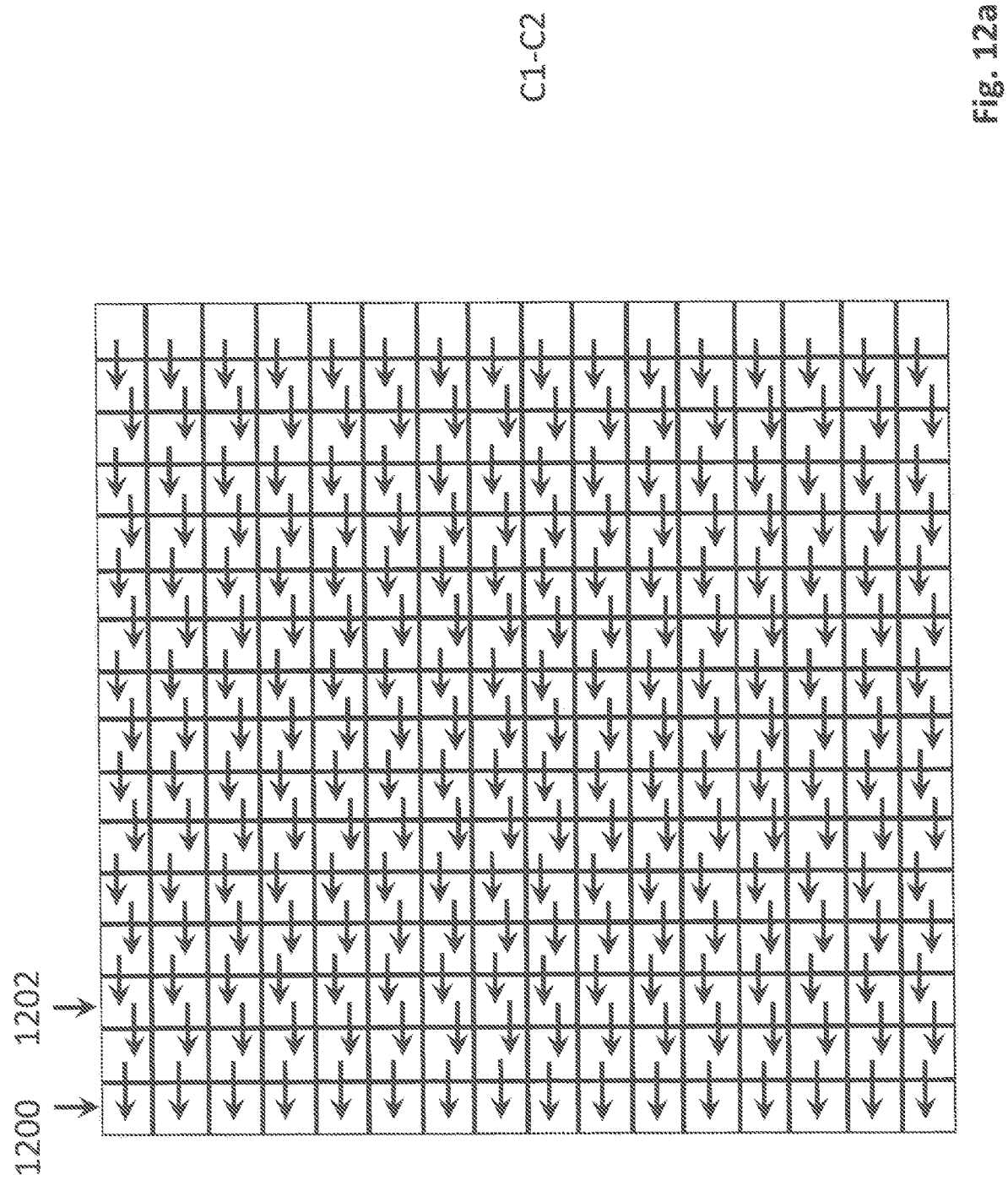

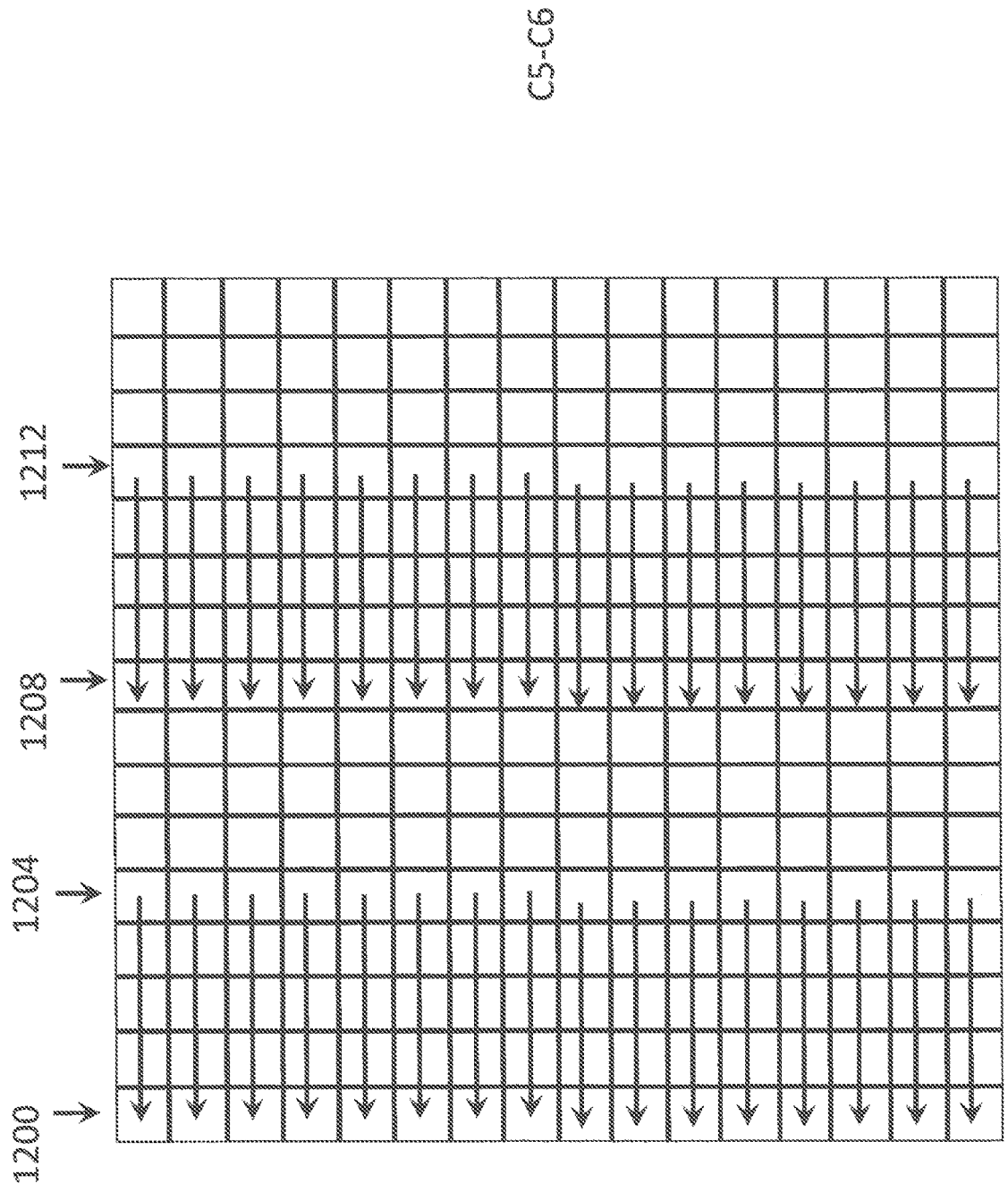

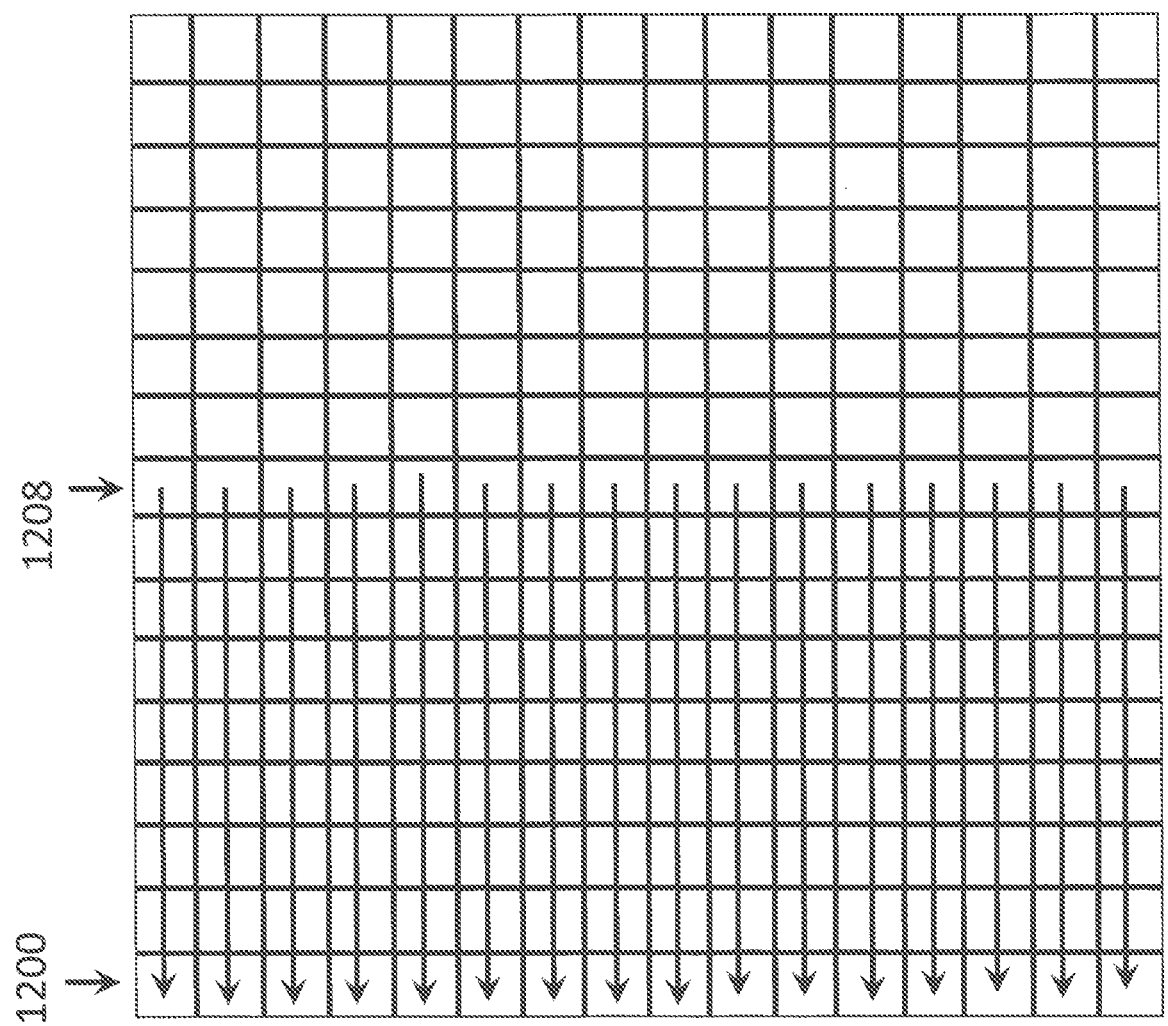

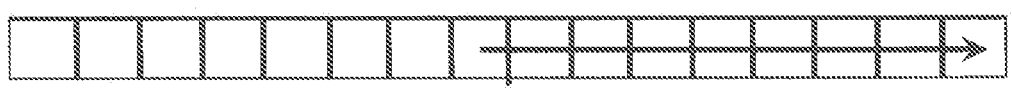
C16
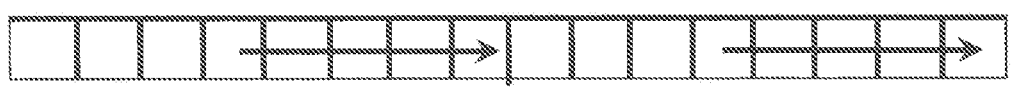
C14
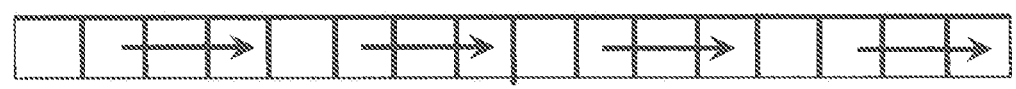
C12
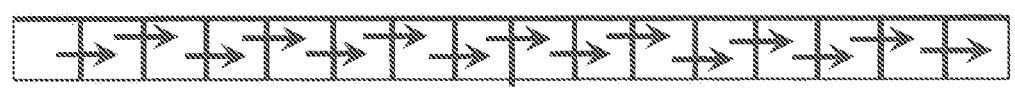
C10
Fig. 12e

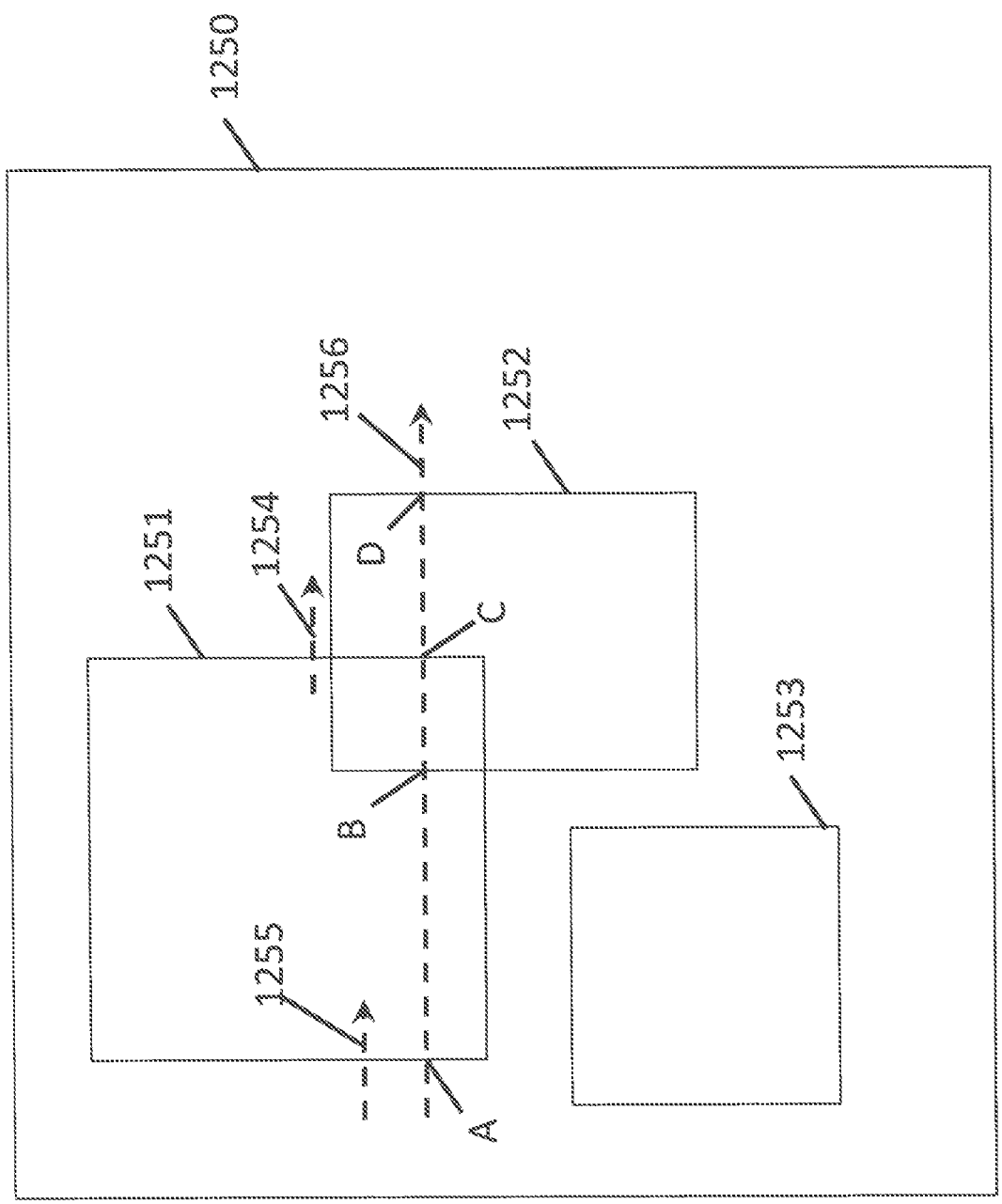

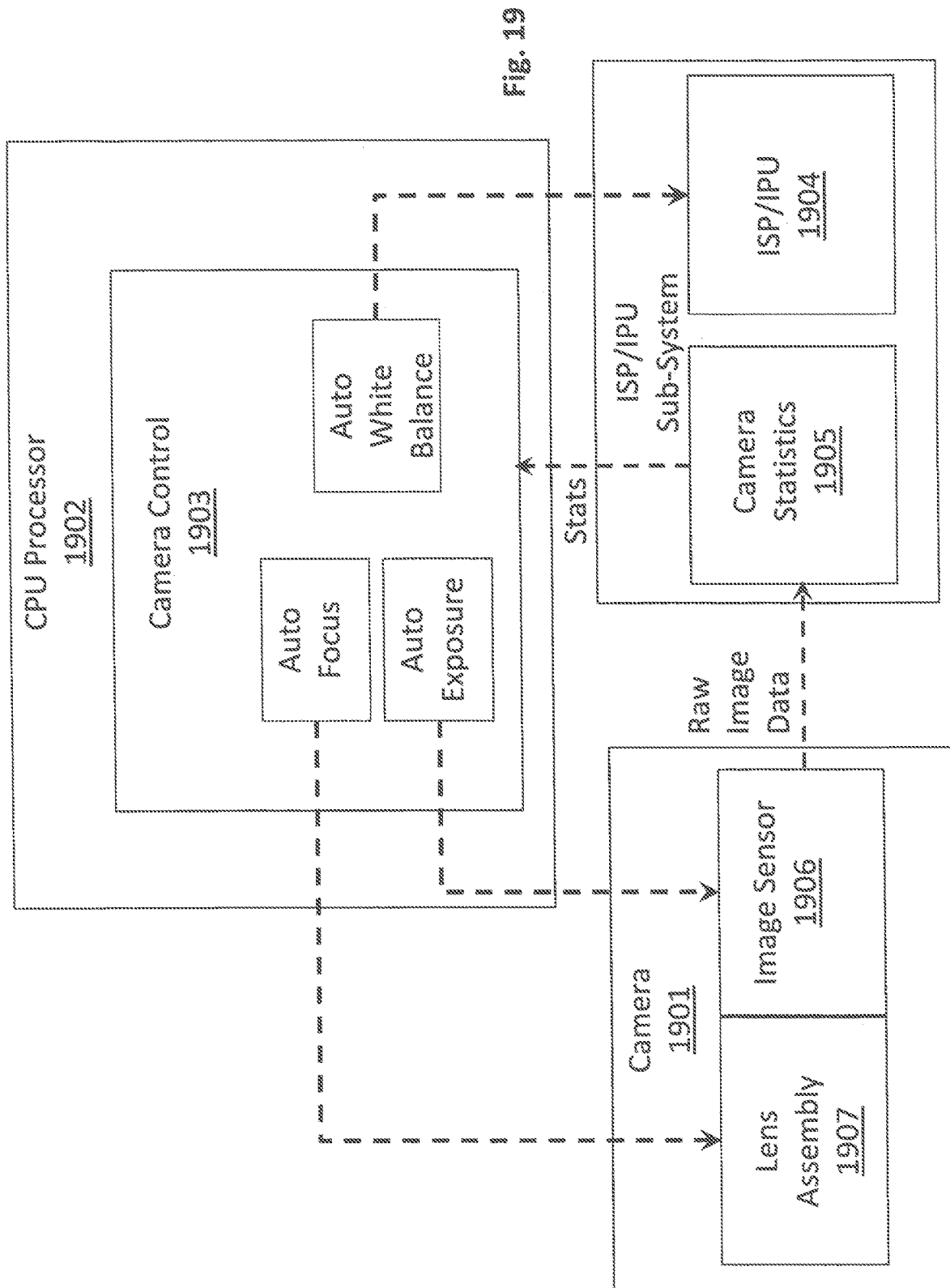

load an array of content into a two-dimensional shift register, the two-dimensional shift register coupled to an execution lane array 2001

repeatedly perform a first sequence comprising:
shifting with the shift register first content residing along a particular row or column into another parallel row or column where second content resides and performing mathematical operations with a particular corresponding row or column of the execution lane array on the first and second content 2002

repeatedly performing a second sequence comprising:
shifting with the shift register content from a set of first locations along a resultant row or column that is parallel with the rows or columns of the first sequence into a corresponding set of second locations along the resultant row or column, the resultant row or column having values determined at least in part from the mathematical operations of the first sequence, and performing mathematical operations on items of content from the set of first locations and respective items of content from the set of second locations with the execution lane array 2003

Fig. 20

STATISTICS OPERATIONS ON TWO DIMENSIONAL IMAGE PROCESSOR

CROSS REFERENCE TO RELATED APPLICATIONS

This application is a continuation of and claims priority to U.S. patent application Ser. No. 15/201,134, filed on Jul. 1, 2016, the entire contents of which are hereby incorporated by reference.

FIELD OF INVENTION

The description pertains generally to image processing, and, more specifically, to statistics operations on a two dimensional image processor.

BACKGROUND

Image processing typically involves the processing of pixel values that are organized into an array. Here, a spatially organized two dimensional array captures the two dimensional nature of images (additional dimensions may include time (e.g., a sequence of two dimensional images) and data type (e.g., colors)). In a typical scenario, the arrayed pixel values are provided by a camera that has generated a still image or a sequence of frames to capture images of motion. Traditional image processors typically fall on either side of two extremes.

A first extreme performs image processing tasks as software programs executing on a general purpose processor or general purpose-like processor (e.g., a general purpose processor with vector instruction enhancements). Although the first extreme typically provides a highly versatile application software development platform, its use of finer grained data structures combined with the associated overhead (e.g., instruction fetch and decode, handling of on-chip and off-chip data, speculative execution) ultimately results in larger amounts of energy being consumed per unit of data during execution of the program code.

A second, opposite extreme applies fixed function hard-wired circuitry to much larger blocks of data. The use of larger (as opposed to finer grained) blocks of data applied directly to custom designed circuits greatly reduces power consumption per unit of data. However, the use of custom designed fixed function circuitry generally results in a limited set of tasks that the processor is able to perform. As such, the widely versatile programming environment (that is associated with the first extreme) is lacking in the second extreme.

A technology platform that provides for both highly versatile application software development opportunities combined with improved power efficiency per unit of data remains a desirable yet missing solution.

SUMMARY

A method is described that includes loading an array of content into a two-dimensional shift register. The two-dimensional shift register is coupled to an execution lane array. The method includes repeatedly performing a first sequence that includes: shifting with the shift register first content residing along a particular row or column into another parallel row or column where second content resides and performing mathematical operations with a particular corresponding row or column of the execution lane array on the first and second content. The method also includes repeatedly performing a second sequence that includes: shifting with the shift register content from a set of first locations along a resultant row or column that is parallel with the rows or columns of the first sequence into a corresponding set of second locations along the resultant row or column. The resultant row or column has values determined at least in part from the mathematical operations of the first sequence. The second sequence further includes performing mathematical operations on items of content from the set of first locations and respective items of content from the set of second locations with the execution lane array.

An apparatus is described having means for performing the first sequence above and for performing the second sequence above.

LIST OF FIGURES

The following description and accompanying drawings are used to illustrate various embodiments. In the drawings:

FIGS. 2a, 2b, 2c, 2d and 2e depict the parsing of image data into a line group, the parsing of a line group into a sheet and the operation performed on a sheet with overlapping stencils;

FIGS. 5a, 5b, 5c, 5d, 5e, 5f, 5g, 5h, 5i, 5j and 5k depict an example of the use of a two-dimensional shift array and an execution lane array to determine a pair of neighboring output pixel values with overlapping stencils;

FIG. 11 shows accumulated values within a two dimensional shift register array;

FIGS. 12a through 12e depict a reduction process;

FIG. 12f shows window statistics tracking;

FIG. 19 shows an integrated camera system and processor;

FIG. 20 shows a statistics method performed by a two dimensional shift register;

DETAILED DESCRIPTION a. Image Processor Hardware Architecture and Operation

Figure 1:
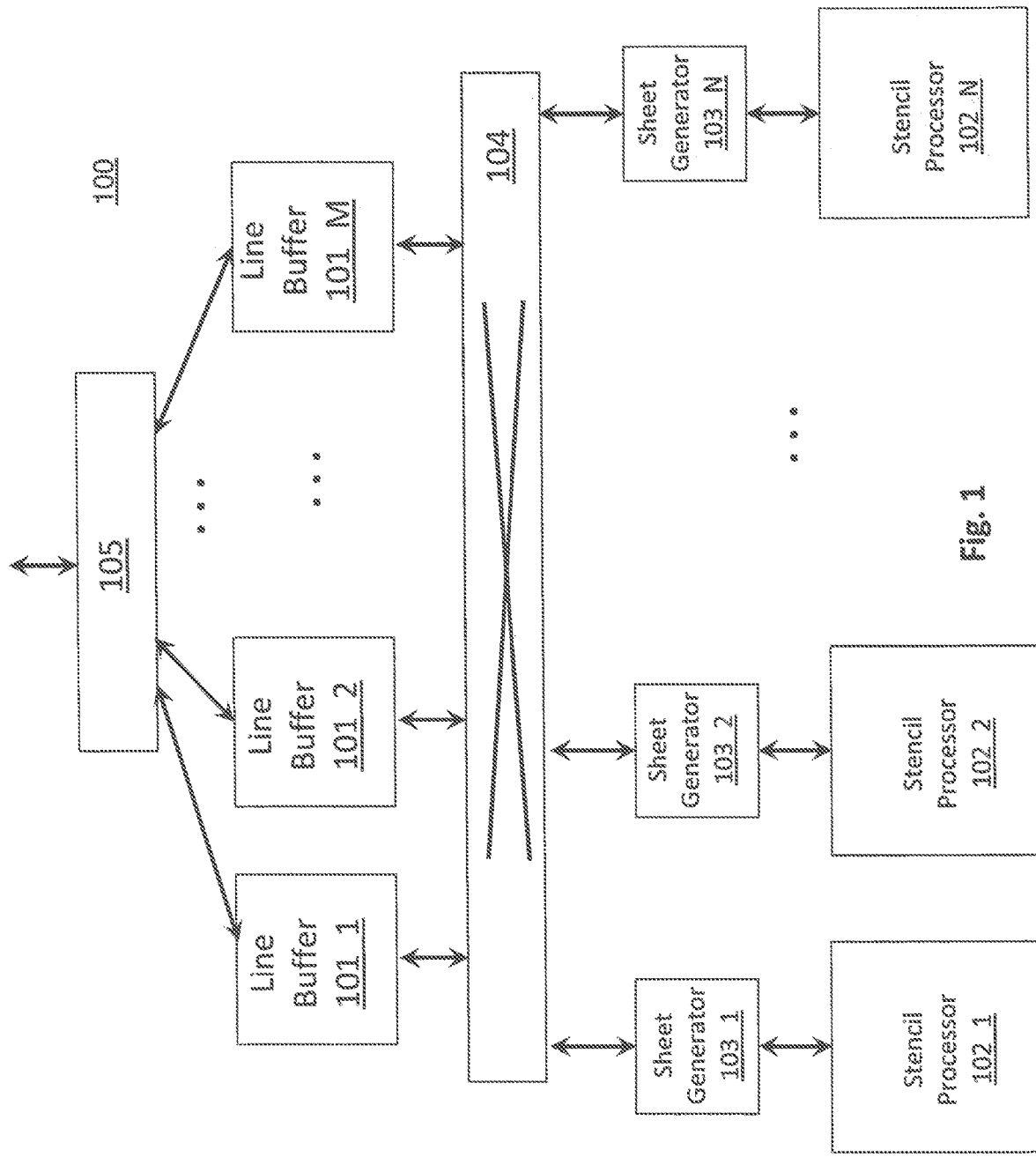
FIG. 1 shows an embodiment of an image processor hardware architecture.

FIG. 1 shows an embodiment of an architecture 100 for an image processor implemented in hardware. The image processor may be targeted, for example, by a compiler that converts program code written for a virtual processor within a simulated environment into program code that is actually executed by the hardware processor. As observed in FIG. 1, the architecture 100 includes a plurality of line buffer units 101_1 through 101_M (hereinafter "line buffers", "line buffer units" or the like) interconnected to a plurality of stencil processor units 102_1 through 102_N (hereinafter "stencil processors", "stencil processor units" or the like) and corresponding sheet generator units 103_1 through 103_N (hereinafter "sheet generators", "sheet generator units" or the like) through a network 104 (e.g., a network on chip (NOC) including an on chip switch network, an on chip ring network or other kind of network). In an embodiment, any line buffer unit may connect to any sheet generator and corresponding stencil processor through the network 104.

In an embodiment, program code is compiled and loaded onto a corresponding stencil processor 102 to perform the image processing operations earlier defined by a software developer (program code may also be loaded onto the stencil processor's associated sheet generator 103, e.g., depending on design and implementation). In at least some instances an image processing pipeline may be realized by loading a first kernel program for a first pipeline stage into a first stencil processor 102_1, loading a second kernel program for a second pipeline stage into a second stencil processor 102_2, etc. where the first kernel performs the functions of the first stage of the pipeline, the second kernel performs the functions of the second stage of the pipeline, etc. and additional control flow methods are installed to pass output image data from one stage of the pipeline to the next stage of the pipeline.

In other configurations, the image processor may be realized as a parallel machine having two or more stencil processors 102_1, 102_2 operating the same kernel program code. For example, a highly dense and high data rate stream of image data may be processed by spreading frames across multiple stencil processors each of which perform the same function.

In yet other configurations, essentially any directed acyclic graph (DAG) of kernels may be loaded onto the hardware processor by configuring respective stencil processors with their own respective kernel of program code and configuring appropriate control flow hooks into the hardware to direct output images from one kernel to the input of a next kernel in the DAG design.

As a general flow, frames of image data are received by a macro I/O unit 105 and passed to one or more of the line buffer units 101 on a frame by frame basis. A particular line buffer unit parses its frame of image data into a smaller region of image data, referred to as a "line group", and then passes the line group through the network 104 to a particular sheet generator. A complete or "full" singular line group may be composed, for example, with the data of multiple contiguous complete rows or columns of a frame (for brevity the present specification will mainly refer to contiguous rows). The sheet generator further parses the line group of image data into a smaller region of image data, referred to as a "sheet", and presents the sheet to its corresponding stencil processor.

In the case of an image processing pipeline or a DAG flow having a single input, generally, input frames are directed to the same line buffer unit 101_1 which parses the image data into line groups and directs the line groups to the sheet generator 103_1 whose corresponding stencil processor 102_1 is executing the code of the first kernel in the pipeline/DAG. Upon completion of operations by the stencil processor 102_1 on the line groups it processes, the sheet generator 103_1 sends output line groups to a "downstream" line buffer unit 101_2 (in some use cases the output line group may be sent_back to the same line buffer unit 101_1 that earlier had sent the input line groups).

One or more "consumer" kernels that represent the next stage/operation in the pipeline/DAG executing on their own respective other sheet generator and stencil processor (e.g., sheet generator 103_2 and stencil processor 102_2) then receive from the downstream line buffer unit 101_2 the image data generated by the first stencil processor 102_1. In this manner, a "producer" kernel operating on a first stencil processor has its output data forwarded to a "consumer" kernel operating on a second stencil processor where the consumer kernel performs the next set of tasks after the producer kernel consistent with the design of the overall pipeline or DAG.

A stencil processor 102 is designed to simultaneously operate on multiple overlapping stencils of image data. The multiple overlapping stencils and internal hardware processing capacity of the stencil processor effectively determines the size of a sheet. Here, within a stencil processor 102, arrays of execution lanes operate in unison to simultaneously process the image data surface area covered by the multiple overlapping stencils.

As will be described in more detail below, in various embodiments, sheets of image data are loaded into a two-dimensional register array structure within the stencil processor units 102. The use of sheets and the two-dimensional register array structure is believed to effectively provide for power consumption improvements by moving a large amount of data into a large amount of register space as, e.g., a single load operation with processing tasks performed directly on the data immediately thereafter by an execution lane array. Additionally, the use of an execution lane array and corresponding register array provide for different stencil sizes that are easily programmable/configurable.

FIGS. 2a through 2e illustrate at a high level embodiments of both the parsing activity of a line buffer unit 101, the finer grained parsing activity of a sheet generator unit 103, as well as the stencil processing activity of the stencil processor 102 that is coupled to the sheet generator unit 103.

Figure 2A:
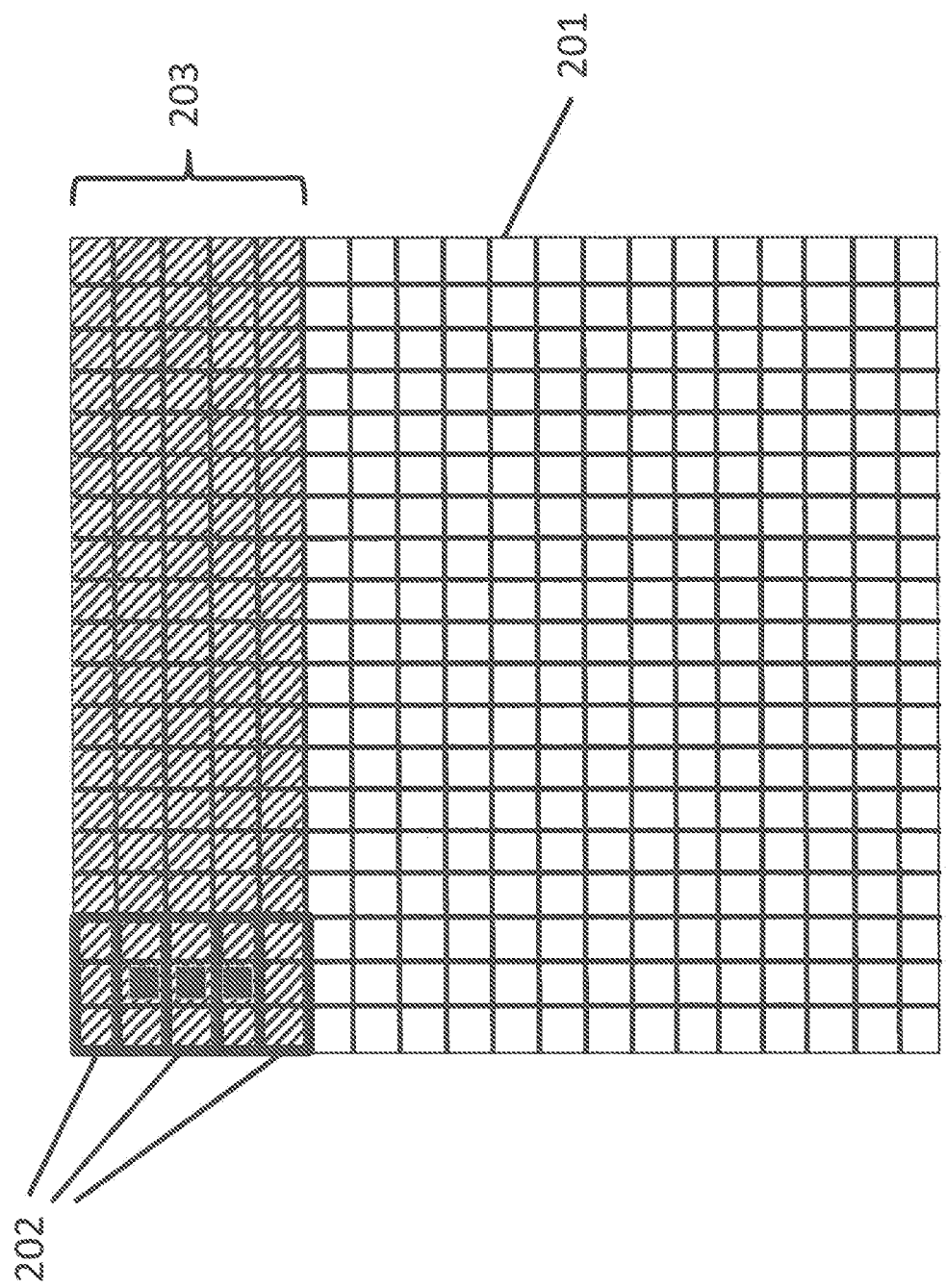

FIG. 2a depicts an embodiment of an input frame of image data 201. FIG. 2a also depicts an outline of three overlapping stencils 202 (each stencil having a dimension of 3 pixels by 3 pixels) that a stencil processor is designed to operate over. The output pixel that each stencil respectively generates output image data for is highlighted in solid black. For brevity, the three overlapping stencils 202 are depicted as overlapping only in the vertical direction. It is pertinent to recognize that in actuality a stencil processor may be designed to have overlapping stencils in both the vertical and horizontal directions.

Because of the vertical overlapping stencils 202 within the stencil processor, as observed in FIG. 2a, there exists a wide band of image data within the frame that a single stencil processor can operate over. As will be discussed in more detail below, in an embodiment, the stencil processors process data within their overlapping stencils in a left to right fashion across the image data (and then repeat for the next set of lines, in top to bottom order). Thus, as the stencil processors continue forward with their operation, the number of solid black output pixel blocks will grow right-wise horizontally. As discussed above, a line buffer unit 101 is responsible for parsing a line group of input image data from an incoming frame that is sufficient for the stencil processors to operate over for an extended number of upcoming cycles. An exemplary depiction of a line group is illustrated as a shaded region 203. In an embodiment, the line buffer unit 101 can comprehend different dynamics for sending/receiving a line group to/from a sheet generator. For example, according to one mode, referred to as "full group", the complete full width lines of image data are passed between a line buffer unit and a sheet generator. According to a second mode, referred to as "virtually tall", a line group is passed initially with a subset of full width rows. The remaining rows are then passed sequentially in smaller (less than full width) pieces.

With the line group 203 of the input image data having been defined by the line buffer unit and passed to the sheet generator unit, the sheet generator unit further parses the line group into finer sheets that are more precisely fitted to the hardware limitations of the stencil processor. More specifically, as will be described in more detail further below, in an embodiment, each stencil processor consists of a two dimensional shift register array. The two dimensional shift register array essentially shifts image data "beneath" an array of execution lanes where the pattern of the shifting causes each execution lane to operate on data within its own respective stencil (that is, each execution lane processes on its own stencil of information to generate an output for that stencil). In an embodiment, sheets are surface areas of input image data that "fill" or are otherwise loaded into the two dimensional shift register array.

As will be described in more detail below, in various embodiments, there are actually multiple layers of two dimensional register data that can be shifted on any cycle. For convenience, much of the present description will simply use the term "two-dimensional shift register" and the like to refer to structures that have one or more such layers of two-dimensional register data that can be shifted.

Figure 2B:
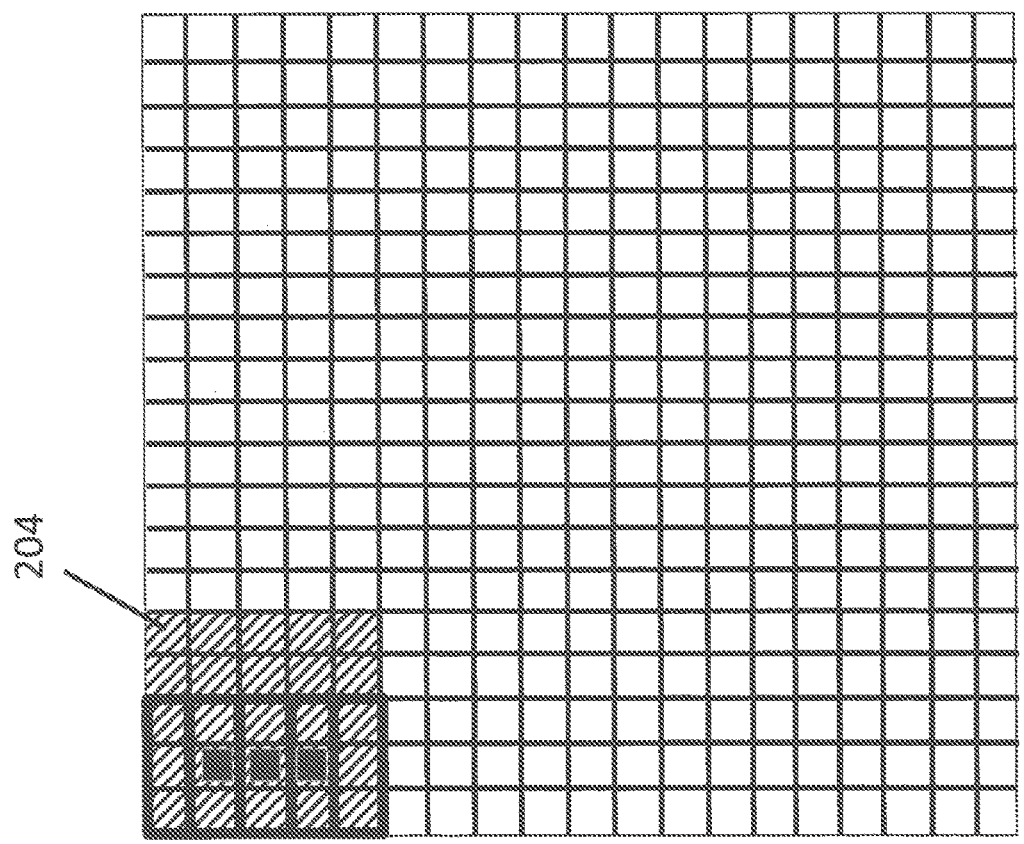
Figure 2C:
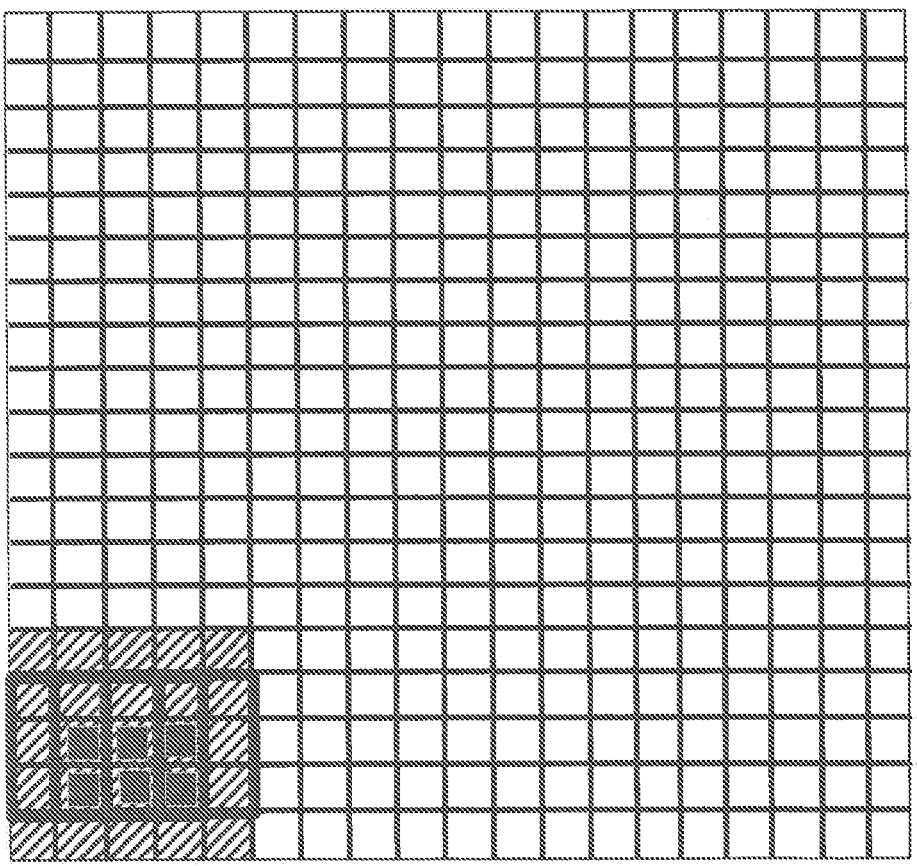
Figure 2D:
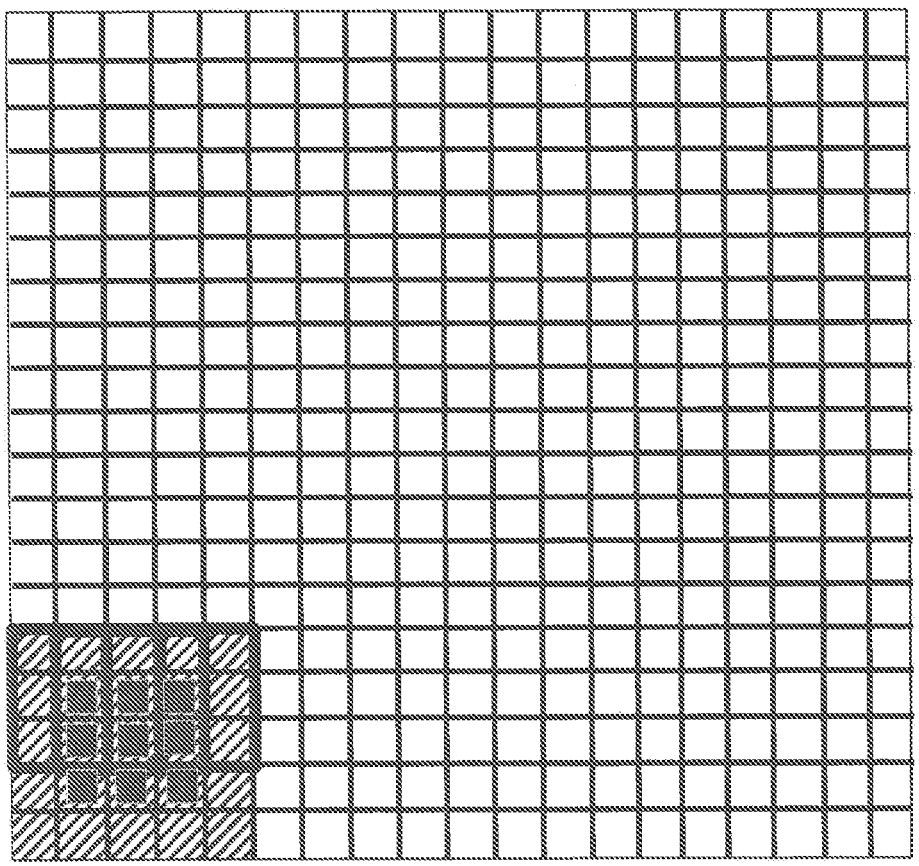

Thus, as observed in FIG. 2b, the sheet generator parses an initial sheet 204 from the line group 203 and provides it to the stencil processor (here, the sheet of data corresponds to the five by five shaded region that is generally identified by reference number 204). As observed in FIGS. 2c and 2d, the stencil processor operates on the sheet of input image data by effectively moving the overlapping stencils 202 in a left to right fashion over the sheet. As of FIG. 2d, the number of pixels for which an output value could be calculated (nine in a darkened 3 by 3 array) from the data within the sheet is exhausted (no other pixel positions can have an output value determined from the information within the sheet). For simplicity the border regions of the image have been ignored.

As observed in FIG. 2e the sheet generator then provides a next sheet 205 for the stencil processor to continue operations on. Note that the initial positions of the stencils as they begin operation on the next sheet is the next progression to the right from the point of exhaustion on the first sheet (as depicted previously in FIG. 2d). With the new sheet 205, the stencils will simply continue moving to the right as the stencil processor operates on the new sheet in the same manner as with the processing of the first sheet.

Note that there is some overlap between the data of the first sheet 204 and the data of the second sheet 205 owing to the border regions of stencils that surround an output pixel location. The overlap could be handled simply by the sheet generator re-transmitting the overlapping data twice. In alternate implementations, to feed a next sheet to the stencil processor, the sheet generator may proceed to only send new data to the stencil processor and the stencil processor reuses the overlapping data from the previous sheet.

b. Stencil Processor Design and Operation

Figure 3:
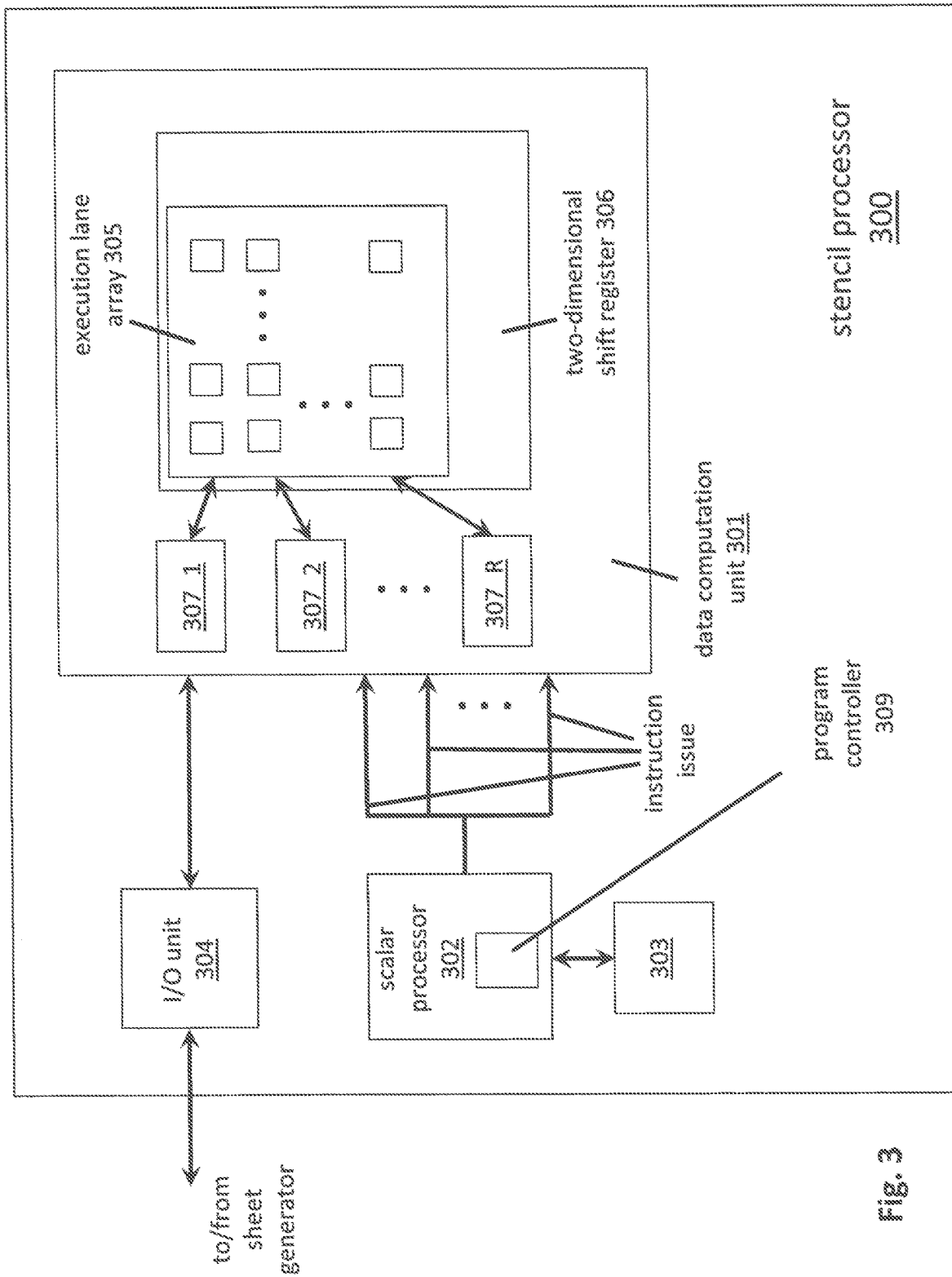
FIG. 3 shows an embodiment of a stencil processor.

FIG. 3 shows an embodiment of a stencil processor unit architecture 300. As observed in FIG. 3, the stencil processor includes a data computation unit 301, a scalar processor 302 and associated memory 303 and an I/O unit 304. The data computation unit 301 includes an array of execution lanes 305, a two-dimensional shift array structure 306 and separate respective random access memories 307 associated with specific rows or columns of the array.

The I/O unit 304 is responsible for loading "input" sheets of data received from the sheet generator into the data computation unit 301 and storing "output" sheets of data from the stencil processor into the sheet generator. In an embodiment the loading of sheet data into the data computation unit 301 entails parsing a received sheet into rows/columns of image data and loading the rows/columns of image data into the two dimensional shift register structure 306 or respective random access memories 307 of the rows/columns of the execution lane array (described in more detail below). If the sheet is initially loaded into memories 307, the individual execution lanes within the execution lane array 305 may then load sheet data into the two-dimensional shift register structure 306 from the random access memories 307 when appropriate (e.g., as a load instruction just prior to operation on the sheet's data). Upon completion of the loading of a sheet of data into the register structure 306 (whether directly from a sheet generator or from memories 307), the execution lanes of the execution lane array 305 operate on the data and eventually "write back" finished data as a sheet directly back to the sheet generator, or, into the random access memories 307. If the execution lanes write back to random access memories 307, the I/O unit 304 fetches the data from the random access memories 307 to form an output sheet which is then forwarded to the sheet generator.

The scalar processor 302 includes a program controller 309 that reads the instructions of the stencil processor's program code from scalar memory 303 and issues the instructions to the execution lanes in the execution lane array 305. In an embodiment, a single same instruction is broadcast to all execution lanes within the array 305 to effect a single instruction multiple data (SIMD)-like behavior from the data computation unit 301. In an embodiment, the instruction format of the instructions read from scalar memory 303 and issued to the execution lanes of the execution lane array 305 includes a very-long-instruction-word (VLIW) type format that includes more than one opcode per instruction. In a further embodiment, the VLIW format includes both an ALU opcode that directs a mathematical function performed by each execution lane's ALU (which, as described below, in an embodiment may specify more than one traditional ALU operation) and a memory opcode (that directs a memory operation for a specific execution lane or set of execution lanes).

The term "execution lane" refers to a set of one or more execution units capable of executing an instruction (e.g., logic circuitry that can execute an instruction). An execution lane can, in various embodiments, include more processor-like functionality beyond just execution units, however. For example, besides one or more execution units, an execution lane may also include logic circuitry that decodes a received instruction, or, in the case of more multiple instruction multiple data (MIMD)-like designs, logic circuitry that fetches and decodes an instruction. With respect to MIMD-like approaches, although a centralized program control approach has largely been described herein, a more distributed approach may be implemented in various alternative embodiments (e.g., including program code and a program controller within each execution lane of the array 305).

The combination of an execution lane array 305, program controller 309 and two dimensional shift register structure 306 provides a widely adaptable/configurable hardware platform for a broad range of programmable functions. For example, application software developers are able to program kernels having a wide range of different functional capability as well as dimension (e.g., stencil size) given that the individual execution lanes are able to perform a wide variety of functions and are able to readily access input image data proximate to any output array location.

Apart from acting as a data store for image data being operated on by the execution lane array 305, the random access memories 307 may also keep one or more look-up tables. In various embodiments one or more scalar look-up tables may also be instantiated within the scalar memory 303.

A scalar look-up involves passing the same data value from the same look-up table from the same index to each of the execution lanes within the execution lane array 305. In various embodiments, the VLIW instruction format described above is expanded to also include a scalar opcode that directs a look-up operation performed by the scalar processor into a scalar look-up table. The index that is specified for use with the opcode may be an immediate operand or fetched from some other data storage location. Regardless, in an embodiment, a look up from a scalar look-up table within scalar memory essentially involves broadcasting the same data value to all execution lanes within the execution lane array 305 during a the same clock cycle. Additional details concerning use and operation of look-up tables is provided further below.

Figure 4:
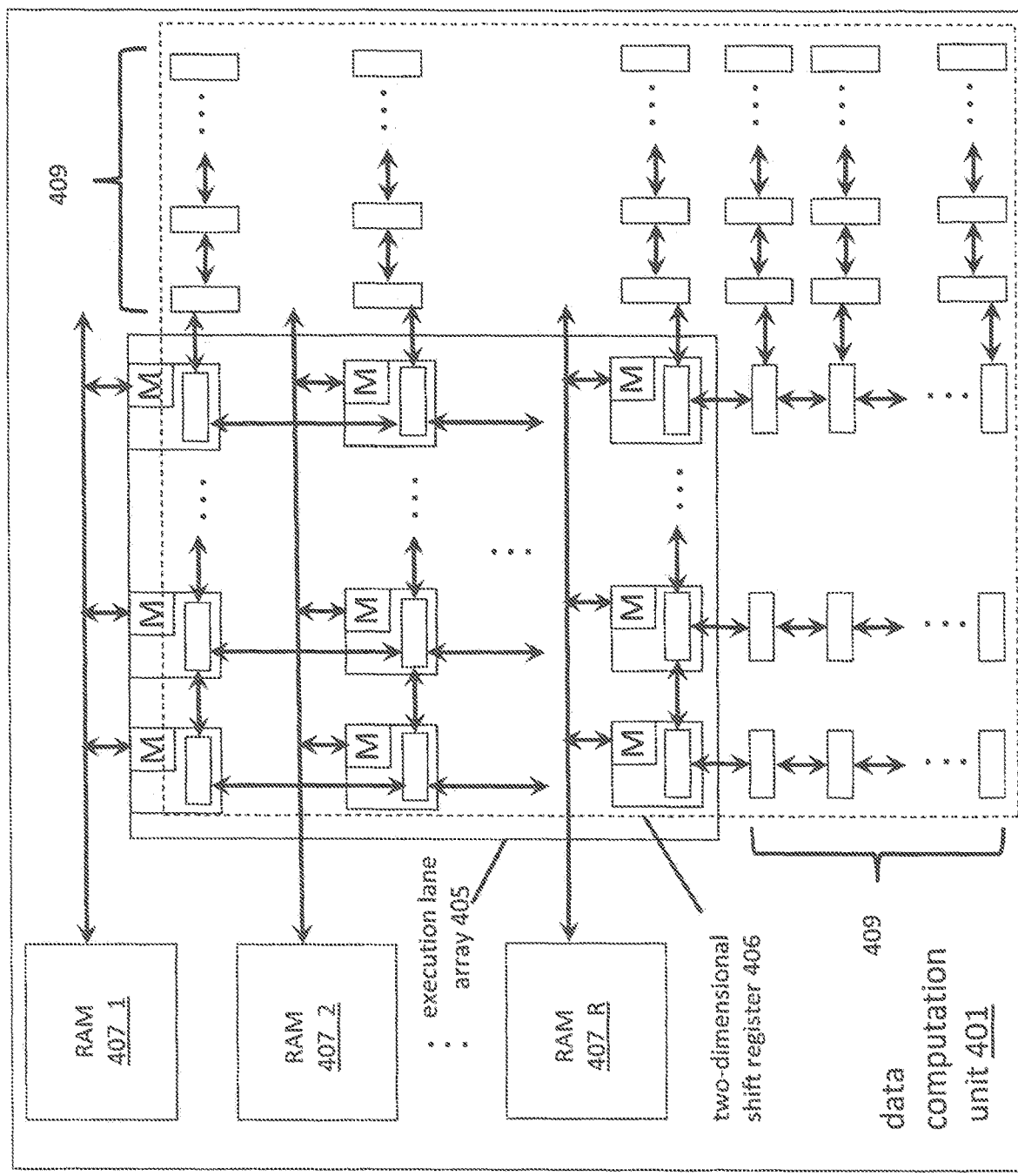
FIG. 4 shows an embodiment of a data computation unit within a stencil processor.

FIG. 4 shows an embodiment of a data computation unit 401. As observed in FIG. 4, the data computation unit 401 includes an array of execution lanes 405 that are logically positioned "above" a two-dimensional shift register array structure 406. As discussed above, in various embodiments, a sheet of image data provided by a sheet generator is loaded into the two-dimensional shift register 406. The execution lanes then operate on the sheet data from the register structure 406.

The execution lane array 405 and shift register structure 406 are fixed in position relative to one another. However, the data within the shift register array 406 shifts in a strategic and coordinated fashion to cause each execution lane in the execution lane array to process a different stencil within the data. As such, each execution lane determines the output image value for a different pixel in the output sheet being generated. From the architecture of FIG. 4 it should be clear that overlapping stencils are not only arranged vertically but also horizontally as the execution lane array 405 includes vertically adjacent execution lanes as well as horizontally adjacent execution lanes.

Some notable architectural features of the data computation unit 401 include the shift register structure 406 having wider dimensions than the execution lane array 405. That is, there is a "halo" of registers 409 outside the execution lane array 405. Although the halo 409 is shown to exist on two sides of the execution lane array, depending on implementation, the halo may exist on less (one) or more (three or four) sides of the execution lane array 405. The halo 405 serves to provide "spill-over" space for data that spills outside the bounds of the execution lane array 405 as the data is shifting "beneath" the execution lanes 405. As a simple case, a 5×5 stencil centered on the right edge of the execution lane array 405 will need four halo register locations further to the right when the stencil's leftmost pixels are processed. For ease of drawing, FIG. 4 shows the registers of the right side of the halo as only having horizontal shift connections and registers of the bottom side of the halo as only having vertical shift connections when, in a nominal embodiment, registers on either side (right, bottom) would have both horizontal and vertical connections.

Additional spill-over room is provided by random access memories 407 that are coupled to each row and/or each column in the array, or portions thereof (e.g., a random access memory may be assigned to a "region" of the execution lane array that spans 4 execution lanes row wise and 2 execution lanes column wise. For simplicity the remainder of the application will refer mainly to row and/or column based allocation schemes). Here, if an execution lane's kernel operations require it to process pixel values outside of the two-dimensional shift register array 406 (which some image processing routines may require) the plane of image data is able to further spill-over, e.g., from the halo region 409 into random access memory 407. For example, consider a 6×6 stencil where the hardware includes a halo region of only four storage elements to the right of an execution lane on the right edge of the execution lane array. In this case, the data would need to be shifted further to the right off the right edge of the halo 409 to fully process the stencil. Data that is shifted outside the halo region 409 would then spill-over to random access memory 407. Other applications of the random access memories 407 and the stencil processor of FIG. 3 are provided further below.

FIGS. 5a through 5k demonstrate a working example of the manner in which image data is shifted within the two dimensional shift register array "beneath" the execution lane array as alluded to above. As observed in FIG. 5a, the data contents of the two dimensional shift array are depicted in a first array 507 and the execution lane array is depicted by a frame 505. Also, two neighboring execution lanes 510 within the execution lane array are simplistically depicted. In this simplistic depiction 510, each execution lane includes a register R1 that can accept data from the shift register, accept data from an ALU output (e.g., to behave as an accumulator across cycles), or write output data into an output destination.

Each execution lane also has available, in a local register R2, the contents "beneath" it in the two dimensional shift array. Thus, R1 is a physical register of the execution lane while R2 is a physical register of the two dimensional shift register array. The execution lane includes an ALU that can operate on operands provided by R1 and/or R2. As will be described in more detail further below, in an embodiment the shift register is actually implemented with multiple (a "depth" of) storage/register elements per array location but the shifting activity is limited to one plane of storage elements (e.g., only one plane of storage elements can shift per cycle). FIGS. 5a through 5k depict one of these deeper register locations as being used to store the resultant X from the respective execution lanes. For illustrative ease the deeper resultant register is drawn alongside rather than beneath its counterpart register R2.

FIGS. 5a through 5k focus on the calculation of two stencils whose central position is aligned with the pair of execution lane positions 511 depicted within the execution lane array 505. For ease of illustration, the pair of execution lanes 510 are drawn as horizontal neighbors when in fact, according to the following example, they are vertical neighbors.

Figure 5B:
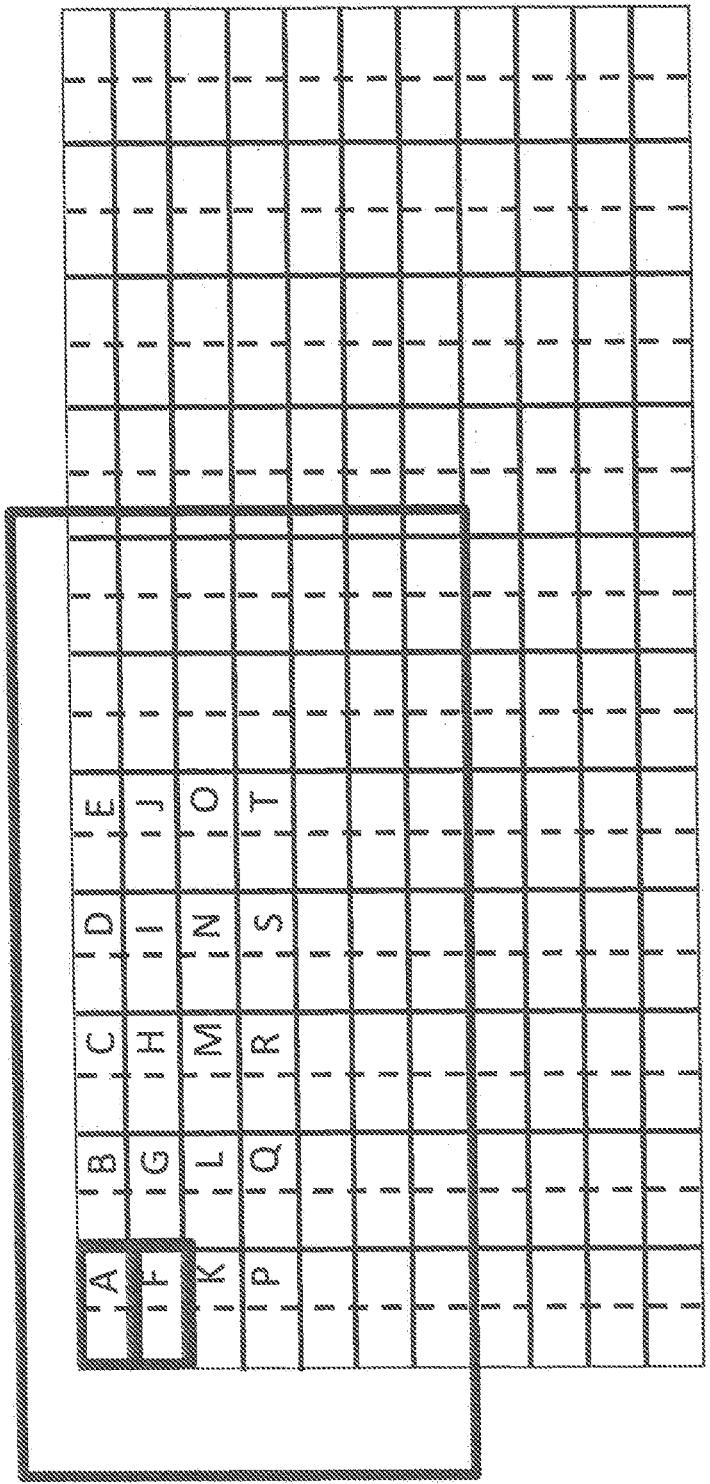

As observed initially in FIG. 5a, the execution lanes 511 are centered on their central stencil locations. FIG. 5b shows the object code executed by both execution lanes 511. As observed in FIG. 5b the program code of both execution lanes 511 causes the data within the shift register array 507 to shift down one position and shift right one position. This aligns both execution lanes 511 to the upper left hand corner of their respective stencils. The program code then causes the data that is located (in R2) in their respective locations to be loaded into R1.

Figure 5C:
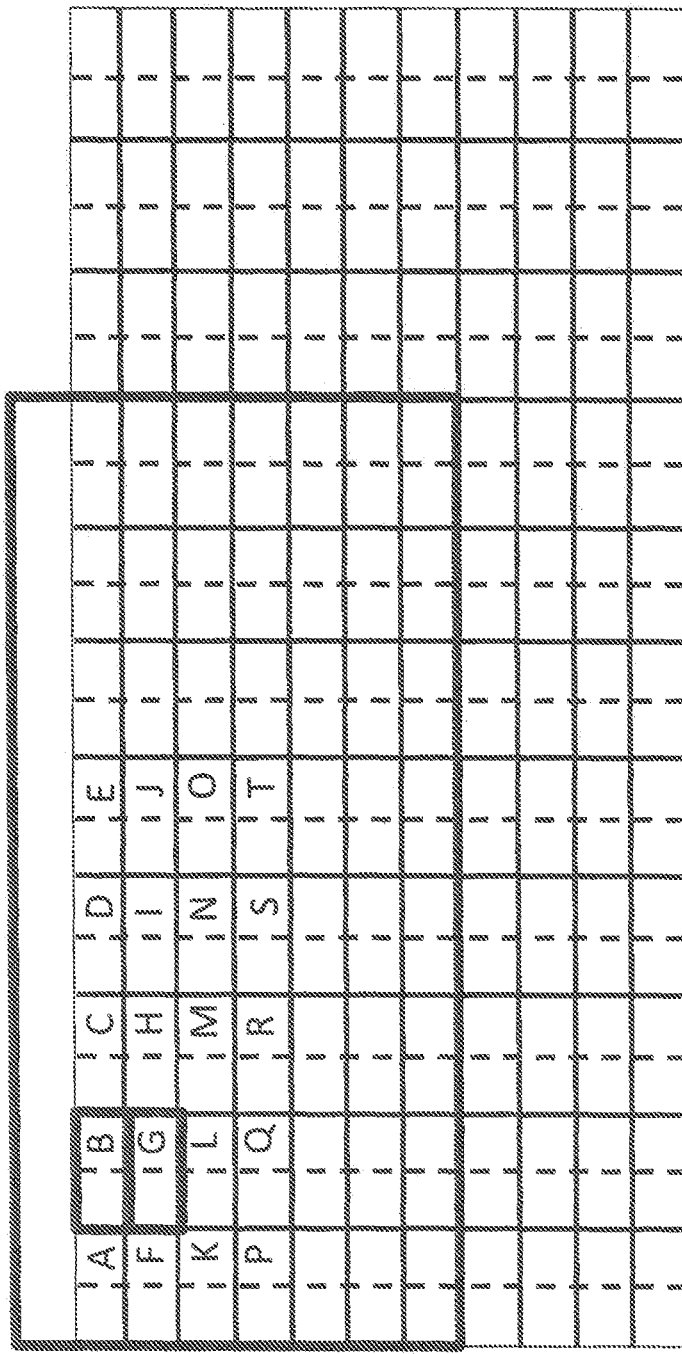
Figure 5D:
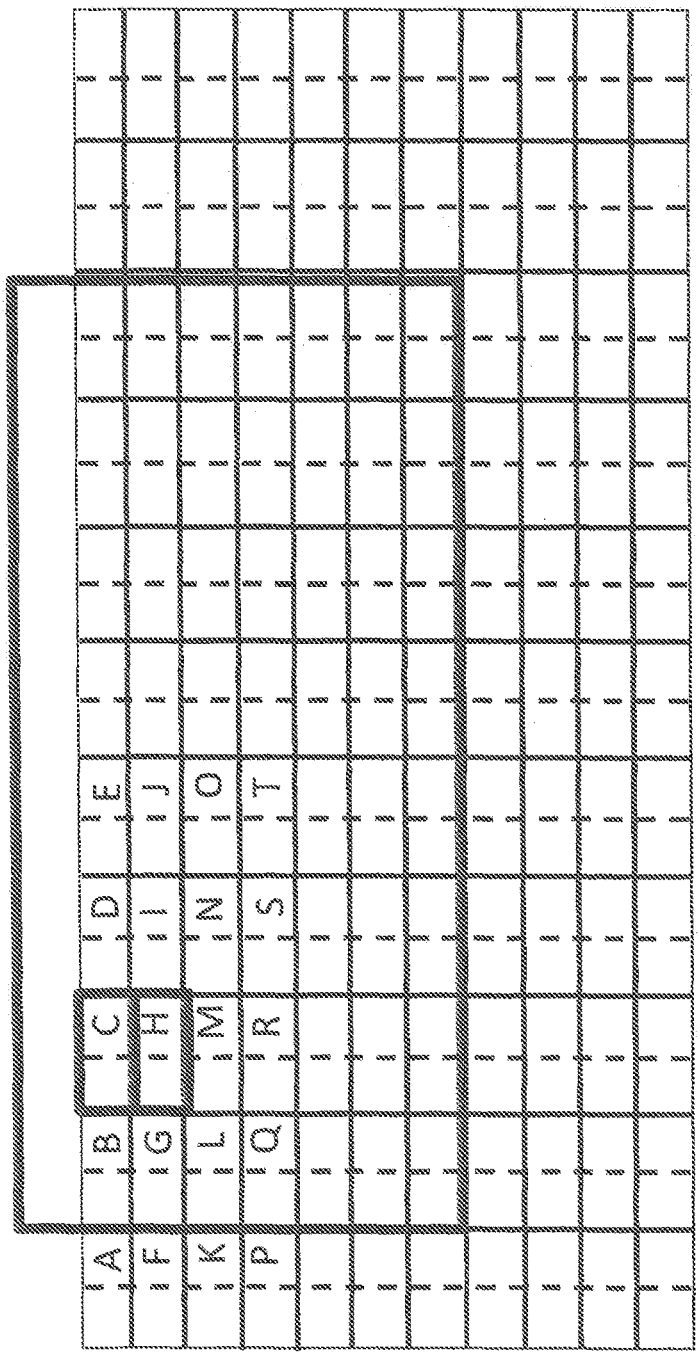

As observed in FIG. 5c the program code next causes the pair of execution lanes 511 to shift the data within the shift register array 507 one unit to the left which causes the value to the right of each execution lane's respective position to be shifted into each execution lane' position. The value in R1 (previous value) is then added with the new value that has shifted into the execution lane's position (in R2). The resultant is written into R1. As observed in FIG. 5d the same process as described above for FIG. 5c is repeated which causes the resultant R1 to now include the value A+B+C in the upper execution lane and F+G+H in the lower execution lane. At this point both execution lanes 511 have processed the upper row of their respective stencils. Note the spill-over into a halo region on the left side of the execution lane array 505 (if one exists on the left hand side) or into random access memory if a halo region does not exist on the left hand side of the execution lane array 505.

Figure 5E:
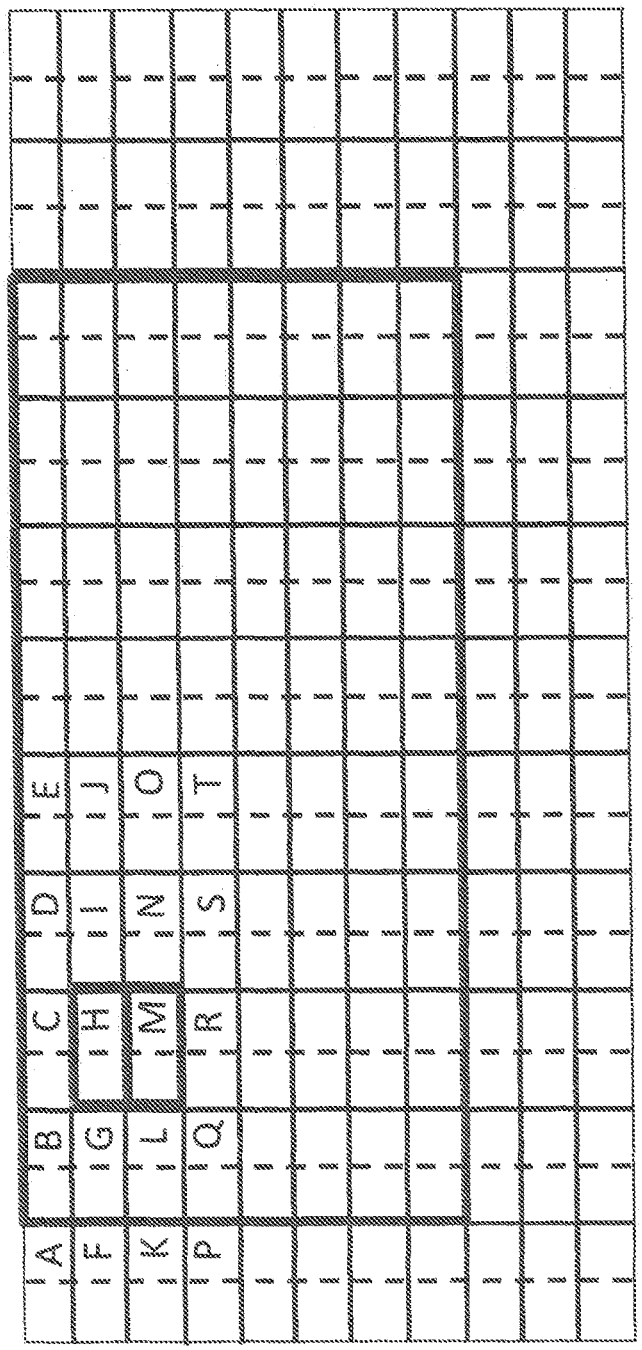
Figure 5F:
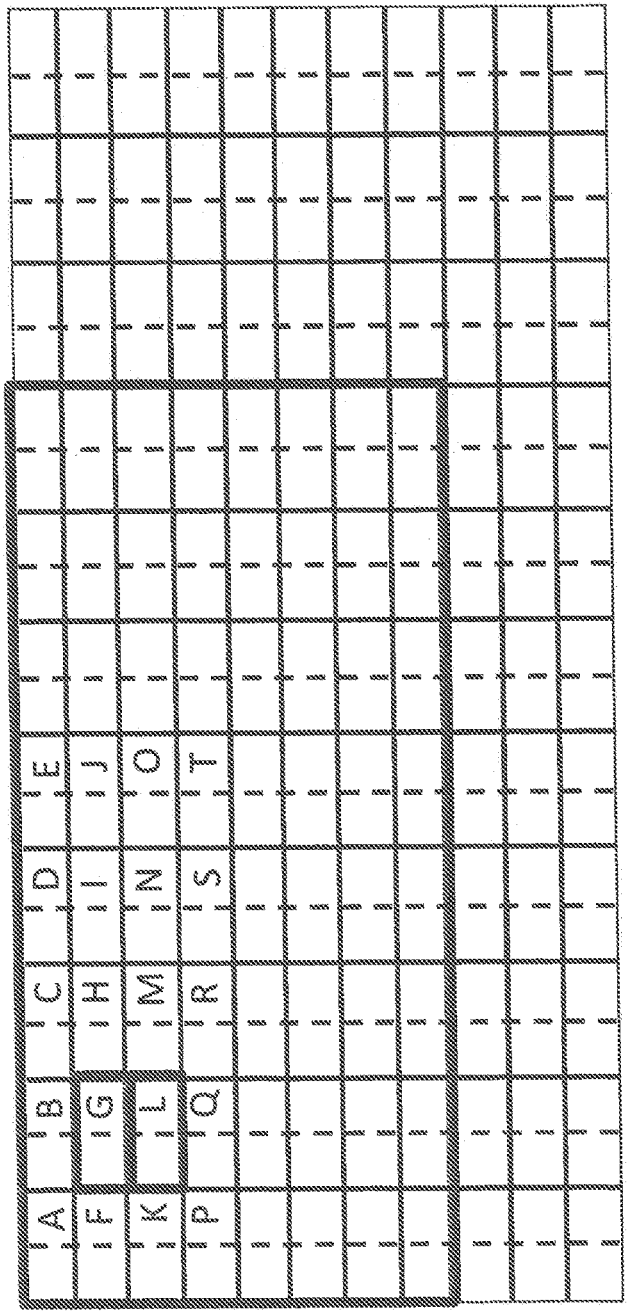
Figure 5G:
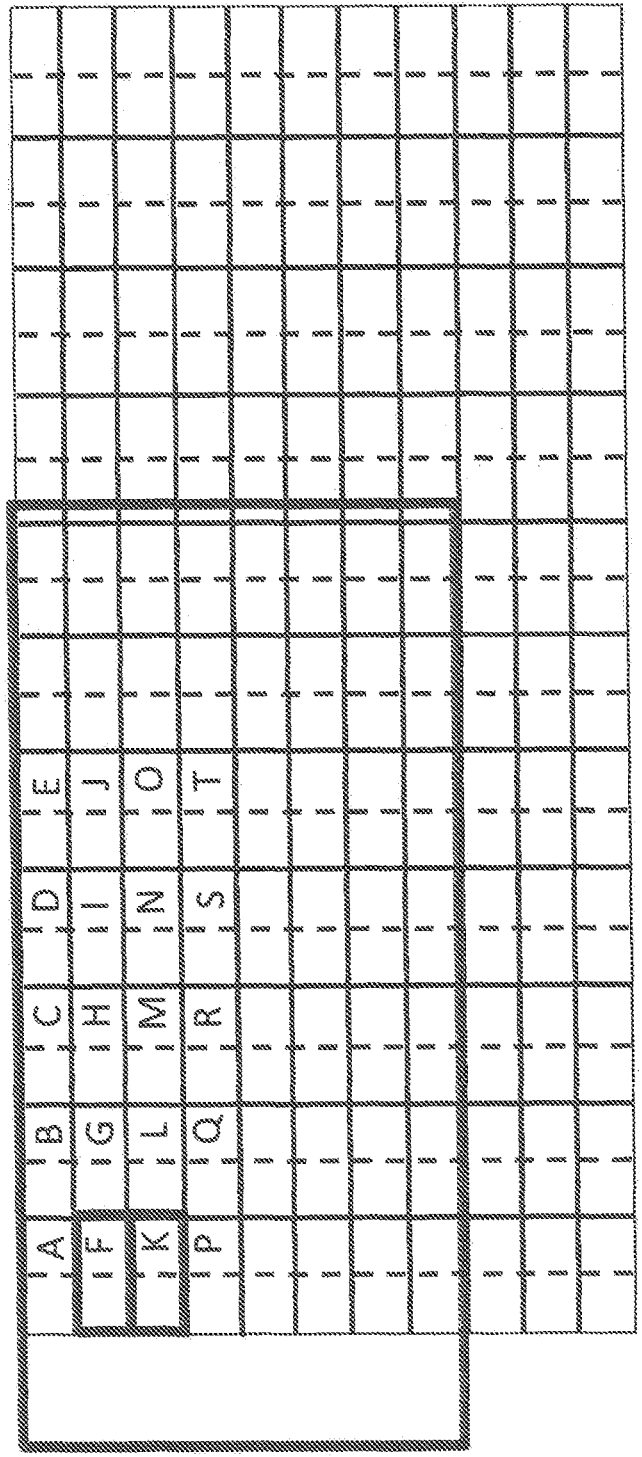

As observed in FIG. 5e, the program code next causes the data within the shift register array to shift one unit up which causes both execution lanes 511 to be aligned with the right edge of the middle row of their respective stencils. Register R1 of both execution lanes 511 currently includes the summation of the stencil's top row and the middle row's rightmost value. FIGS. 5f and 5g demonstrate continued progress moving leftwise across the middle row of both execution lane's stencils. The accumulative addition continues such that at the end of processing of FIG. 5g both execution lanes 511 include the summation of the values of the top row and the middle row of their respective stencils.

Figure 5H:
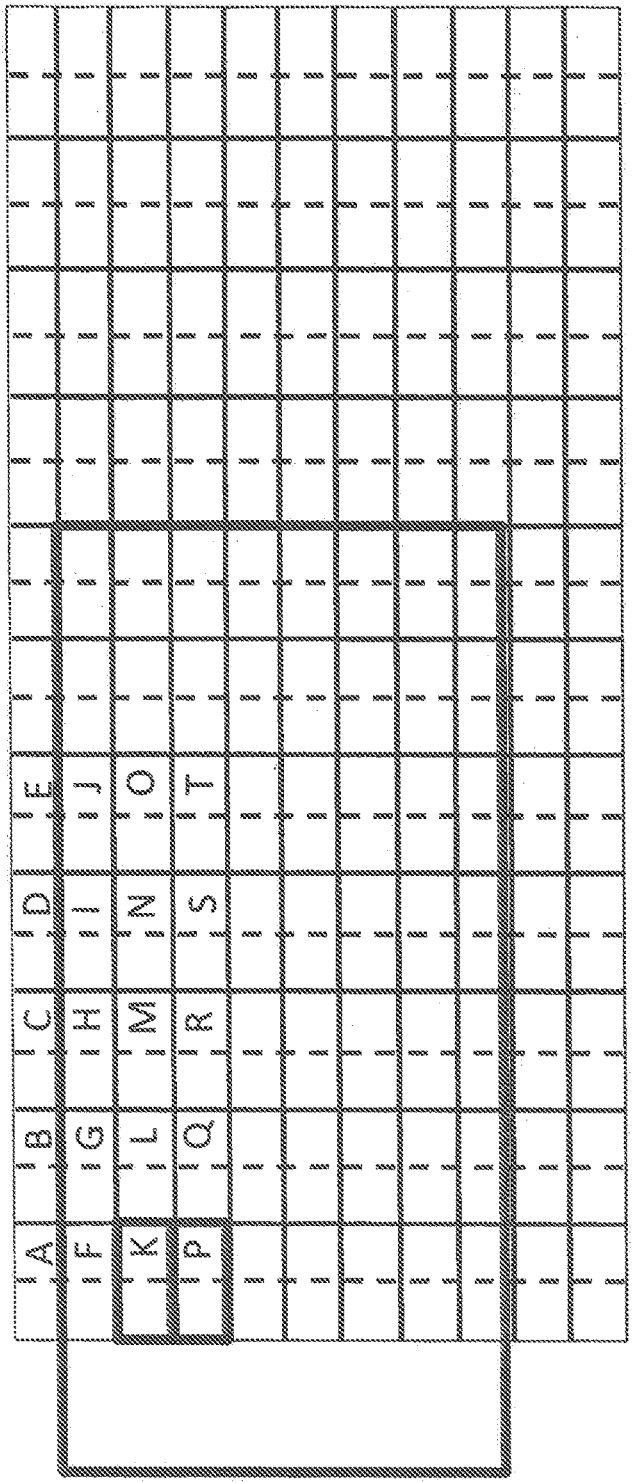
Figure 5I:
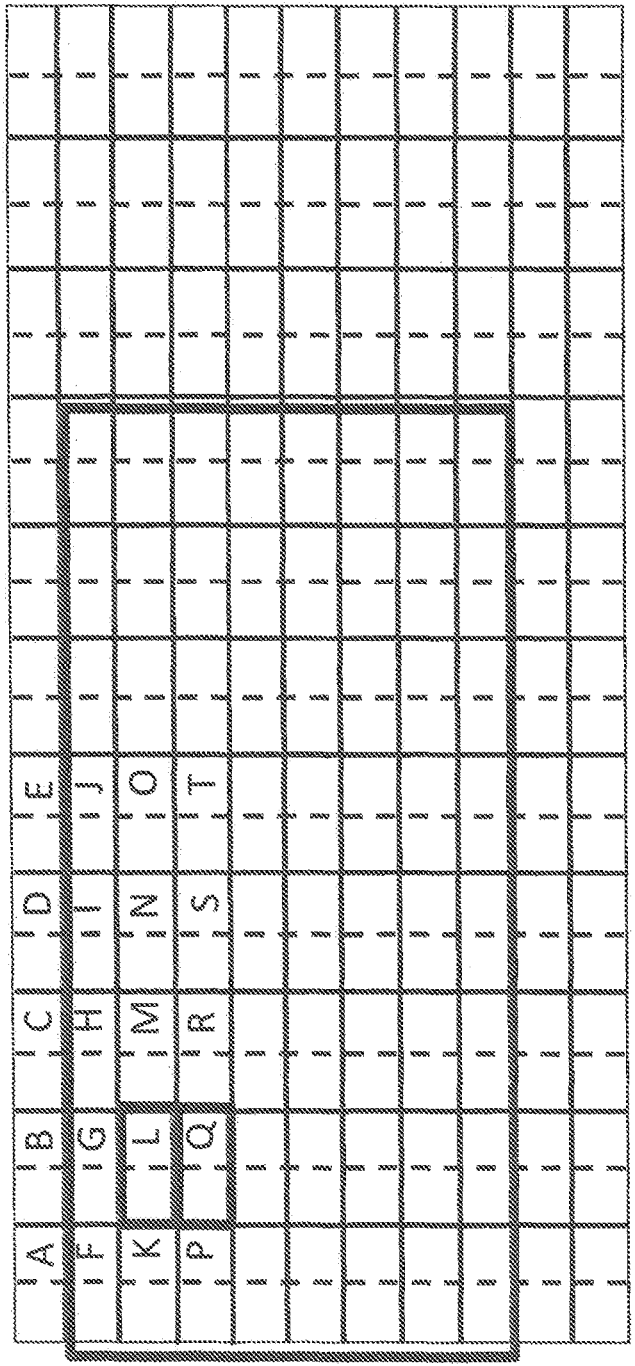
Figure 5J:
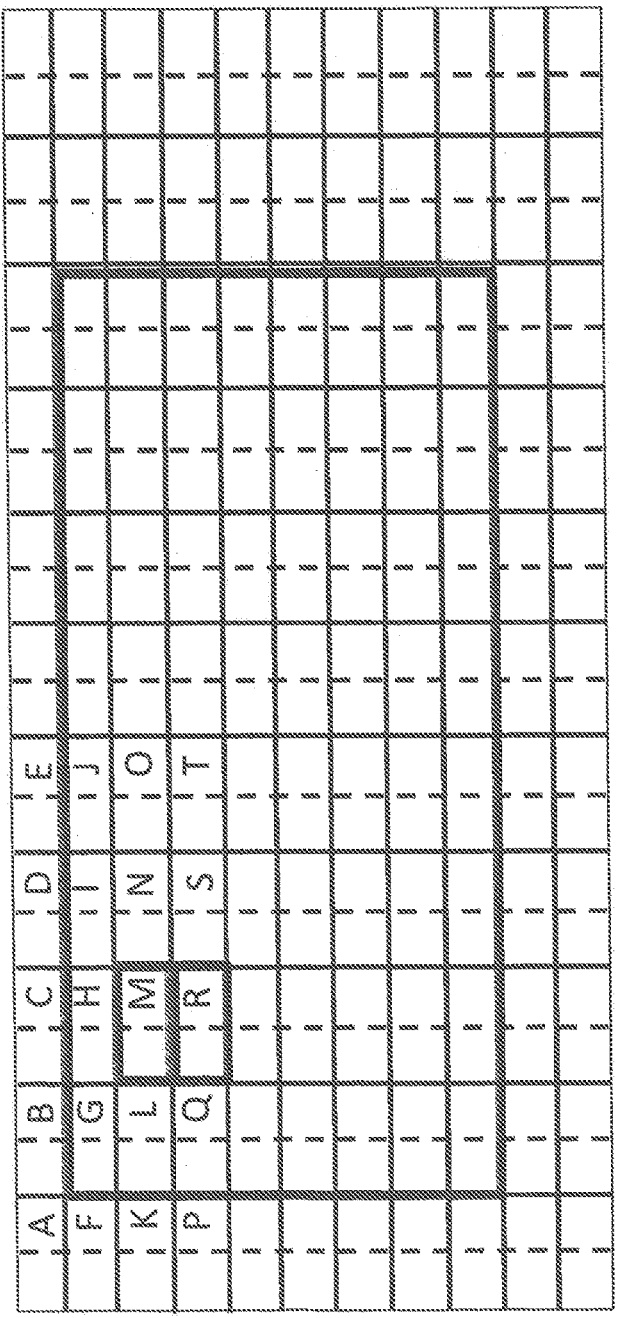
Figure 5K:
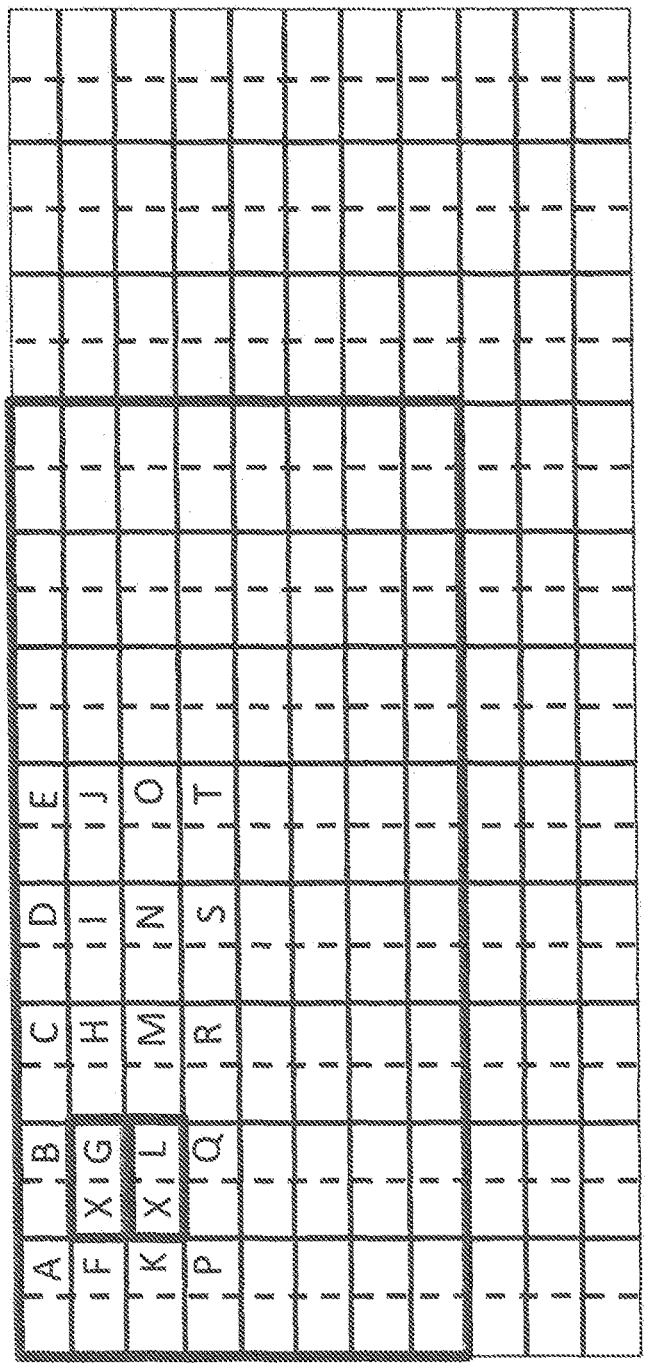

FIG. 5h shows another shift to align each execution lane with its corresponding stencil's lowest row. FIGS. 5i and 5j show continued shifting to complete processing over the course of both execution lanes' stencils. FIG. 5k shows additional shifting to align each execution lane with its correct position in the data array and write the resultant thereto.

In the example of FIGS. 5a-5k note that the object code for the shift operations may include an instruction format that identifies the direction and magnitude of the shift expressed in (X, Y) coordinates. For example, the object code for a shift up by one location may be expressed in object code as SHIFT 0, +1. As another example, a shift to the right by one location may expressed in object code as SHIFT +1, 0. In various embodiments shifts of larger magnitude may also be specified in object code (e.g., SHIFT 0, +2). Here, if the 2D shift register hardware only supports shifts by one location per cycle, the instruction may be interpreted by the machine to require multiple cycle execution, or, the 2D shift register hardware may be designed to support shifts by more than one location per cycle. Embodiments of the later are described in more detail further below.

Figure 6:
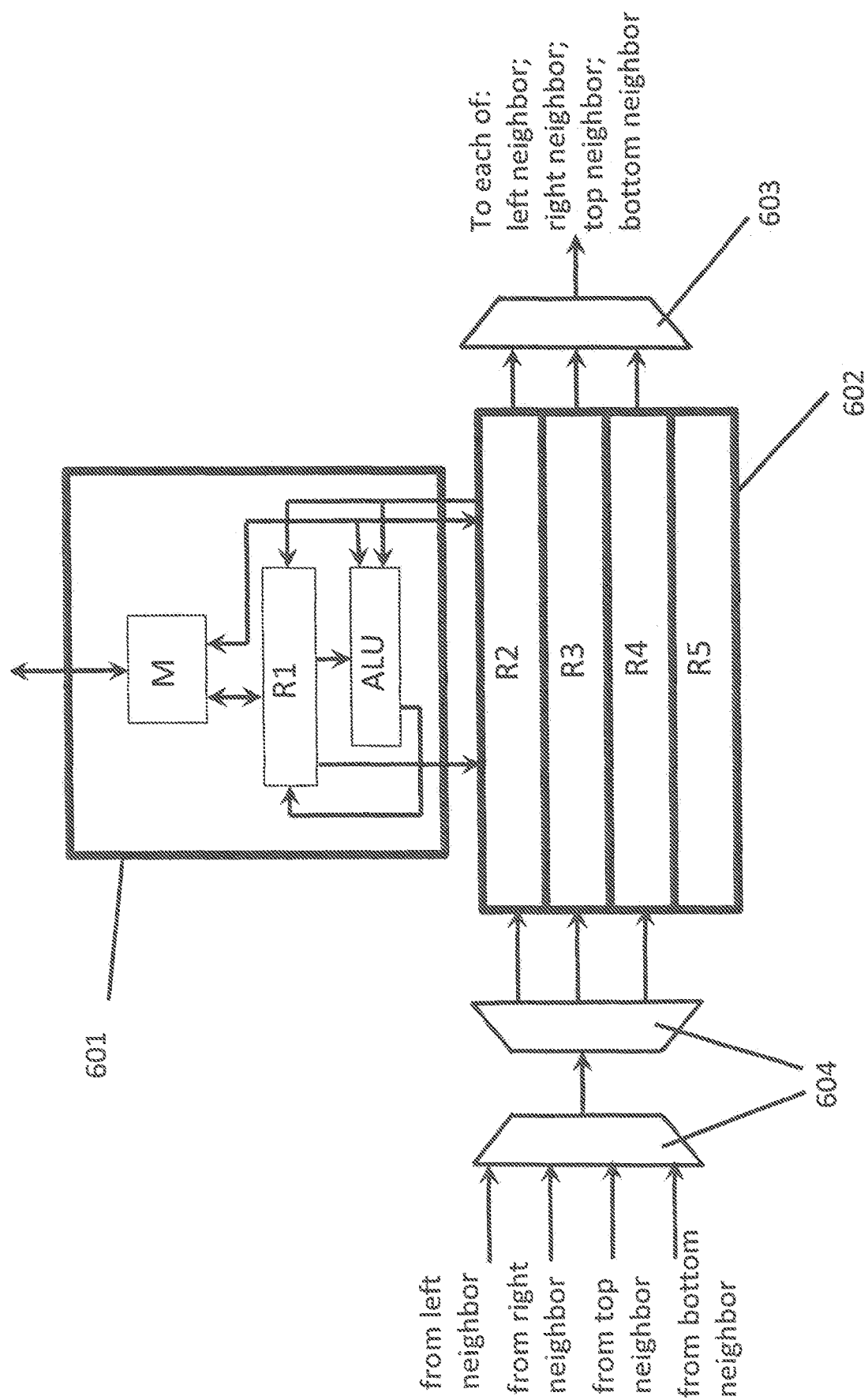
FIG. 6 shows an embodiment of a unit cell for an integrated execution lane array and two-dimensional shift array.

FIG. 6a shows another, more detailed depiction of the unit cell for the array execution lane and shift register structure (registers in the halo region do not include a corresponding execution lane). The execution lane and the register space that is associated with each location in the execution lane array are, in an embodiment, implemented by instantiating the circuitry observed in FIG. 6a at each node of the execution lane array. As observed in FIG. 6a, the unit cell includes an execution lane 601 coupled to a register file 602 consisting of four registers R2 through R5. During any cycle, the execution lane 601 may read from or write to any of registers R1 through R5. For instructions requiring two input operands the execution lane may retrieve both of operands from any of R1 through R5.

In an embodiment, the two dimensional shift register structure is implemented by permitting, during a single cycle, the contents of any of (only) one of registers R2 through R4 to be shifted "out" to one of its neighbor's register files through output multiplexer 603, and, having the contents of any of (only) one of registers R2 through R4 replaced with content that is shifted "in" from a corresponding one if its neighbors through input multiplexers 604 such that shifts between neighbors are in a same direction (e.g., all execution lanes shift left, all execution lanes shift right, etc.). Although it may be common for a same register to have its contents shifted out and replaced with content that is shifted in on a same cycle, the multiplexer arrangement 603, 604 permits for different shift source and shift target registers within a same register file during a same cycle.

As depicted in FIG. 6a, note that during a shift sequence an execution lane will shift content out from its register file 602 to each of its left, right, top, and bottom neighbors. In conjunction with the same shift sequence, the execution lane will also shift content into its register file from a particular one of its left, right, top, and bottom neighbors. Again, the shift out target and shift in source should be consistent with a same shift direction for all execution lanes (e.g., if the shift out is to the right neighbor, the shift in should be from the left neighbor).

Although in one embodiment the content of only one register is permitted to be shifted per execution lane per cycle, other embodiments may permit the content of more than one register to be shifted in/out. For example, the content of two registers may be shifted out/in during a same cycle if a second instance of the multiplexer circuitry 603, 604 observed in FIG. 6a is incorporated into the design of FIG. 6a. Of course, in embodiments where the content of only one register is permitted to be shifted per cycle, shifts from multiple registers may take place between mathematical operations by consuming more clock cycles for shifts between mathematical operations (e.g., the contents of two registers may be shifted between math ops by consuming two shift ops between the math ops).

If less than all the content of an execution lane's register files are shifted out during a shift sequence note that the content of the non shifted out registers of each execution lane remain in place (do not shift). As such, any non-shifted content that is not replaced with shifted-in content persists local to the execution lane across the shifting cycle. The memory unit ("M") observed in each execution lane is used to load/store data from/to the random access memory space that is associated with the execution lane's row and/or column within the execution lane array. Here, the M unit acts as a standard M unit in that it is often used to load/store data that cannot be loaded/stored from/to the execution lane's own register space. In various embodiments, the primary operation of the M unit is to write data from a local register into memory, and, read data from memory and write it into a local register.

With respect to the ISA opcodes supported by the ALU unit of the hardware execution lane 601, in various embodiments, the mathematical opcodes supported by the hardware ALU are integrally tied with (e.g., substantially the same as) the mathematical opcodes supported by a virtual execution lane (e.g., ADD, SUB, MOV, MUL, MAD, ABS, DIV, SHL, SHR, MIN/MAX, SEL, AND, OR, XOR, NOT). As described just above, memory access instructions can be executed by the execution lane 601 to fetch/store data from/to their associated random access memory. Additionally the hardware execution lane 601 supports shift operation instructions (right, left, up, down) to shift data within the two-dimensional shift register structure. As described above, program control instructions are largely executed by the scalar processor of the stencil processor.

c. Statistics Operations Performed on Stencil Processor

Figure 7:
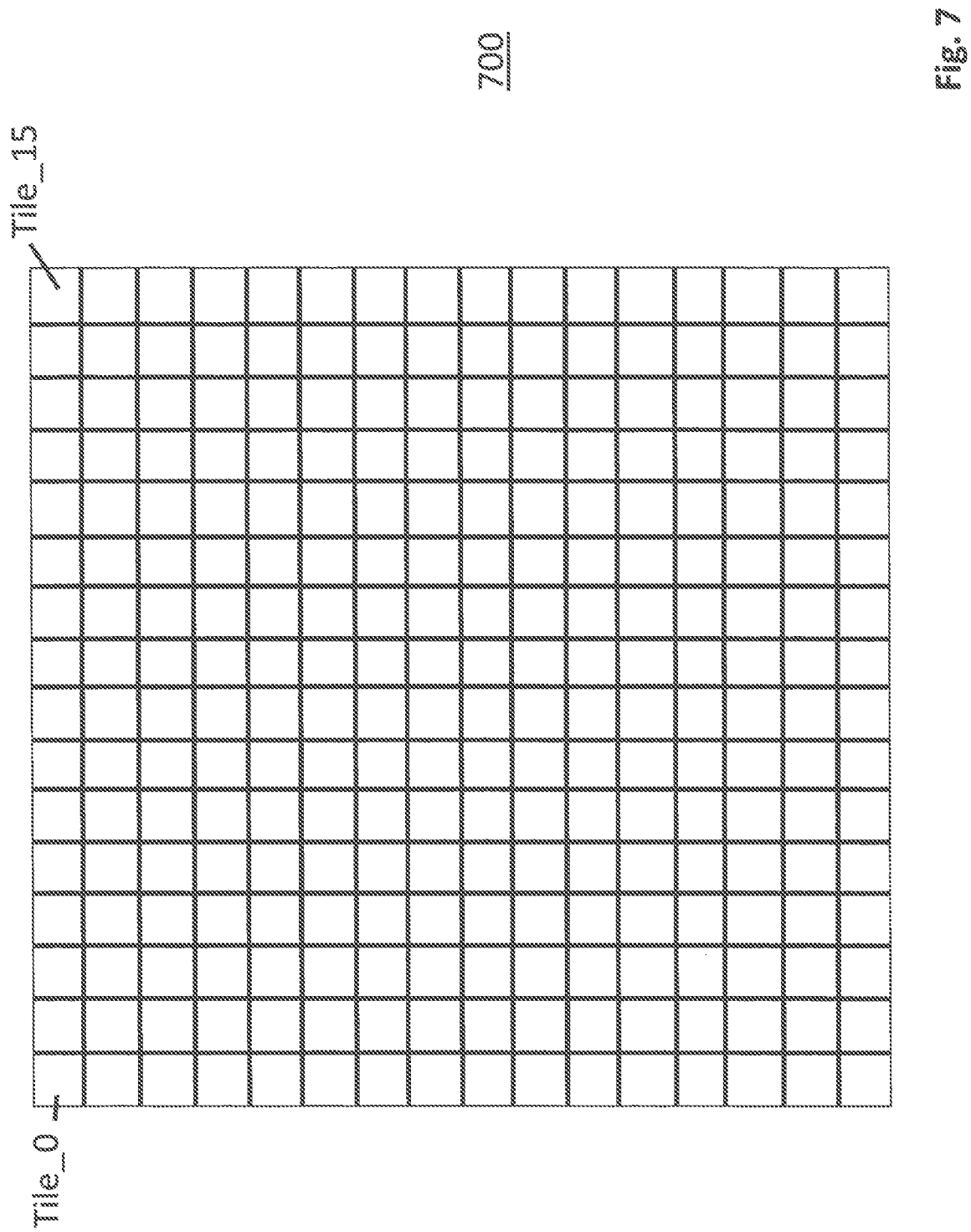
FIG. 7 depicts tiles within an image frame.
Figure 8:
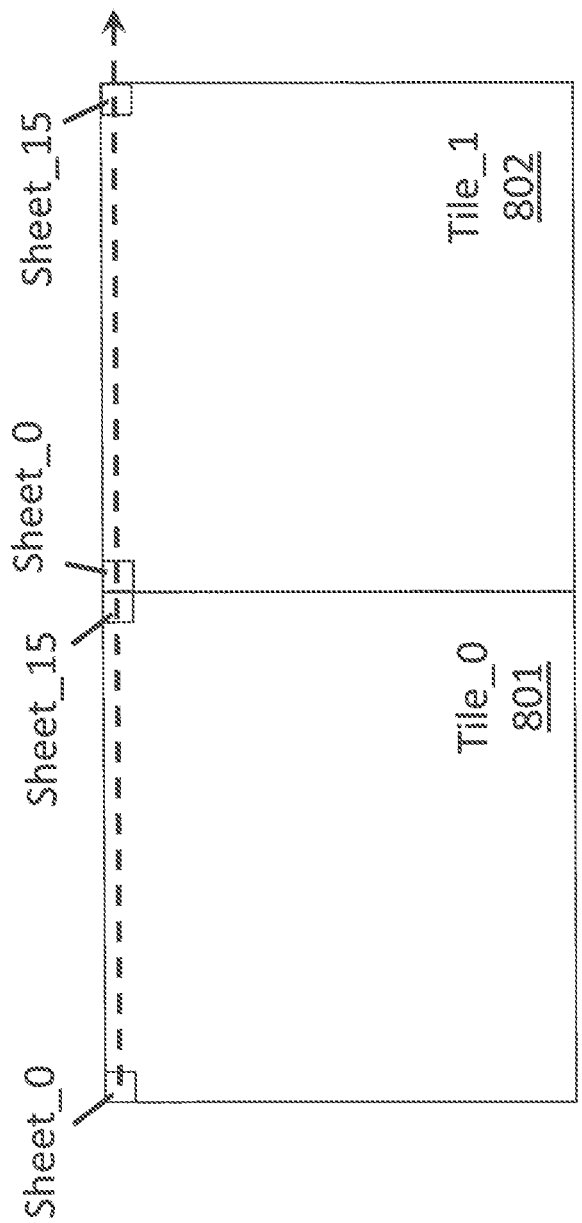
FIG. 8 depicts raster processing across tile boundaries.

FIG. 7 shows an exemplary depiction of an image frame 600. As observed in FIG. 7, the image 700 can be viewed as being broken down into an array of tiles. The particular exemplary image of FIG. 7 consists of an array of 16 tiles by 16 tiles. As observed in FIG. 8 each tile can be further broken down into an array of sheets. The exemplary depiction of FIG. 8 shows, e.g., the first two tiles 801, 802 along the top row of tiles of the image 700 of FIG. 7. As FIG. 8 shows, each tile can be broken down into an array of sheets. In the particular example of FIG. 8, each tile is composed of a 16×16 array of sheets. Each sheet may be composed, for example, of a 16×16 array of pixel values.

As described at length above, in various embodiments, a stencil processor is designed to process a sheet as its unit of data. Here, a sheet of image data is loaded into the stencil processor's two dimensional register space and the processor performs certain image processing tasks on the sheet of image data. As observed in FIG. 8, in various embodiments, the processing of an entire image includes, e.g., processing a row of sheets across a first tile 801 (e.g., in a left to right fashion across the tile) and then continuing to process sheets in a same direction along the same row within a second neighboring tile 802.

The process continues until all sheets along the particular row are processed across all tiles of the image. Then a next (e.g., lower) row of sheets is processed and the process repeats. For instance after the sixteenth sheet of the sixteenth tile along the first row of sheets of the image is processed, the first sheet of the first tile along the second row of sheets is next processed.

The processing of statistics for an image often entails calculating a summation of pixel values within the image. For example, a common statistics operation is to calculate an average pixel value. As such, pixel values are summed across an image and then normalized by the number of pixels that were summed over. In various embodiments, image statistics are organized at tile granularity. As such, e.g., an average pixel value is maintained for each tile in an image. The tiles are then subsequently processed as needed to calculate other statistics for the image.

Figure 9:
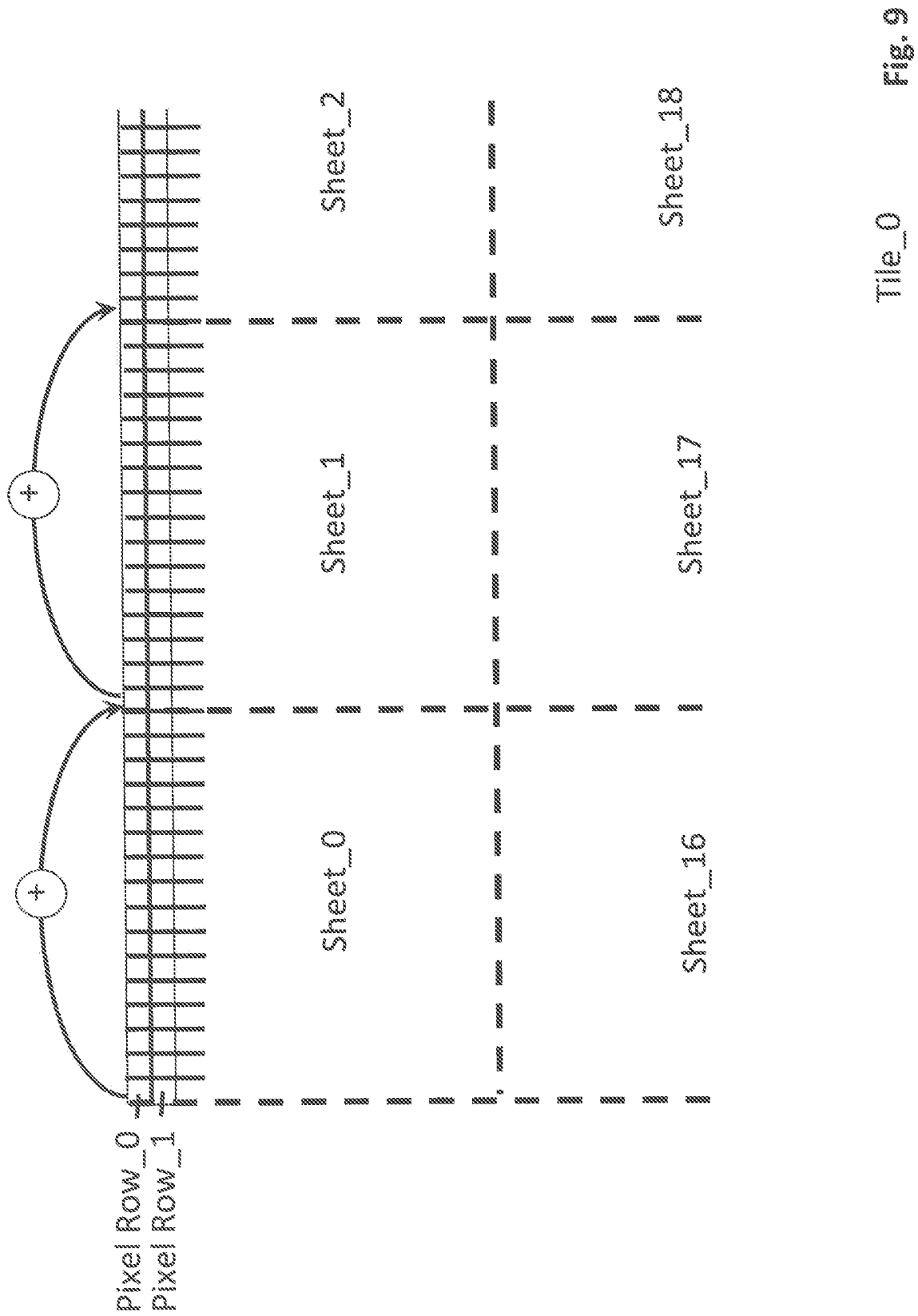
FIG. 9 depicts processing across sheet boundaries.

FIG. 9 shows one approach for summing pixel values within a tile. FIG. 9 depicts the sheet arrangement for the upper left hand corner of a tile. As observed in FIG. 9, same positioned pixel values within a sheet array are summed over multiple sheets. For example, the upper leftmost pixel value of Sheet_0 is added with the upper leftmost pixel value of Sheet_1. The resulting summation is then added to the upper leftmost pixel value of Sheet_2. The process continues until all sheets in the tile have been accounted for.

Recalling that the stencil processor processes data in units of sheets, the summation itself is performed on a sheet by sheet basis. As described above, in an embodiment, a stencil processor includes an execution lane and associated register space for each array location within a sheet. Initially, Sheet_0 is loaded into the stencil processor's two dimensional shift register structure and processed. A pixel value associated with each array location in the sheet is kept in the local register space of that array location within the two dimensional shift register. Then Sheet_1 is loaded into the stencil processor's two dimensional shift register structure and processed.

A pixel value associated with each array location in Sheet_1 is added to the pixel value for the same array location in Sheet_0. The resultant for each array location is kept in the local register space of that location in the two-dimensional shift register structure and the process continues. Thus, with each new sheet that the stencil processor processes, a summation across all sheets processed so far can be accumulated for all array locations within the sheet. In an alternate approach, the above process is performed except that the accumulated summation data is kept in a stencil processor's internal memory space rather than register space (e.g., referring to FIG. 3, the RAM 307 that is coupled to the memory execution units of the executional array 305 and/or the scalar memory 303 that is associated with the scalar processor 303). In another alternate embodiment, the accumulated summation data is kept in memory that is external to the stencil processor such as memory that is coupled to a line buffer unit 101.

Figure 10:
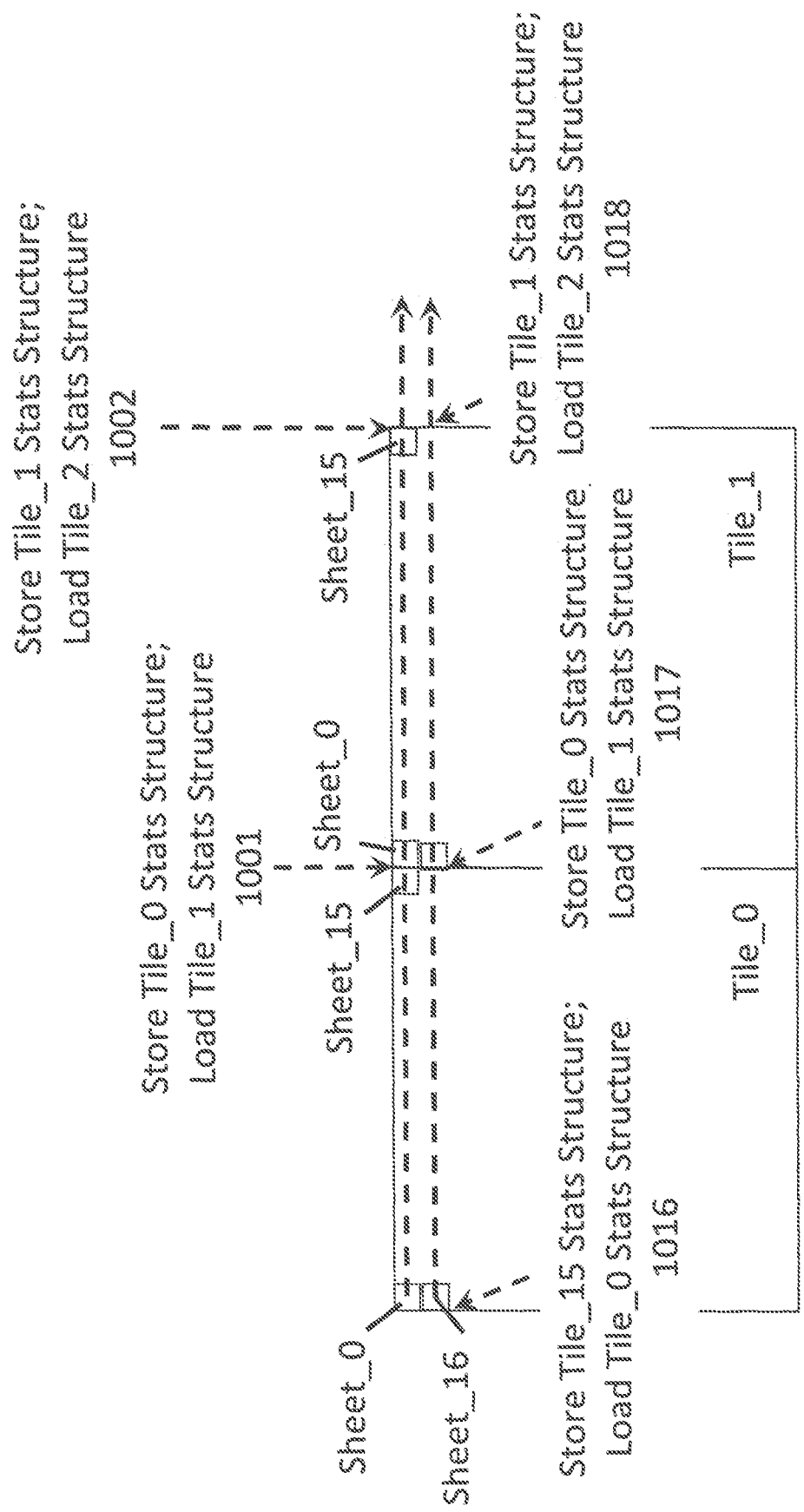
FIG. 10 depicts processing across sheet and tile boundaries with associated context switching.

Comparing FIGS. 8 and 9, note that Sheet_16 of tile 0 will not be processed until after Sheet_15 of tile 15 has been processed. That is, a same row of sheets are processed across tiles. Thus, if statistics are tracked on a tile by tile basis, statistics context needs to switch each time the processing progresses across tile boundaries. FIG. 10 graphically depicts the context switching process. Here, a data structure that keeps statistics for a particular tile is assumed to be created and resident in the register space or internal memory space of a stencil processor when the stencil processor is processing that particular tile.

For instance, while sheets 0 through 15 are being processed for Tile_0, a statistics data structure for Tile_0 is kept in the internal memory and/or two-dimensional register space of the stencil processor. After Sheet_15 is processed for Tile_0, at time 1001, the statistics data structure for Tile_0 is switched out of the stencil processor's two dimensional register space or internal memory space and the statistics data structure for Tile_1 is switched into the stencil processor's register space or internal memory space. Likewise, at time 1002, in between the processing of Sheet_15 of Tile_1 and Sheet_0 of Tile_2, the statistics data structure for Tile_1 is switched out of the stencil processor's register space or internal memory and the statistics data structure for Tile_2 switched into the stencil processor's register or memory space.

After Sheet_15 of Tile_15 is processed, at time 1016, the statistics data structure of Tile_15 is switched out of the register or internal memory space of the stencil processor and the statistics data structure for Tile_0 is switched back into the register or internal memory space of the stencil processor as the process begins processing of the second row of sheets within the image. Likewise, at time 1001, the statistics data structure for Tile_0 is switched out of the stencil processor's register space or internal memory space and the statistics data structure for Tile_1 is switched into the stencil processor's register space or internal memory space. Processing then continues in this fashion until all sheets of tiles 0 through 15 have been processed at which point the statistics data structures for each of tiles 0 through 15 are complete. The process then continues for the second row of sheets within the image.

FIG. 11 shows an exemplary depiction of the aforementioned statistics data structure that may be kept for a particular tile. Here, as discussed above, for example, the statistics data structure may keep a summation of all pixel values at a same pixel location within a sheet of the tile. A "complete" data structure is created for the tile when all sheets within the tile have been summed over. That is, a complete data structure includes a summation at the same sheet pixel location across all sheets within the tile. For illustrative ease, FIG. 11 only graphically depicts the summation at the four corner pixel locations of the sheet.

An additional statistical process is to reduce the entire accumulated array of FIG. 11 into a scalar value that, e.g., sums over all the pixel locations of the array of FIG. 11, which, in turn, corresponds to a summation of all of the pixel values within the entire tile. That is, with FIG. 11 being array of the summation of all pixel values within a tile at a same sheet pixel location, the summation across all elements in the array of FIG. 11 corresponds to the summation of all pixel values within a tile on a sheet pixel location by sheet pixel location basis. FIGS. 12a through 12e show the reduction of the entire array into a scalar. As will be evident from the discussion of FIGS. 12a through 12e, the reduction process makes particular use of the two dimensional shift register array that is a component of the stencil processor.

Here, the statistics array of FIG. 11 is assumed to be initially loaded into the two dimensional shift array of the stencil processor. FIG. 12a shows a first shift action of the shift register in which every other column of data is shifted into its left neighbor. Each shift depicted in FIG. 12a includes a pixel value being shifted and a pixel value in the location that the shifted pixel value is shifted into. These pair of pixel values are then added in the execution lane that is shifted into and kept in the register space of the same execution lane.

As such, after the completion of the shift of FIG. 12a and the following summation every other column of the array includes a summation of the neighboring pair of pixel values in the register space of each pixel location of the column. That is, e.g., column 1201 includes a summation of neighboring pixel values in every pixel location of column 1201, column 1202 includes a summation of neighboring pixel values in every pixel location of column 1202, etc. Note that all the shifts observed in FIG. 12a may occur in a single cycle, and, the summation may occur in an immediately following cycle. As such, the reduction can reduce the array by 50% in only two cycles (cycles C1 and C2).

Figure 12B:
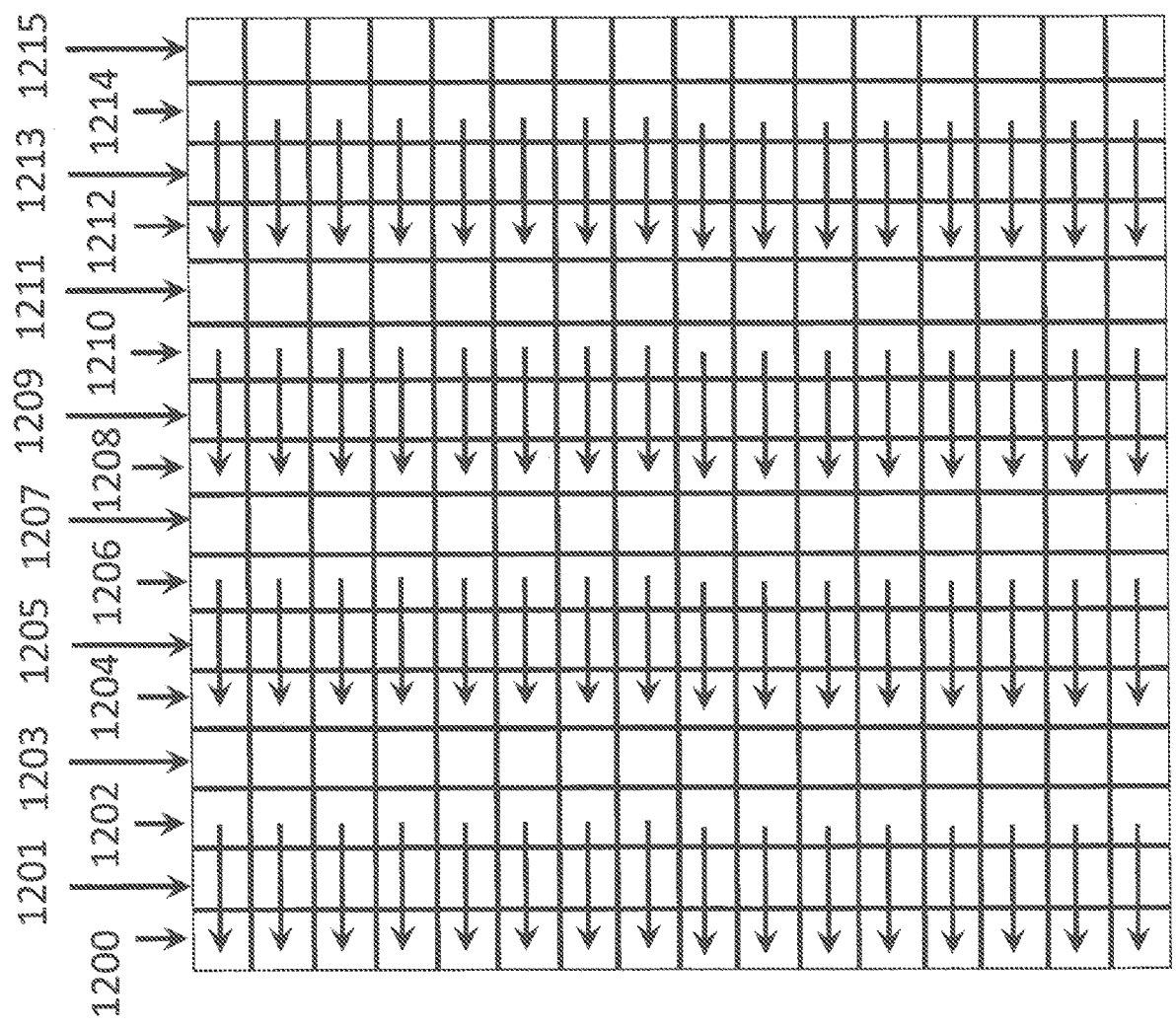

As observed in FIG. 12b, nearest neighbor columns having a summation from the operation of FIG. 12a are shifted and added. That is, after the operation of FIG. 12a, only columns 1200, 1202, 1204, 1206, 1208, 1210, 1212, and 1214 have summation content from the summation operation of FIG. 12a (the other columns may also have summation content but their content is not utilized, in an embodiment, the shift and summations operations that determine the unused content is not performed to save power). As such, pixel values of column 1202 are shifted to the left by two array locations into column 1200. Corresponding source to destination pairs also exist for columns 1206 to 1204, 1210 to 1208, and 1214 to 1212. As with the operation of FIG. 12, the pixel value pairs are added by the execution lane logic at the destination. As such, after the operation of FIG. 12b, summation values now exist in columns 1200, 1204, 1208, and 1212. Note that in an embodiment, the two dimensional shift register is able to perform "two location hop" shifts in a single cycle. Thus, all of the shifts observed n FIG. 12b can be performed in a single cycle (C3) and the summation operation can be performed in an immediately following cycle (C4). As such, after four cycles, the reduction operation can reduce the array of FIG. 11 by 75%.

Here, however, it is pertinent to point out that in various embodiments each execution lane has multiple registers. That is, referring briefly back to FIG. 6, each execution lane has multiple registers R1 through R5 for shifting data in/out and/or storing a resultant from an ALU operation. Additionally, many image processing algorithms have multiple "channels" of data. For example, an image composed of red (R), green (G), and blue (B) pixels may process a first channel composed of sheets/tiles/frames of R data separately from a second channel composed of sheets/tiles/frames of G data all of which are processed separately from a third channel of sheets/tiles/frames of B data.

Although the aforementioned example of FIGS. 12a and 12b indicated two cycles must be consumed to perform a shift and a summation, it is pertinent to recognize that this limitation only applies to operations within a same channel because of the summation's dependence on a prior shift. Importantly, in an embodiment, the execution lane array receives a VLIW type instruction word that can specify both a shift operation and an ALU operation within a single cycle. With this instruction format and multiple registers per array location, two different channels can be simultaneously reduced according to the core process of FIGS. 12a and 12b. That is, in a software pipelined loop like fashion, e.g., in a first cycle R is shifted and G is summed, and, in a second following cycle the just shifted R is summed and the resultant from the just summed G is shifted. In this fashion, the overall processor can perform a shift and summation reduction in, e.g., every cycle across two channels.

As observed in FIG. 12c, the reduction process continues but with (again) longer shifts. Here, pixel values of column 1204 are shifted into column 1200 and added in column 1200, and, pixel values of column 1212 are shifted into column 1208 and added in column 1208. As such, after the operation of FIG. 12c (which again may only consume the next two cycles (C5 and C6) assuming the two dimensional shift register supports, e.g., shifts of 4 unit locations), summation values only exist in columns 1200 and 1208. FIG. 12d shows complete reduction along the horizontal axis as the values in column 1208 are shifted into column 1200 and added within column 1200. Again, assuming the two dimensional shift register can perform the shift observed in FIG. 12d in a single cycle, the reduction of FIG. 12d is reached by the eight cycle C8 (in an embodiment, the shift register does not generally support shifts of the magnitude observed in FIG. 12d but does support, in a single cycle, a shift from column 1208 to column 1200).

FIG. 12e shows the subsequent reductions that are performed along column 1200 which ultimately reduce the entire array to a scalar summation value as of cycle C16. The reductions of FIG. 12e are essentially the same reductions of FIGS. 12a through 12d but in the vertical direction and only along one column. In an embodiment, as with the horizontal reductions of FIGS. 12a through 12d, each reduction sequence consumes one cycle for the shift register to perform its corresponding shift and another cycle is consumed adding a local value with a value that was just shifted into the same location.

The above discussion of the reduction process of FIGS. 12a through 12e was directed to an embodiment where, as shown in FIG. 11, a separate summation value was maintained for each pixel location in a sheet for all sheets within a tile. As discussed with respect to FIG. 10, however, before a "complete" statistics structure for a particular tile can be realized, all rows in the tile need to be processed. Because scanning across an image row will cross multiple tiles, data structures for the tiles are context switched in and out with each crossing of a tile boundary.

Each per tile statistics data structure therefore includes a summation value or "counter" for each pixel location within a sheet for the sheets that have so far been processed. Thus, the dimensions of the statistics data structure for a tile correspond to the dimensions of a sheet within the tile (e.g., 16×16 summation values). If multiple tiles exist within an image (as suggested by FIGS. 9 and 10), the amount of statistics data that is kept for an image can be large (i.e., (the number of tiles in the image)×(the number of counters per tile)). Here, reduction of a tile into a scalar as soon as a complete data structure exists for a tile can help ease the statistics tracking burden.

Alternatively, referring back to FIG. 10, the statistics array can be reduced to a scalar each time it is to be context switched out. For instance, the statistics array for tile_0 may be reduced to a scalar at time 1001 just before it is stored and again at time 1017 just before it is stored. Here, performing the reduction of FIGS. 12a through 12e before each context switch out may consume more processing (multiple scalar reductions are performed per tile rather than one scalar reduction per tile), but the data footprint size of the statistics being switched out is much smaller which makes it more likely the switched out statistics data can be kept internally within the stencil processor memory rather than being directed across the entire image processor to line buffer memory.

Other statistical processes may be less burdensome. For example, according to one statistics keeping mode referred to as "global", an entire frame/image is deemed to consume only a single tile. Therefore only one statistical data structure exists and context switching does not arise (i.e., no tile boundaries are crossed in the raster scan processing). The data structure is "complete" when all sheets within the image have been processed at which point a scalar for the entire image can be created by performing the reduction of FIGS. 12a though 12e discussed just above.

In another statistics tracking mode, depicted in FIG. 12f, statistics are kept for one or more "windows" 1251, 1252, 1253 within an image 1250 that may or may not overlap in various combinations. Sheets may be processed in a particular pattern (e.g., from left to right across the image before dropping down to process a next row). While processing within a particular window statistics are accumulated for each pixel location with the sheet dimensions consistent with the discussion of FIG. 9 above. Upon leaving a window the accumulation activity stops. The statistical accumulation restarts upon the raster scan eventually crossing back into the window.

For example, referring to FIG. 12f, statistics accumulations will stop for window 1251 as the raster scan follows path 1254 and crosses out of window 1251 but will recommence when the raster scan reaches path 1255 and crosses back into window 1251. Note that this behavior is followed for all windows which can result in statistics being concurrently accumulated for regions of overlapping windows. For example, referring to raster scan path 1256, statistics tracking will restart for window 1251 when point A is reached. Some time later statistics tracking will restart for window 1252 when point B is reached. A further time later statistics tracking will cease for window 1251 when point C is reached and then for window 1252 when point D is reached. Once accumulations have completed for a window after the raster scan has covered the entire surface area of a window, the data that was accumulated for the window (again, one accumulated value per pixel location within a sheet) may be reduced according to the process discussed above with respect to FIGS. 12a through 12e.

Recall from the discussion of FIG. 4 that random access memories 407 may be coupled to the execution lane array 405 and two dimensional shift register 406 to give the stencil processor a local system memory function. Here, multiple execution lanes within the execution lane array 405 may share a same random access memory unit. For example, referring to FIG. 4, a first subset of execution lanes may be coupled to random access memory 407_1, a second subset of execution lanes may be coupled to random access memory 407_2, etc. FIG. 4 shows one approach where execution lanes that reside along a same row are coupled to a same random access memory.

Figure 13:
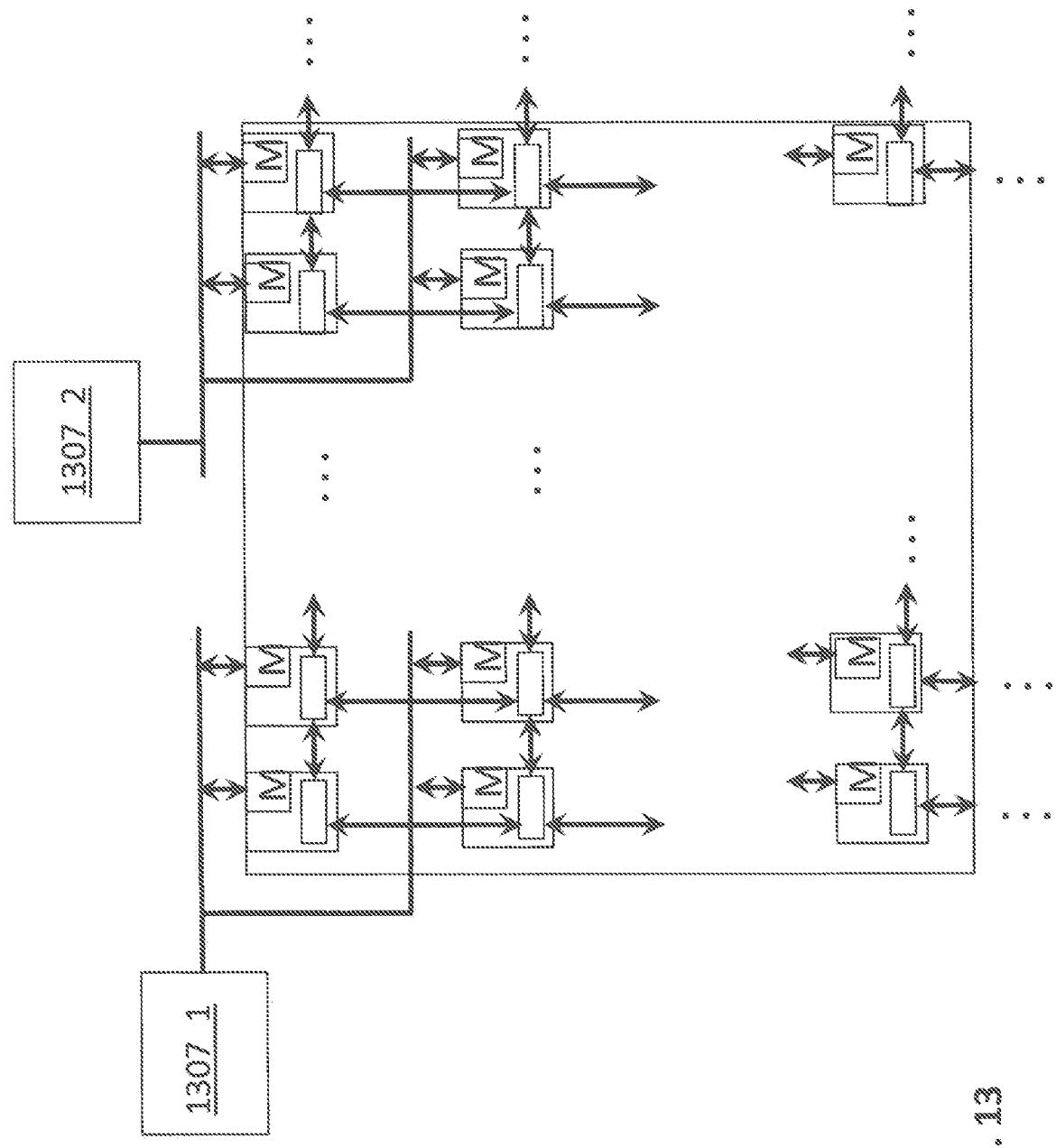
FIG. 13 shows random access memories of a stencil processor being allocated to groups of execution lanes.

FIG. 13 shows another approach where two dimensional blocks of execution lanes are coupled to a same random access memory. In the particular example of FIG. 13, blocks of four execution lanes are coupled to a same random access memory. Here, for instance, the upper leftmost block of four execution lanes are coupled to random access memory 1307_1, the upper rightmost block of four execution lanes are coupled to random access memory 1307_2, etc. Other separate blocks of four execution lanes are presumed to be coupled to their own respective random access memory but are not depicted for illustrative ease.

Figure 14:
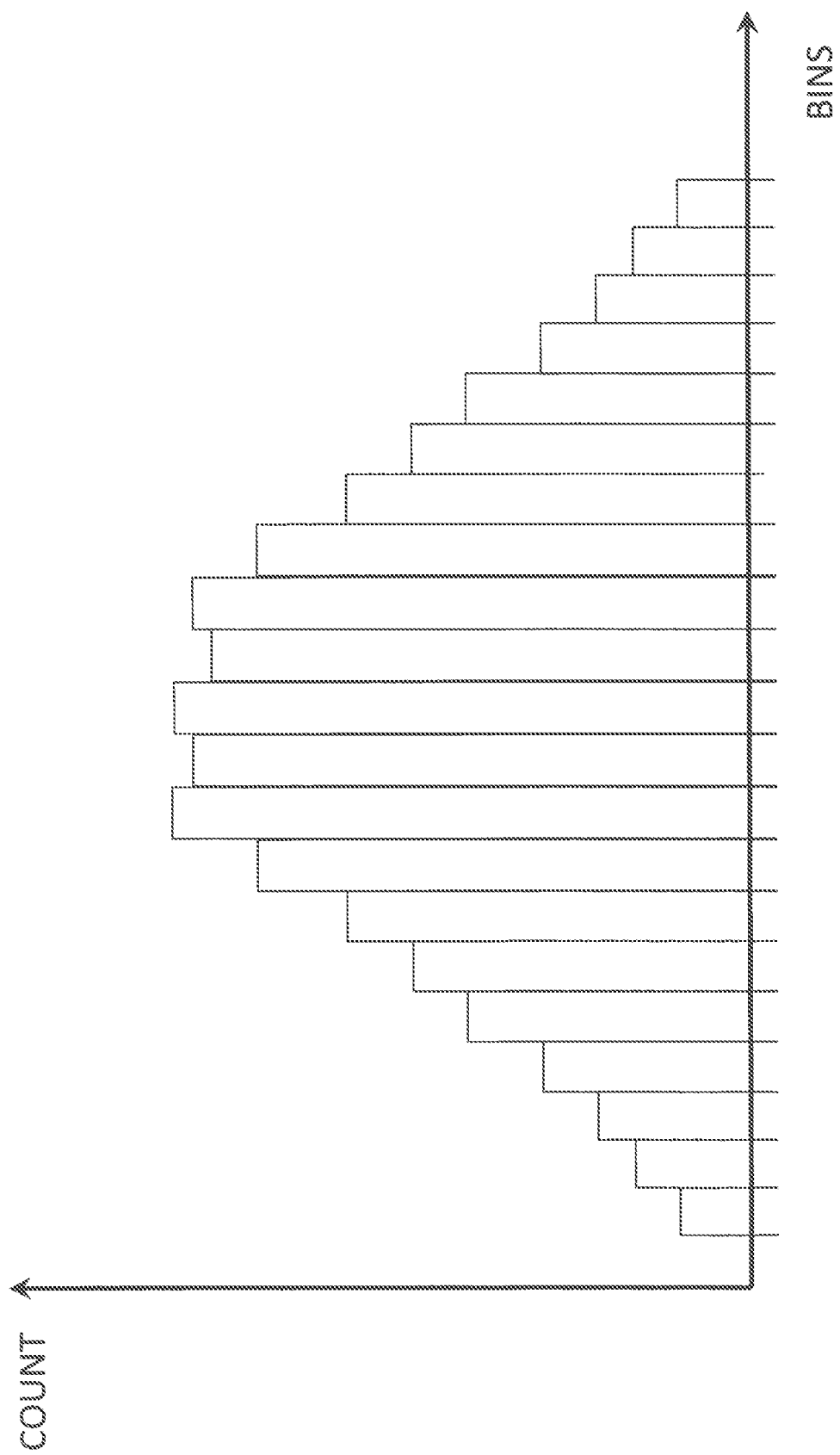
FIG. 14 shows a histogram.

Another common set of statistics that are kept for an image are a histogram. A histogram essentially divides a particular parameter into a number of bins. For example, an eight bit intensity value can be broken down into 256 separate bins (one bin for each unique eight bit value). The number of times a value is observed in the data of an image is kept track of each bin. As such, e.g., the number of times each unique eight bit value is observed is individually recorded with a count value for each bin. The spread of respective count values across the set of bins corresponds to a histogram. FIG. 14 shows an exemplary depiction of a histogram showing a separate count (along the vertical axis) for each of multiple bins (along the horizontal axis).

Figure 15A:
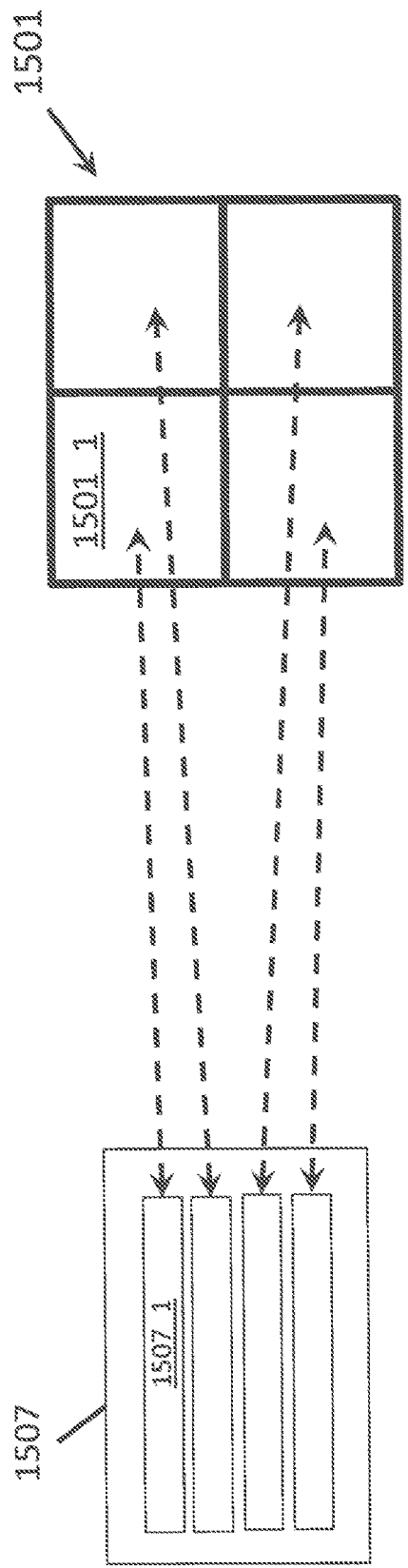
FIG. 15a shows a per execution lane allocation of memory space.
Figure 15B:
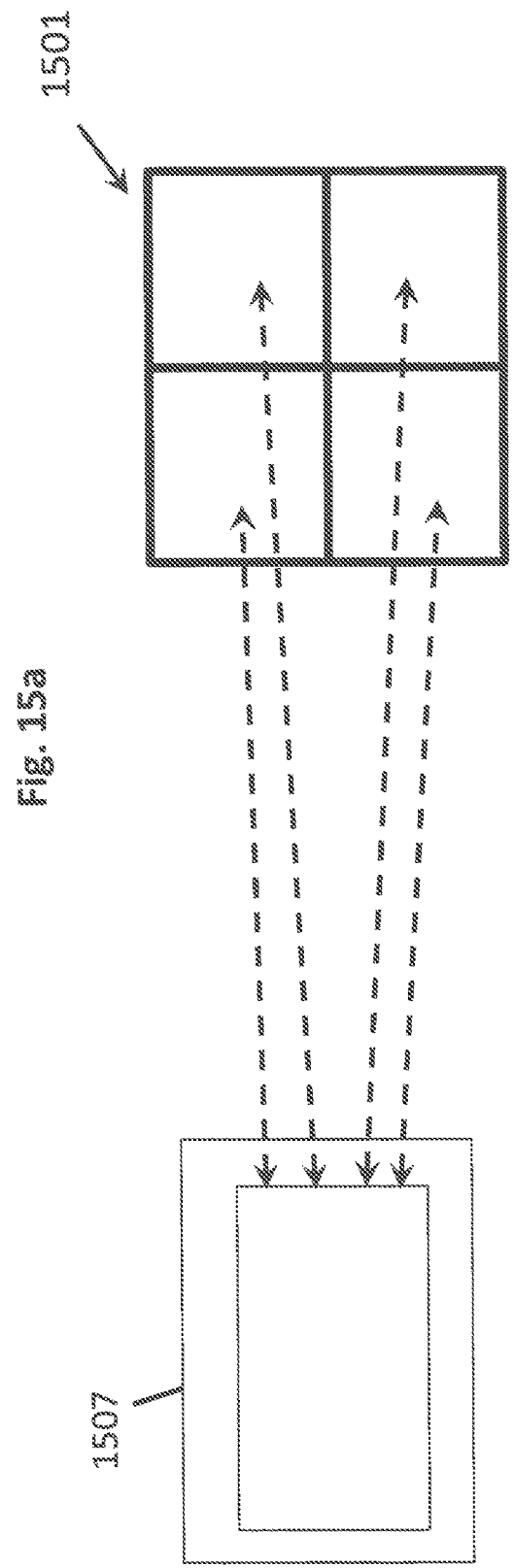
FIG. 15b shows a merged per executional lane allocation of memory space.

FIGS. 15a and 15b pertain to a technique for extending the capabilities of the stencil processor of FIGS. 4 and 13 to generate high resolution histograms. That is, a histogram with a large number of bins. FIG. 15a shows an embodiment of a nominal design point of the stencil processor of FIGS. 4 and 13 in which each execution lane within a group of execution lanes that share a same random access memory is provided its own private memory space within the random access memory. Here, referring to FIG. 15a, the set of four execution lanes 1501 are each coupled to random access memory 1507. However, each execution lane is nominally design to only access its own private space within random access memory 1507. As drawn in FIG. 15, for example, execution lane 1501_1 is designed to only access addressable region 1507_1 within random access memory 1507.

Other partitions of random access memory 1507 are observed being allocated for the other execution lanes within the group 1501.

A problem with the per execution lane memory partitioning of FIG. 15a is that the partitions effectively limit the number of histogram bins that the execution lanes can bin observed data to. That is, because each partition corresponds to a limited amount of memory space, each execution lane can only bin data items across a total number of bins that can be established within a single partition. This may have the undesirable effect of limiting the resolution of the histograms that the execution lanes can bin to (note also that in various embodiments only one of the execution lanes in a group may access the memory in a given cycle).

As such, FIG. 15b shows a better approach in which, at least during a histogram mode, the partitions within a random access memory are effectively merged so that each execution lane that shares the random memory can freely access the total amount of merged space. Merging the partitions and permitting each of the execution lanes that share the random access memory to freely access the total amount of merged space effectively provides for a wider data field that accommodate more bins. With more bins being accommodated for, higher resolution histograms can result. As such, for example, if a single partition of the approach of FIG. 15a can only hold count values for 256 bins, the merged space of FIG. 15b can hold count values for 1024 bins. Thus, the execution lanes of the approach of FIG. 15a can only generate histograms having 256 bins while the same execution lanes in the approach of FIG. 15b can generate histograms having 1024 bins. Other embodiments can have other numbers of bins.

FIGS. 16 and 17a through 17c pertain to an approach in which a histogram can be determined across an entire image by first having the execution lanes bin observed data to their local memories and then using the two-dimensional shift register structure and ALU capabilities of the execution lanes to tabulate respective counts over the bins.

Figure 16:
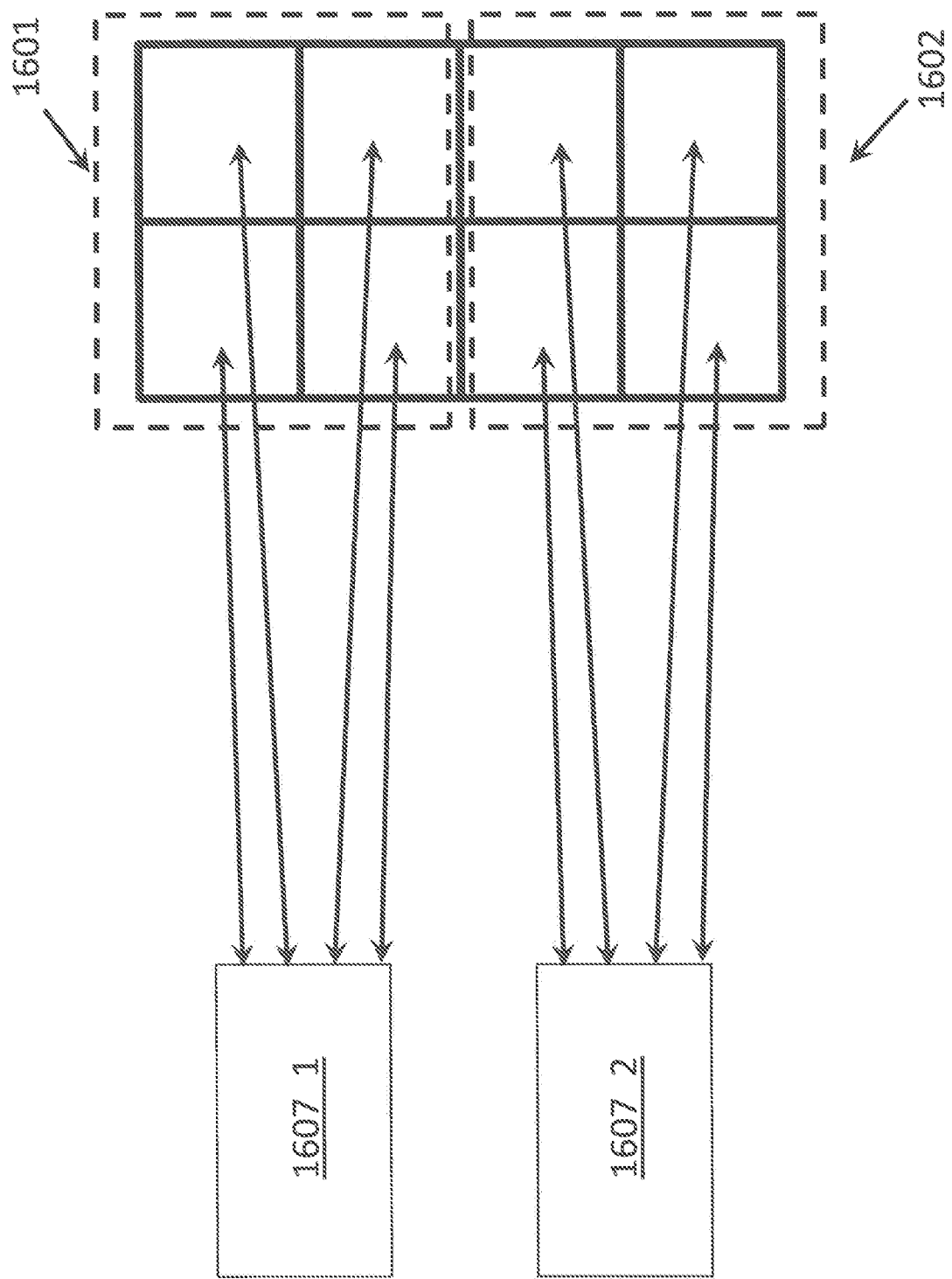
FIG. 16 shows first and second groups of execution lanes being allocated to first and second merged memory space regions.

FIG. 16 shows a high level depiction in which neighboring execution lanes are grouped into neighboring blocks of four where each group is given access to a respective random access memory, where, the space of each random access memory is merged so that each execution lane within a same group can access the same merged memory space as described just above with respect to the description of FIGS. 15a and 15b. For simplicity only two blocks of groups execution lanes 1601, 1602 are depicted along with their corresponding respective merged memory space 1607_1, 1607_2.

To generate a histogram, a series of sheets for an image are loaded into the two-dimensional shift register. The bins of the histogram are allocated in the merged memory space for each execution lane group and the individual execution lanes increment a respective count value maintained for each bin within the merged memory space for the particular value that each execution lane observes. For example, if execution lanes 1, 2, 3, and 4 within a same group respectively observe values corresponding to bins 4, 9, 12, and 21, then, execution lane will update the count value for bin 4, execution lane 2 will update the count value for bin 9, execution lane 3 will update the count value for bin 12, and execution lane 4 will update the count value for bin 21. In various embodiments, because only one execution lane can access the memory that a group of execution lanes share, the execution lanes will perform their aforementioned updates in consecutive cycles.

After a number of sheets have been processed for the image, the merged memory space of each of the random access memories essentially contains a histogram for its constituent execution lanes. For example, referring to FIG. 16, the merged memory space within random access memory 1607_1 contains the histogram data for execution lanes within group 1601 and the merged memory space within random access memory 1607_2 contains the histogram data for the execution lanes within group 1602.

A next operation then is to merge the content of each random access memory so that a histogram for all execution lanes can be realized. FIG. 17a pertains to a simplistic example, in which the histogram only contains 32 bins (bins 0 to 31). Here, for each group of execution lanes and their corresponding merged memory space, the count values for bins 0 to 7 are loaded into the register space of the upper left execution lane, the count values for bins 8 to 15 are loaded into the register space of the upper right execution lane, the count values for bins 16 to 23 are loaded into the register space for the lower right execution lane, and the count values for bins 24 to 31 are loaded into the register space for the lower left execution lane. FIG. 17a shows the content of the respective register space of the execution lanes for groups 1701 and 1702. Again, only two groups are shown for illustrative ease and in various embodiments the content pattern for groups 1701 are 1702 are repeated across all groups within the execution lane array. In embodiments, the loaded register content takes the form of a vector data structure that maintains respective count value for different bit positions in the data structure where the different bit positions correspond to the different bins being maintained by the data structure.

Figure 17B:
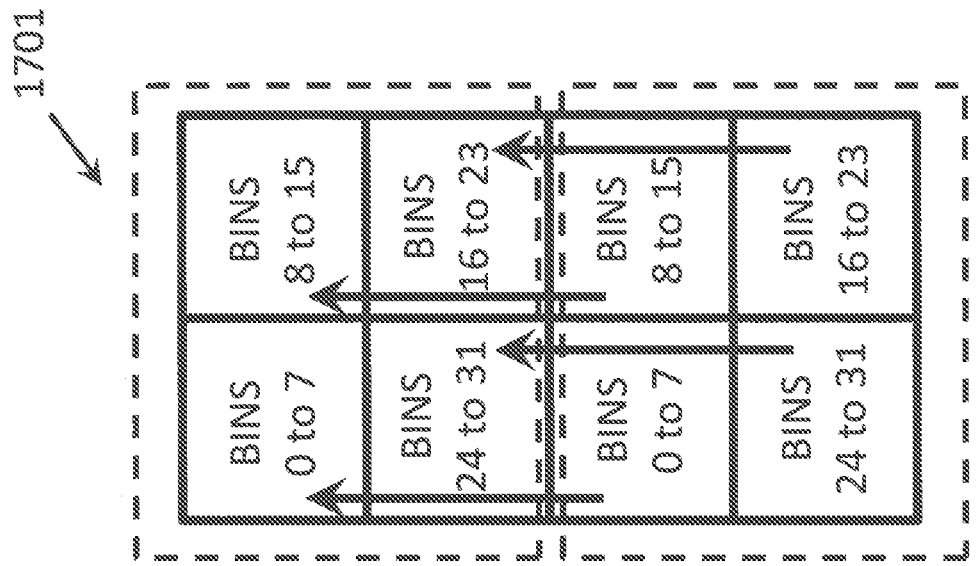
FIGS. 17a through 17c show a histogram reduction process.
Figure 17A:
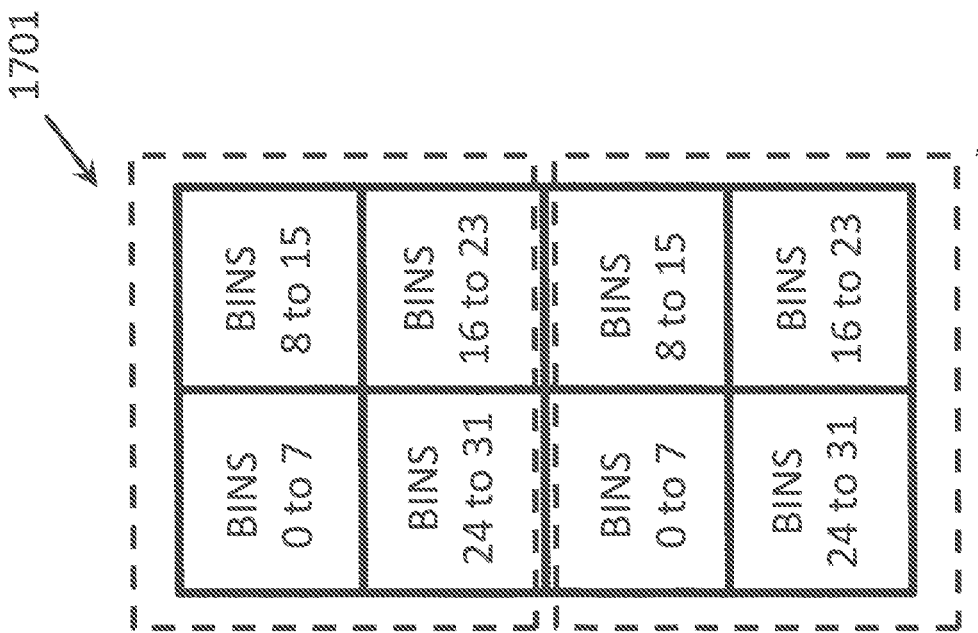

FIG. 17b shows a first reduction sequence in which the histogram content of execution lanes from a first group is shifted into the register space of same relative positioned execution lanes from a second group. That is, e.g., the upper left execution lane of the second group 1702 has its register content shifted into the register space of the upper left execution lane of the first group 1701 to consolidate the histogram data for bins 0 through 7 collected across both groups 1701, 1702 into the register space of the upper left execution lane of group 1701. A corresponding operation is performed for the other three execution lane positions. Note that the shift can occur in a single cycle assuming the two dimensional shift register can shift data structures of appropriate size across two array lane locations in a single cycle. If the bin content for 8 bins consumes more data than can be shifted in a single cycle, then multiple cycles may be used.

Regardless, after the bin content for the second group 1702 has been shifted into the register space of the first group 1701, the execution lanes perform a vector add of their respective pairs of bin data to accumulate total count values for their respective bins. That is, e.g., after the vector add operation, the upper execution lane of group 1701 will contain a data structure that has the total count for each of bins 0 through 7 that was tabulated by both groups 1701 and 1702. A corresponding accumulation of count values will also exist in the register space of the other three execution lanes of group 1701. Again, like the shift operation, the vector summation can also be performed in a single cycle in various embodiments. Again, although FIGS. 17a and 17b only show two groups, in various embodiments the operations of FIGS. 17a and 17 are simultaneously performed for all pairs of groups in the execution lane array.

Figure 17C:
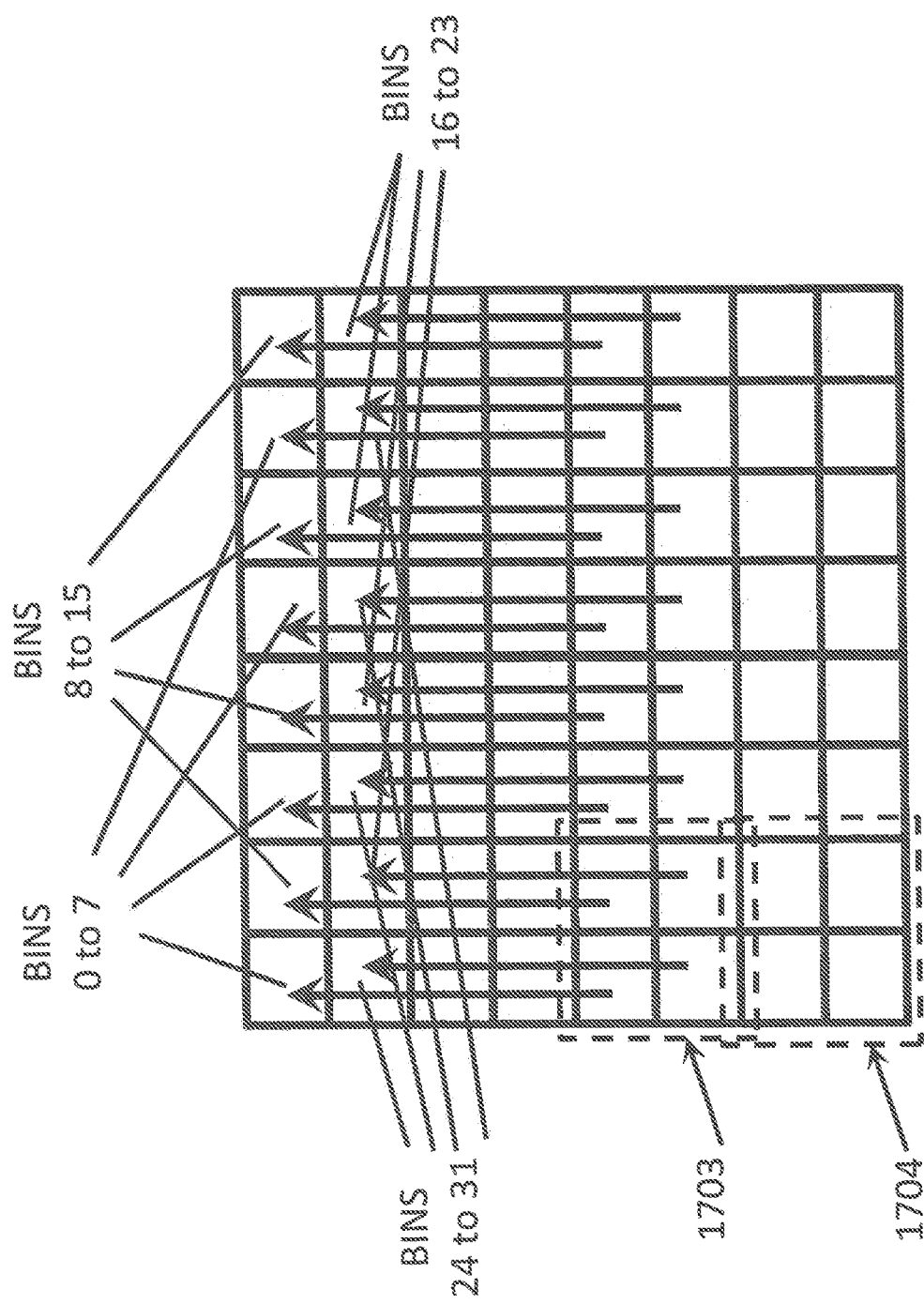

FIG. 17c shows a next iteration in which the accumulated counts that were just tabulated (e.g., as of FIG. 17b) are again consolidated according to a similar process (except that the shift length is longer). For instance, referring briefly back to FIG. 17b, one can envision another pair of groups 1703, 1704 of four execution lanes each that physically reside directly beneath group 1702 in the array. FIG. 17c shows both of these groups 1703, 1704. After the operation of FIG. 17b is completed, the content of groups 1703 and 1704 will be accumulated in group 1703. As such, the operation of FIG. 17c shifts the accumulated content of group 1703 being shifted into the register space of group 1701. After the vector add operation of FIG. 17c, group 1701 will contain accumulated counts for all bins as originally tabulated by each of groups 1701 through 1704. In the simplistic 8×8 execution lane array of FIG. 17c, all values will have been accumulated into the top row of groups after the vector add operations of FIG. 17c.

From here, a horizontal reduction amongst the top row of groups can commence similar to the vertical reductions of FIG. 12e (with each different execution lane location within a group continuing to maintain its own set of bins). Eventually the process will consolidate to a single group where each array location in the group has the total count across the image for its corresponding bins.

In various embodiments, histograms are keep track of at tile granularity. As such, context switching of histogram data similar to the context switching discussed above with respect to FIG. 10 can be performed during accumulation of the histogram. Here, for instance, the aforementioned merged data structures within the processor's random access memories are configured to store histogram data only for a specific tile. When the raster scanned processing of image data causes tile boundaries to be crossed over, the histogram data structure for the tile that processing just departed from is switched out (e.g., by being written out of the stencil processor memories into, e.g., a line buffer) and histogram data structures for the tile that processing just entered is switched in (e.g., be being written into the stencil processing memories). After the raster scanning fully processes a complete tile, the reductions of FIGS. 17a through 17c and thereafter can be performed to determine a complete histogram for the entire tile.

Note that, conceivably, lower resolution histograms may not require merged storage space in the random access memories of the stencil processor. Here, for instance, the dedicated per execution lane memory space of FIG. 15a may be sufficient to hold all the bins for a lower resolution histogram. As such, merging of the per execution lane memory spaces may not be necessary (and therefore may only be entertained for high resolution histograms). Further still, some histograms may be of sufficiently low resolution that the bin count values may be kept in the respective register space of the execution lanes (here, the register file may be dynamically indexed with a pixel value such that each execution lane could access a different register). In this case use of the random access memories is not necessary. For lower resolution histograms, such as those that do not require merging of per execution lane dedicated memory or register space, bin totals may be accumulated using the processes of FIGS. 12a through 12e rather than FIGS. 17a through 17c.

Similarly, with respect to context switching, it is conceivable that only high resolution histogram data structures will need to be switched out of the stencil processor memory or register space (e.g., into a line buffer). Here, lower resolution histograms may be able to keep "switched out" histogram data context in the local memories and/or register space of the stencil processor.

Figure 18B:
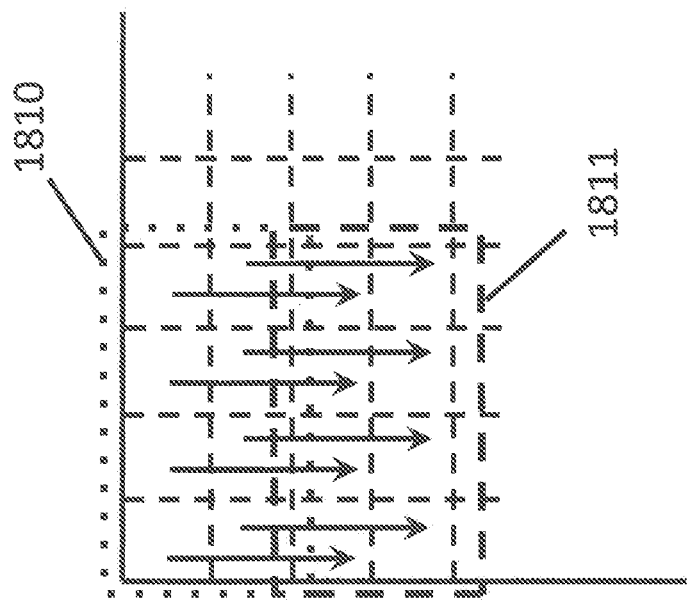
FIGS. 18a and 18b show a mechanism for expanding the size of a historgram.
Figure 18A:
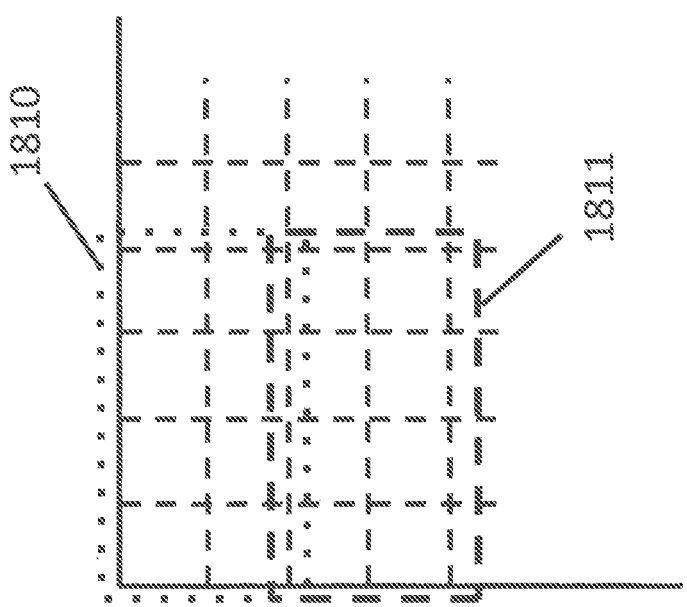

FIGS. 16 and 17a-17c described a mechanism for a group of execution lanes to collectively share the memory resources that they are coupled to in order to allow for histograms with a larger number of bins. By contrast, FIGS. 18a and 18b describe a mechanism by which the bin count of a histogram can be extended across execution lanes of different groups. FIG. 18a shows, e.g., the upper left hand corner of the execution lane array. Here a first 4×2 group 1810 of execution lanes and a second 4×2 group of execution lanes 1811 are observed. Both groups 1810, 1811 may share memory resources to expand bin size as described above with respect to FIGS. 16 and 17a-c.

Here, if each of groups 1810, 1811 are able to individually support 1024 different histogram bins, both of groups 1810, 1811 could also be logically combined to support 2048 bins. Thus, histogram size in terms of number of bins can be expanded by combining groups of execution lanes. According to one approach referred to as "spatial", the different execution lane groups within a same logical combination are responsible for binning into different bin ranges. For example, the execution lanes within group 1810 are responsible for binning into bins 0 through 1023 and the execution lanes within group 1811 are responsible for binning into bins 1024 through 2047. Thus, in order to fully process input pixel data so that it is guaranteed to be placed into the particular correct bin that it should be placed into, data is shifted as observed in FIG. 18b. That is, e.g., data that is to be binned is first loaded into the execution lanes of the first group 1810 and if any the data items fall within bins 0-1023 they are binned by their respective execution lanes in group 1810. After the initial binning processing, the data that was loaded into the first group is shifted into the second group 1811 as observed in FIG. 18b. Any remaining items of data that were not binned by the first group because they fell with bin ranges 1024-2047 will be binned by respective execution lanes within group 1811.

Thus, in this example, data is initially loaded into every lane of every group in the execution lane array and the entire array performs processing on the data with shifts in between binning processes. For instance, data is initially loaded into both of groups 1810 and 1811. After the data is loaded, group 1810 bins those data values that were loaded into group 1810 that fall into bins 0-1023 and group 1811 bins those data values that were loaded into group 1811 that fall into bins 1024-2047. After this initially binning sequence, the data that was originally loaded into group 1810 is shifted into group 1811 and the data that was originally loaded into group 1811 is shifted into another group (such as the group directly beneath group 1811) that bins into bins 0-1023). For simplicity FIG. 18b does not show the shifting of the data that was originally loaded into group 1811. Note that bin sizes can even be further extended by combining more than two groups. For instance, the 4×2 group of execution lanes directly beneath group 1811 can be used to bin into bin range 2048-3072.

In another alternative binning expansion approach referred to as temporal, rather than combine physical groups of execution lanes and use the two-dimensional shift register to shift between combined groups, instead, groups of execution lanes are not combined. Rather, the binning ranges are context switched in and out of the execution lanes. In this case, e.g., data is initially loaded into all execution lane groups. During a first iteration each group bins according to a first bin range (e.g., bins 0-1023). After binning into the first range is complete, the data is not shifted within the register array, but binning context information that determines which binning ranges apply are switched (e.g., context for binning into ranges 0-1023 are switched out of the execution lane groups and context for binning into ranges 1024-2047 are switched into the execution lane groups). The execution lanes then re-execute a binning process for the new, higher range. The process continues until after the final binning range context is switched in an binned to.

In various embodiments the image processor has configuration register space to establish any of the operating modes described above (e.g., context switching out of the stencil processor, merging of execution lane register space, global statistics tracking, per tile statistics tracking, window statistics tracking, etc.). The statistics operations described above can be codified in program code (e.g., object code executed by a stencil processor) and stored on a machine readable storage medium.

Although various embodiments above have applied processes to rows in certain situations and columns in certain other situations, it should be readily apparent that processes performed on rows can instead be performed on columns and vice-versa.

FIG. 19 shows an integrated camera 1901, ISP/IPU, and processor 1902. The camera 1901 may include a lens assembly 1907 and image sensor 1906. Raw image data from the camera 1901 may be passed from the camera 1901 to an ISP subsystem that includes an image signal processor (ISP) and/or image processing unit (IPU) 1904 and a camera statistics unit 1905. In various embodiments, the camera statistics unit 1905 is a hardware component that calculates statistics from the raw image data that is generated by the camera 1901 with dedicated logic circuitry. In still yet other embodiments, the camera statistics unit 1905 is a software component and camera statistics are executed on IPU hardware 1904 which is capable of executing program code (here, image signal processing (ISP) hardware is traditionally not capable of executing program code). Here, such an IPU may configured to perform traditional ISP related tasks in software and therefore no traditional ISP is actually resident in the platform (i.e., all stats and image signal processing functions are performed in software by an IPU). In still other approaches, the ISP/IPU sub-system may be implemented as a combination of dedicated hardware statistics circuits, software executed on an IPU, and/or ISP hardware circuitry. Regardless, in implementations where IPU hardware 1904 at least partially executes statistics software (or where ISP/IPU hardware 1904 acts as a co-processor or accelerator that receives more coarse grained statistics related commands from a hardware statistics engine 1905 rather than execute fine grained program code), the ISP/IPU 1904 may contain a two-dimensional shift register array structure and perform reductions and/or generate histograms consistently with any of the discussions and teachings provided at length above. In such embodiments, the ISP/IPU 1904 may be designed to include any/all of the IPU features described at length above in preceding sections.

Various hardware circuitry components of the ISP/IPU sub-system, may be integrated on a large system-on-chip that also includes the processor 1902 and other electrical functions (e.g., a graphics processing unit (GPU)). Although in many embodiments the processor 1902 may be a processing core of a computing system (such as a handheld device). In other embodiments, the processor 1902 may be more tightly coupled to, or even be a component of, the camera 1901.

The camera statistics engine 1905 calculates statistics from the pixel data generated by the camera 1901. The statistics that are generated by the statistics engine 1905 may then be employed for higher order processes. For example, the statistics are forwarded to the processor 1902 which performs higher level camera control functions using the statistics, such higher level functions including auto-focusing, auto-exposing, and/or auto white balancing. The camera control function may be implemented, e.g., as software 1903 that executes on the processor 1902 (such as 3A camera control software associated with an Android operating system). Other types of statistics data for uses other than camera control may also be forwarded to the processor 1902 or elsewhere for other processes (e.g., statistics information for computer vision software or hardware).

FIG. 20 shows a methodology described by the preceding discussions. As observed in FIG. 20, the method includes loading an array of content into a two-dimensional shift register 2001, where, the two-dimensional shift register is coupled to an execution lane array. The method further includes repeatedly performing a first sequence 2002 that comprises: shifting with the shift register first content residing along a particular row or column into another parallel row or column where second content resides, and performing mathematical operations with a particular corresponding row or column of the execution lane array on the first and second content. The method further includes repeatedly performing a second sequence 2003 that comprises shifting with the shift register content from a set of first locations along a resultant row or column that is parallel with the rows or columns of the first sequence into a corresponding set of second locations along the resultant row or column. The resultant row or column have values determined at least in part from the mathematical operations of the first sequence. The second sequence further includes performing mathematical operations on items of content from the set of first locations and respective items of content from the set of second locations with the execution lane array.

d. Implementation Embodiments

It is pertinent to point out that the various image processor architecture features described above are not necessarily limited to image processing in the traditional sense and therefore may be applied to other applications that may (or may not) cause the image processor to be re-characterized. For example, if any of the various image processor architecture features described above were to be used in the creation and/or generation and/or rendering of animation as opposed to the processing of actual camera images, the image processor may be characterized as a graphics processing unit. Additionally, the image processor architectural features described above may be applied to other technical applications such as video processing, vision processing, image recognition and/or machine learning. Applied in this manner, the image processor may be integrated with (e.g., as a co-processor to) a more general purpose processor (e.g., that is or is part of a CPU of computing system), or, may be a stand alone processor within a computing system.

The hardware design embodiments discussed above may be embodied within a semiconductor chip and/or as a description of a circuit design for eventual targeting toward a semiconductor manufacturing process. In the case of the later, such circuit descriptions may take of the form of a (e.g., VHDL or Verilog) register transfer level (RTL) circuit description, a gate level circuit description, a transistor level circuit description or mask description or various combinations thereof. Circuit descriptions are typically embodied on a computer readable storage medium (such as a CD-ROM or other type of storage technology).

From the preceding sections is pertinent to recognize that an image processor as described above may be embodied in hardware on a computer system (e.g., as part of a handheld device's System on Chip (SOC) that processes data from the handheld device's camera). In cases where the image processor is embodied as a hardware circuit, note that the image data that is processed by the image processor may be received directly from a camera. Here, the image processor may be part of a discrete camera, or, part of a computing system having an integrated camera. In the case of the later the image data may be received directly from the camera or from the computing system's system memory (e.g., the camera sends its image data to system memory rather than the image processor). Note also that many of the features described in the preceding sections may be applicable to a graphics processor unit (which renders animation).

Figure 21:
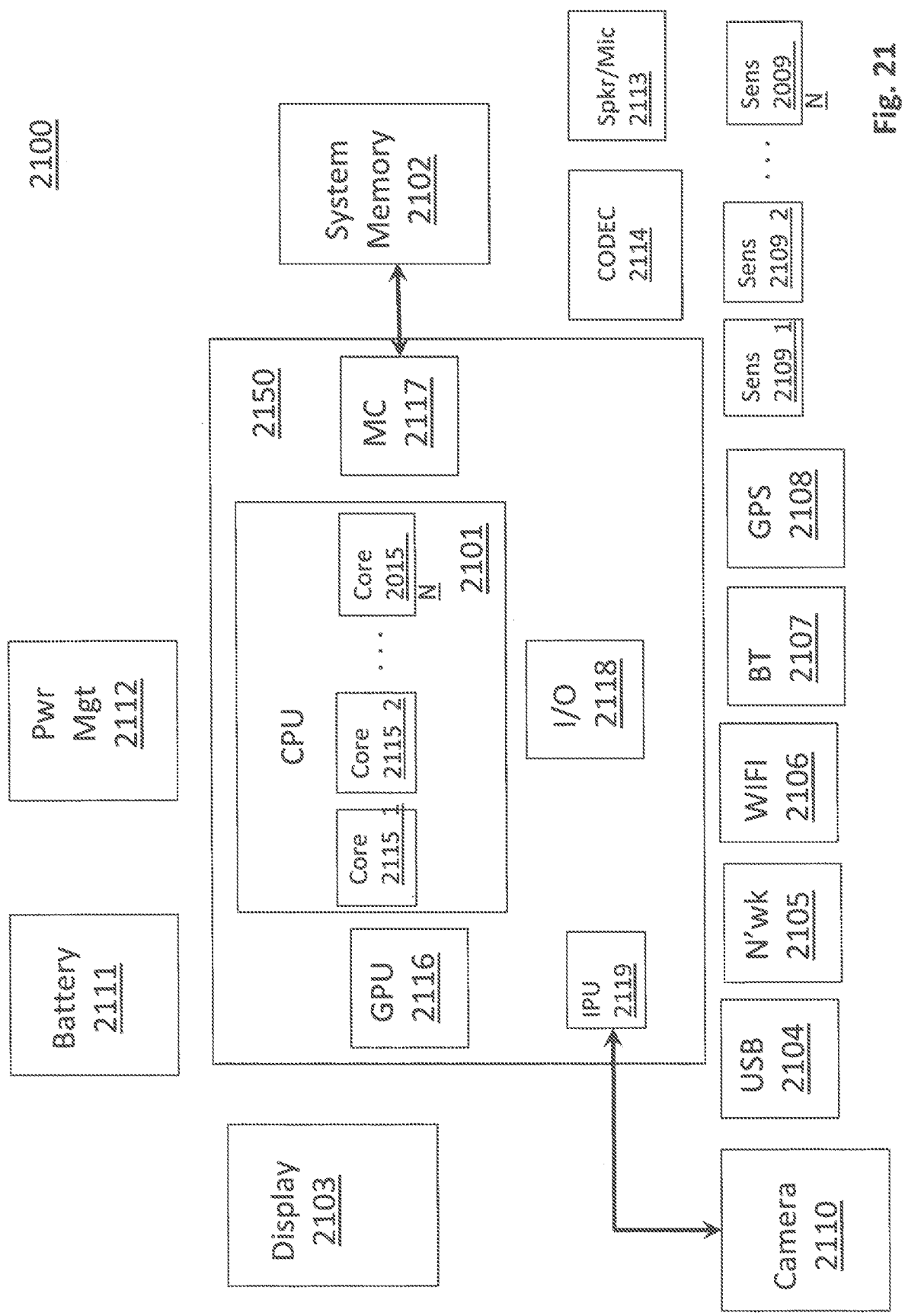
FIG. 21 shows a computing system.

FIG. 21 provides an exemplary depiction of a computing system. Many of the components of the computing system described below are applicable to a computing system having an integrated camera and associated image processor (e.g., a handheld device such as a smartphone or tablet computer). Those of ordinary skill will be able to easily delineate between the two.

As observed in FIG. 21, the basic computing system may include a central processing unit 2101 (which may include, e.g., a plurality of general purpose processing cores 2115_1 through 2015_N and a main memory controller 2117 disposed on a multi-core processor or applications processor), system memory 2102, a display 2103 (e.g., touchscreen, flat-panel), a local wired point-to-point link (e.g., USB) interface 2104, various network I/O functions 2105 (such as an Ethernet interface and/or cellular modem subsystem), a wireless local area network (e.g., WiFi) interface 2106, a wireless point-to-point link (e.g., Bluetooth) interface 2107 and a Global Positioning System interface 2108, various sensors 2109_1 through 2109_N, one or more cameras 2110, a battery 2111, a power management control unit 2112, a speaker and microphone 2113 and an audio coder/decoder 2114.

An applications processor or multi-core processor 2150 may include one or more general purpose processing cores 2115 within its CPU 2101, one or more graphical processing units 2116, a memory management function 2117 (e.g., a memory controller), an I/O control function 2118 and an image processing unit 2119. The general purpose processing cores 2115 typically execute the operating system and application software of the computing system. The graphics processing units 2116 typically execute graphics intensive functions to, e.g., generate graphics information that is presented on the display 2103. The memory control function 2117 interfaces with the system memory 2102 to write/read data to/from system memory 2102. The power management control unit 2112 generally controls the power consumption of the system 2100.

The image processing unit 2119 may be implemented according to any of the image processing unit embodiments described at length above in the preceding sections. Alternatively or in combination, the IPU 2119 may be coupled to either or both of the GPU 2116 and CPU 2101 as a co-processor thereof. Additionally, in various embodiments, the GPU 2116 may be implemented with any of the image processor features described at length above.

Each of the touchscreen display 2103, the communication interfaces 2104-2107, the GPS interface 2108, the sensors 2109, the camera 2110, and the speaker/microphone codec 2113, 2114 all can be viewed as various forms of I/O (input and/or output) relative to the overall computing system including, where appropriate, an integrated peripheral device as well (e.g., the one or more cameras 2110). Depending on implementation, various ones of these I/O components may be integrated on the applications processor/multi-core processor 2150 or may be located off the die or outside the package of the applications processor/multi-core processor 2150.

In an embodiment one or more cameras 2110 includes a depth camera capable of measuring depth between the camera and an object in its field of view. Application software, operating system software, device driver software and/or firmware executing on a general purpose CPU core (or other functional block having an instruction execution pipeline to execute program code) of an applications processor or other processor may perform any of the functions described above.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, elements may be downloaded as a computer program transferred from a remote computer (e.g., a server) to a requesting computer (e.g., a client) by way of data signals embodied in a carrier wave or other propagation medium via a communication link (e.g., a modem or network connection).

In the foregoing specification, specific example embodiments have been described. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. A method performed by a processor comprising:
a two-dimensional shift-register array comprising multiple shift-register planes,
a two-dimensional array of processing elements, wherein each shift register of the shift register array is dedicated to a respective one of the processing elements, and wherein each processing element is configured to read from and write to a respective shift-register dedicated to the processing element, and
random access memory coupled to the two-dimensional array of processing elements,
wherein the method determines an accumulated value for each tile in a row of tiles, wherein each tile in the row of tiles comprises a plurality of rows of sheets, wherein each row of sheets spans all of the tiles in the row of tiles, by processing each row of sheets across the row of tiles before processing a next row of sheets across the row of tiles, the method comprising:
iterating over each row of sheets in the row of tiles to compute, over a respective plurality of sheets belonging to each tile in the row of tiles, a respective representative sheet having a plurality of representative summation values that are each a respective summation of pixel values in each of the plurality of sheets of the tile that each have a same relative sheet position within the representative sheet, including:

loading a next sheet in the row of sheets into a first plane of the two-dimensional shift-register array, determining whether the next sheet is a first sheet to be processed after a tile boundary between a previous tile and a next tile, whenever the next sheet is the first sheet to be processed after the tile boundary between the previous tile and the next tile, (i) moving a first representative sheet for the previous tile from a second plane of the two-dimensional shift register array to a respective first location in the random access memory dedicated to the previous tile, and (ii) loading a second representative sheet for the next tile from a respective second location in the random access memory dedicated to the next tile to the second shift-register plane of the two-dimensional shift-register array, and updating a respective representative sheet for a respective tile to which the next sheet belongs including computing, by each processing element of the two-dimensional array of processing elements in parallel, a sum of respective values having corresponding sheet locations in the next sheet and in the representative sheet stored respectively in the first plane and the second plane of the two-dimensional shift-register array, updating, by each processing element of the two-dimensional array of processing elements in parallel, the representative sheet in the second plane of the two-dimensional array using the sums of the respective values having corresponding sheet locations, and loading a next sheet in a respective next row of sheets into the first plane of the two-dimensional shift-register array;

after processing all sheets belonging to a first tile of the row of tiles, loading, into the two-dimensional shift-register array, a representative sheet for the first tile of the row of tiles;

performing, by the two-dimensional array of processing elements in parallel, a plurality of partial reductions of representative values in the representative sheet for the first tile; and performing a final reduction from results of the plurality of partial reductions stored along a single row or column of the two-dimensional shift-register array to compute a final accumulated value for the first tile.

2. The method of claim 1, wherein tiles in the row of tiles are non-overlapping.

3. The method of claim 1, wherein computing a plurality of reductions in parallel along rows or columns in a first dimension of the two-dimensional shift-register array comprises:

repeatedly performing, for each value n from 0 to a maximum N, operations comprising:

shifting the data in the shift-register array $2^n$ steps along the first dimension, computing, by each processing element to which data was shifted, an accumulation operation using (i) data in a shift-register dedicated to the processing element, and (ii) data shifted to the processing element.

4. The method of claim 3, wherein computing a final reduction along a single row or column in a second dimension of the two-dimensional shift-register array to compute a final accumulated value for the first tile comprises:

repeatedly performing, for each value m from 0 to a maximum M, operations comprising:

shifting data in the shift-register array $2^m$ steps along the second dimension, computing, by each processing element to which data was shifted, an accumulation operation using (i) data in a shift register dedicated to the processing element, and (ii) data shifted to the processing element.

5. A computer program product, encoded on one or more non-transitory computer storage media, comprising instructions that when executed by a processor having:

a two-dimensional shift-register array comprising multiple shift-register planes, a two-dimensional array of processing elements, wherein each shift register of the shift register array is dedicated to a respective one of the processing elements, and wherein each processing element is configured to read from and write to a respective shift-register dedicated to the processing element, and random access memory coupled to the two-dimensional array of processing elements, cause the processor to determine an accumulated value for each tile in a row of tiles, wherein each tile in the row of tiles comprises a plurality of rows of sheets, wherein each row of sheets spans all of the tiles in the row of tiles, by performing operations to process each row of sheets across the row of tiles before processing a next row of sheets across the row of tiles, the operations comprising:

iterating over each row of sheets in the row of tiles to compute, over a respective plurality of sheets belonging to each tile in the row of tiles, a respective representative sheet having a plurality of representative summation values that are each a respective summation of pixel values in each of the plurality of sheets of the tile that each have a same relative sheet position in different respective sheets as the representative summation value has within the representative sheet, including:

loading a next sheet in the row of sheets into a first plane of the two-dimensional shift-register array, determining whether the next sheet is a first sheet to be processed after a tile boundary between a previous tile and a next tile, whenever the next sheet is the first sheet to be processed after the tile boundary between the previous tile and the next tile, (i) moving a first representative sheet for the previous tile from a second plane of the two-dimensional shift register array to a respective first location in the random access memory dedicated to the previous tile, and (ii) loading a second representative sheet for the next tile from a respective second location in the random access memory dedicated to the next tile to the second shift-register plane of the two-dimensional shift-register array, updating a respective representative sheet for a respective tile to which the next sheet belongs including computing, by each processing element of the two-dimensional array of processing elements in parallel, a sum of respective values having corresponding sheet locations in the next sheet and in the representative sheet stored respectively in the first plane and the second plane of the two-dimensional shift-register array, and updating, by each processing element of the two-dimensional array of processing elements in parallel, the representative sheet in the second plane of the two-dimensional array using the sums of the respective values having corresponding sheet locations, and loading a next sheet in a respective next row of sheets into the first plane of the two-dimensional shift-register array;

after processing all sheets belonging to a first tile of the row of tiles, loading, into the two-dimensional shift-register array, a representative sheet for the first tile of the row of tiles;

performing, by the two-dimensional array of processing elements in parallel, a plurality of partial reductions of representative values in the representative sheet for the first tile; and performing a final reduction from results of the plurality of partial reductions stored along a single row or column of the two-dimensional shift-register array to compute a final accumulated value for the first tile.

6. The computer program product of claim 5, wherein tiles in the row of tiles are non-overlapping.

7. The computer program product of claim 5, wherein performing, by the two-dimensional array of processing elements in parallel, a plurality of partial reductions of the representative values in the representative sheet for the first tile comprises:

repeatedly performing, for each value n from 0 to a maximum N, operations comprising:
shifting the data in the shift-register array $2^n$ steps along the first dimension,
performing, by each processing element to which data was shifted, an accumulation operation using (i) data in a shift-register dedicated to the processing element, and (ii) data shifted to the processing element.

8. The computer program product of claim 7, wherein performing a final reduction from results of the plurality of partial reductions stored along a single row or column of the two-dimensional shift-register array to compute a final accumulated value for the first tile comprises:

repeatedly performing, for each value m from 0 to a maximum M, operations comprising:
shifting data in the shift-register array $2^m$ steps along the second dimension,
performing, by each processing element to which data was shifted, an accumulation operation using (i) data in a shift register dedicated to the processing element, and (ii) data shifted to the processing element.

9. A processor comprising:
a two-dimensional shift-register array comprising multiple shift-register planes;
a two-dimensional array of processing elements, wherein each shift register of the shift register array is dedicated to a respective one of the processing elements, and wherein each processing element is configured to read from and write to a respective shift-register dedicated to the processing element; and
random access memory coupled to the two-dimensional array of processing elements,
wherein the processor is configured to execute instructions to determine an accumulated value for each tile in a row of tiles, wherein each tile in the row of tiles comprises a plurality of rows of sheets, wherein each row of sheets spans all of the tiles in the row of tiles, and wherein the instructions cause the processor to perform operations to process each row of sheets across the row of tiles before processing a next row of sheets across the row of tiles, the operations comprising:

iterating over each row of sheets in the row of tiles to compute, over a respective plurality of sheets belonging to each tile in the row of tiles, a respective representative sheet having a plurality of representative summation values that are each a respective summation of pixel values in each of the plurality of sheets of the tile that each have a same relative sheet position in different respective sheets as the representative summation value has within the representative sheet, including:

loading a next sheet in the row of sheets into a first plane of the two-dimensional shift-register array, determining whether the next sheet is a first sheet to be processed after a tile boundary between a previous tile and a next tile, whenever the next sheet is the first sheet to be processed after the tile boundary between the previous tile and the next tile, (i) moving a first representative sheet for the previous tile from a second plane of the two-dimensional shift register array to a respective first location in the random access memory dedicated to the previous tile, and (ii) loading a second representative sheet for the next tile from a respective second location in the random access memory dedicated to the next tile to the second shift-register plane of the two-dimensional shift-register array, and updating a respective representative sheet for a respective tile to which the next sheet belongs including computing, by each processing element of the two-dimensional array of processing elements in parallel, a sum of respective values having corresponding sheet locations in the next sheet and in the representative sheet stored respectively in the first plane and the second plane of the two-dimensional shift-register array, updating, by each processing element of the two-dimensional array of processing elements in parallel, the representative sheet in the second plane of the two-dimensional array using the sums of the respective values having corresponding sheet locations, and loading a next sheet in a respective next row of sheets into the first plane of the two-dimensional shift-register array;

after processing all sheets belonging to a first tile of the row of tiles, loading, into the two-dimensional shift-register array, a representative sheet for the first tile of the row of tiles;

performing, by the two-dimensional array of processing elements in parallel, a plurality of partial reductions of representative values in the representative sheet for the first tile; and performing a final reduction from results of the plurality of partial reductions stored along a single row or column of the two-dimensional shift-register array to compute a final accumulated value for the first tile.

10. The processor of claim 9, wherein tiles in the row of tiles are non-overlapping.

11. The processor of claim 9, wherein performing, by the two-dimensional array of processing elements in parallel, a plurality of partial reductions of the representative values in the representative sheet for the first tile comprises:

repeatedly performing, for each value n from 0 to a maximum N, operations comprising:

shifting the data in the shift-register array 2^n steps along the first dimension, computing, by each processing element to which data was shifted, an accumulation operation using (i) data in a shift-register dedicated to the processing element, and (ii) data shifted to the processing element.

12. The processor of claim 11, wherein performing a final reduction from results of the plurality of partial reductions stored along a single row or column of the two-dimensional shift-register array to compute a final accumulated value for the first tile comprises:

repeatedly performing, for each value m from 0 to a maximum M, operations comprising:

shifting data in the shift-register array 2^m steps along the second dimension, performing, by each processing element to which data was shifted, an accumulation operation using (i) data in a shift register dedicated to the processing element, and (ii) data shifted to the processing element.

\* \* \* \* \*